(12) United States Patent
Agazzi et al.

(10) Patent No.: US 7,263,134 B2
(45) Date of Patent: Aug. 28, 2007

(54) ETHERNET TRANSCEIVER WITH SINGLE-STATE DECISION FEEDBACK EQUALIZER

(75) Inventors: Oscar E. Agazzi, Irvine, CA (US); John L. Creigh, Rancho Santa Margarita, CA (US); Mehdi Hatamian, Mission Viejo, CA (US); Henry Samueli, San Juan Capistrano, CA (US); David E. Kruse, Ultrecht (NL); Arthur Abnous, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/919,729

(22) Filed: Aug. 17, 2004

(65) Prior Publication Data

US 2005/0036576 A1    Feb. 17, 2005

Related U.S. Application Data

(63) Continuation of application No. 10/086,618, filed on Feb. 28, 2002, now Pat. No. 6,778,602, which is a continuation of application No. 09/437,719, filed on Nov. 9, 1999, now Pat. No. 6,477,200.

(60) Provisional application No. 60/130,616, filed on Apr. 22, 1999, provisional application No. 60/116,946, filed on Jan. 20, 1999, provisional application No. 60/108,648, filed on Nov. 16, 1998, provisional application No. 60/108,319, filed on Nov. 13, 1998, provisional application No. 60/107,874, filed on Nov. 9, 1998, provisional application No. 60/107,880, filed on Nov. 9, 1998.

(51) Int. Cl.
*H04B 15/00* (2006.01)

(52) U.S. Cl. .................. 375/285; 375/233; 375/348

(58) Field of Classification Search ............... 375/233, 375/285, 229, 254, 259–260, 224, 227, 262, 375/265, 286, 346, 348, 350; 708/322, 323
See application file for complete search history.

(56) References Cited

U.S. PATENT DOCUMENTS

| 4,631,735 | A | * | 12/1986 | Qureshi ..................... 375/254 |
| 4,811,361 | A | * | 3/1989 | Bacou et al. ............... 375/242 |
| 5,031,194 | A | * | 7/1991 | Crespo et al. .............. 375/233 |

(Continued)

*Primary Examiner*—Jean B. Corrielus
(74) *Attorney, Agent, or Firm*—McAndrews, Held & Malloy, Ltd.

(57) ABSTRACT

Various systems and methods providing high speed decoding, enhanced power reduction and clock domain partitioning for a multi-pair gigabit Ethernet transceiver are disclosed. ISI compensation is partitioned into two stages; a first stage compensates ISI components induced by characteristics of a transmitters partial response pulse shaping filter in a demodulator, a second stage compensates ISI components induced by characteristics of a multi-pair transmission channel in a Viterbi decoder. High speed decoding is accomplished by reducing the DFE depth by providing an input signal from a multiple decision feedback equalizer to the Viterbi based on a tail value and a subset of coefficient values received from a unit depth decision-feedback equalizer. Power reduction is accomplished by adaptively truncating active taps in the NEXT, FEXT and echo cancellation filters, or by disabling decoder circuitry portions, as channel response characteristics allow. A receive clock signal is generated such that it is synchronous in frequency with analog sampling clock signals and has a particular phase offset with respect to one of the sampling clock signals. This phase offset is adjusted such that system performance degradation due to coupling of switching noise from the digital sections to the analog sections is substantially minimized.

12 Claims, 38 Drawing Sheets

U.S. PATENT DOCUMENTS

| | | | | |
|---|---|---|---|---|
| 5,056,117 A | * | 10/1991 | Gitlin et al. | 375/234 |
| 5,159,282 A | * | 10/1992 | Serizawa et al. | 329/316 |
| 5,208,829 A | * | 5/1993 | Soleimani et al. | 375/141 |
| 5,307,405 A | * | 4/1994 | Sih | 379/406.08 |
| 5,388,092 A | * | 2/1995 | Koyama et al. | 370/289 |
| 5,416,799 A | * | 5/1995 | Currivan et al. | 375/232 |
| 5,455,819 A | * | 10/1995 | Sugiyama | 370/241 |
| 5,497,401 A | * | 3/1996 | Ramaswamy et al. | 375/341 |
| 5,517,435 A | * | 5/1996 | Sugiyama | 708/322 |
| 5,526,347 A | * | 6/1996 | Chen et al. | 370/290 |
| 5,539,773 A | * | 7/1996 | Knee et al. | 375/232 |
| 5,566,191 A | * | 10/1996 | Ohnishi et al. | 714/794 |
| 5,604,741 A | * | 2/1997 | Samueli et al. | 370/402 |
| 5,617,450 A | * | 4/1997 | Kakuishi et al. | 375/230 |
| 5,659,609 A | * | 8/1997 | Koizumi et al. | 379/406.11 |
| 5,745,564 A | * | 4/1998 | Meek | 379/406.08 |
| 5,796,725 A | * | 8/1998 | Muraoka | 370/290 |
| 5,933,495 A | * | 8/1999 | Oh | 379/406.08 |
| 5,946,349 A | * | 8/1999 | Raghunath | 375/232 |
| 5,999,567 A | * | 12/1999 | Torkkola | 375/232 |
| 6,009,120 A | * | 12/1999 | Nobakht | 375/229 |

* cited by examiner

| | Pair<br>ABCD | | Pair<br>ABCD |
|---|---|---|---|
| s0 | XXXX | U | YYYY |
| s1 | XXXY | U | YYYX |
| s2 | XXYY | U | YYXX |
| s3 | XXYX | U | YYXY |
| s4 | XYYX | U | YXXY |
| s5 | XYYY | U | YXXX |
| s6 | XYXY | U | YXYX |
| s7 | XYXX | U | YXYY |

| | | | |
|---|---|---|---|
| Viterbi Input | [S▢▢].[▢▢▢] | S5.3 | |
| 1D Error | [S▢▢].[▢▢] | S4.2 | |
| 1D Error² | [▢].[▢▢] | U3.2 | |
| 2D Distance² | [▢].[▢▢] | U3.2 | |
| 4D Distance² | [▢▢].[▢▢] | U4.2 | Before Min Select |
| 4D Distance² | [▢▢].[▢▢] | U4.2 | After Min Select |

FIG. 16

| Error Values | 1D Distance² Values |
|---|---|
| 00.00 | 0.00 |
| 00.01 / 11.11 | 0.00 |
| $\overline{00}$.10 / 11.10 | 0.01 |
| 00.11 / 11.01 | 0.10 |
| 01.00 / 11.00 | 1.00 |

| VITERBIINPUT | DECISION X | ERROR X | ROUNDEDERR OR X | ERROR X2 | DECISION Y | ERROR Y | ROUNDEDERR OR Y | ERROR Y2 |
|---|---|---|---|---|---|---|---|---|
| 01.111 | 001 | 00.111 | 01.00 | 1.00 | 010 | 11.111 | 00.00 | 0.00 |
| 01.110 | 001 | 00.110 | 00.11 | 0.10 | 010 | 11.110 | 11.11 | 0.00 |
| 01.101 | 001 | 00.101 | 00.11 | 0.10 | 010 | 11.101 | 11.11 | 0.00 |
| 01.100 | 001 | 00.100 | 00.10 | 0.01 | 010 | 11.100 | 11.10 | 0.01 |
| 01.011 | 001 | 00.011 | 00.10 | 0.01 | 010 | 11.011 | 11.10 | 0.01 |
| 01.010 | 001 | 00.010 | 00.01 | 0.00 | 010 | 11.010 | 11.01 | 0.10 |
| 01.001 | 001 | 00.001 | 00.01 | 0.00 | 010 | 11.001 | 11.01 | 0.10 |
| 01.000 | 001 | 00.000 | 00.00 | 0.00 | 010 | 11.000 | 11.00 | 1.00 |
| 00.111 | 001 | 11.111 | 00.00 | 0.00 | 000 | 00.111 | 01.00 | 1.00 |
| 00.110 | 001 | 11.110 | 11.11 | 0.00 | 000 | 00.110 | 00.11 | 0.10 |
| 00.101 | 001 | 11.101 | 11.11 | 0.00 | 000 | 00.101 | 00.11 | 0.10 |
| 00.100 | 001 | 11.100 | 11.10 | 0.01 | 000 | 00.100 | 00.10 | 0.01 |
| 00.011 | 001 | 11.011 | 11.10 | 0.01 | 000 | 00.011 | 00.10 | 0.01 |
| 00.010 | 001 | 11.010 | 11.01 | 0.10 | 000 | 00.010 | 00.01 | 0.00 |
| 00.001 | 001 | 11.001 | 11.01 | 0.10 | 000 | 00.001 | 00.01 | 0.00 |
| 00.000 | 001 | 11.000 | 11.00 | 1.00 | 000 | 00.000 | 00.00 | 0.00 |

FIG.18B

| VITERBIINPUT | DECISION X | ERROR X | ROUNDEDERR OR X | ERROR X2 | DECISION Y | ERROR Y | ROUNDEDERR OR Y | ERROR Y2 |
|---|---|---|---|---|---|---|---|---|
| 11.111 | 111 | 00.111 | 01.00 | 1.00 | 000 | 11.111 | 00.00 | 0.00 |
| 11.110 | 111 | 00.110 | 00.11 | 0.10 | 000 | 11.110 | 11.11 | 0.00 |
| 11.101 | 111 | 00.101 | 00.11 | 0.10 | 000 | 11.101 | 11.11 | 0.00 |
| 11.100 | 111 | 00.100 | 00.10 | 0.01 | 000 | 11.100 | 11.10 | 0.01 |
| 11.011 | 111 | 00.011 | 00.10 | 0.01 | 000 | 11.011 | 11.10 | 0.01 |
| 11.010 | 111 | 00.010 | 00.01 | 0.00 | 000 | 11.010 | 11.01 | 0.10 |
| 11.001 | 111 | 00.001 | 00.01 | 0.00 | 000 | 11.001 | 11.01 | 0.10 |
| 11.000 | 111 | 00.000 | 00.00 | 0.00 | 000 | 11.000 | 11.00 | 1.00 |
| 10.111 | 111 | 11.111 | 00.00 | 0.00 | 110 | 00.111 | 01.00 | 1.00 |
| 10.110 | 111 | 11.110 | 11.11 | 0.00 | 110 | 00.110 | 00.11 | 0.10 |
| 10.101 | 111 | 11.101 | 11.11 | 0.00 | 110 | 00.101 | 00.11 | 0.10 |
| 10.100 | 111 | 11.100 | 11.10 | 0.01 | 110 | 00.100 | 00.10 | 0.01 |
| 10.011 | 111 | 11.011 | 11.10 | 0.01 | 110 | 00.011 | 00.10 | 0.01 |
| 10.010 | 111 | 11.010 | 11.01 | 0.10 | 110 | 00.010 | 00.01 | 0.00 |
| 10.001 | 111 | 11.001 | 11.01 | 0.10 | 110 | 00.001 | 00.01 | 0.00 |
| 10.000 | 111 | 11.000 | 11.00 | 1.00 | 110 | 00.000 | 00.00 | 0.00 |

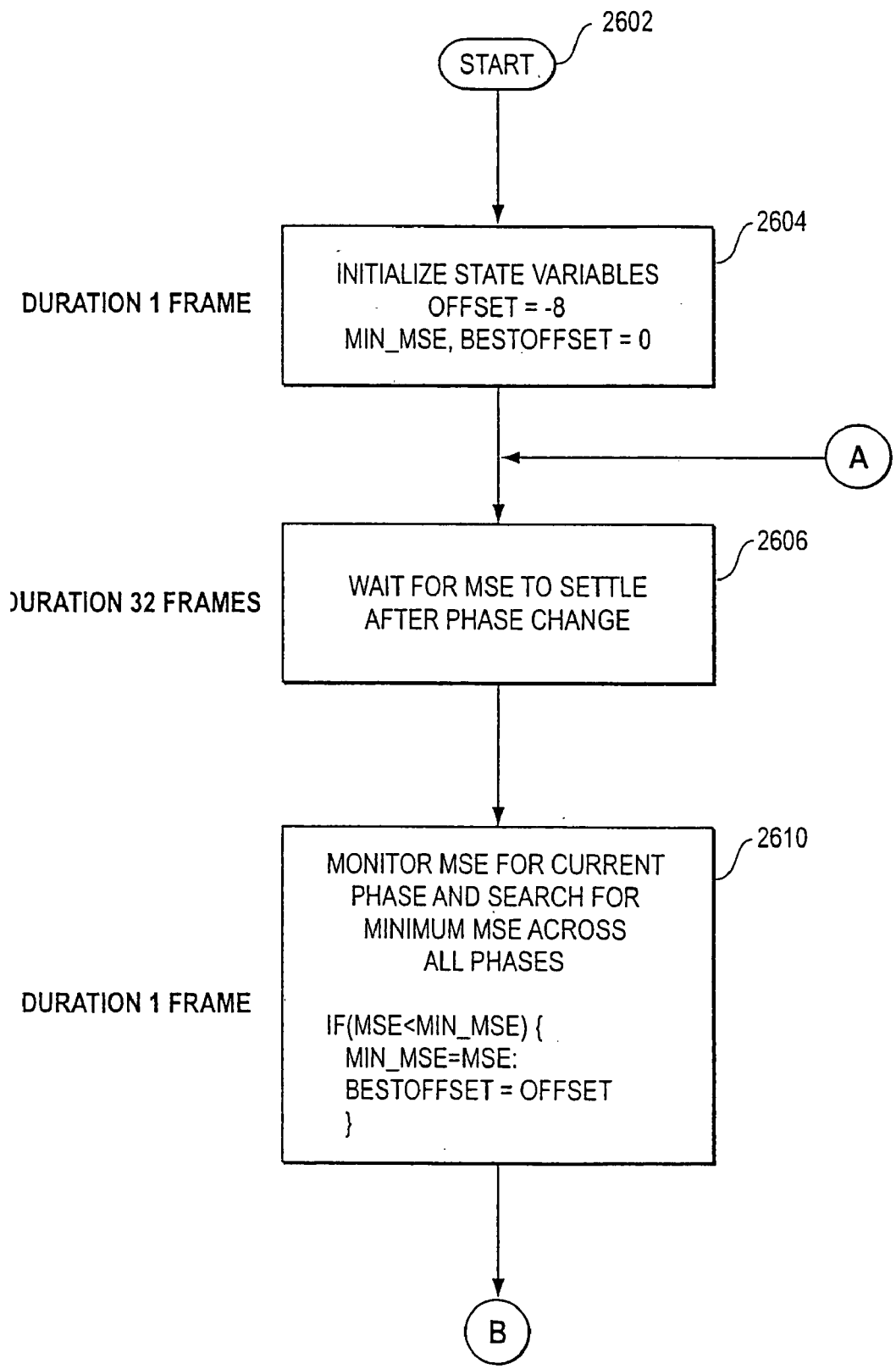

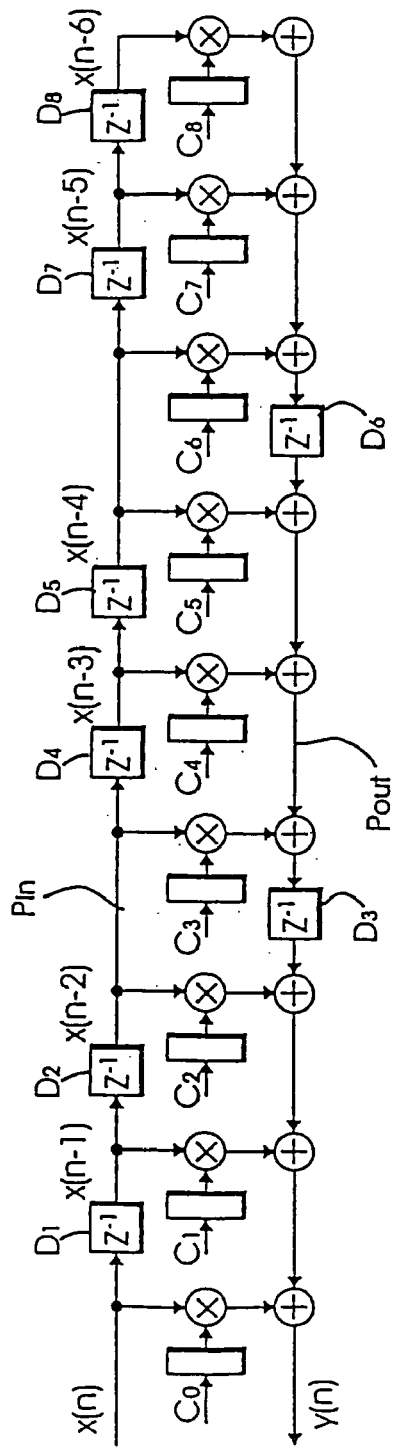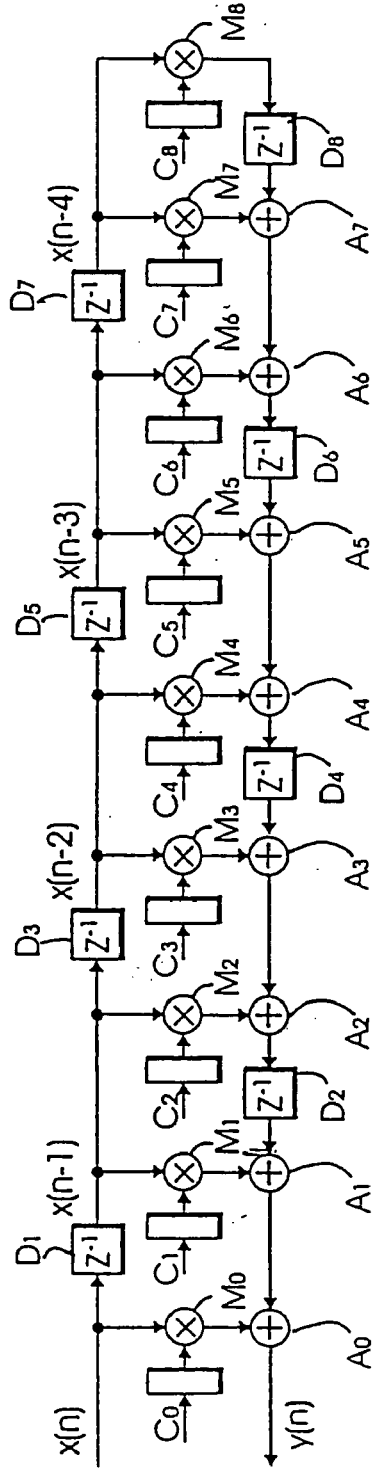
FIG. 29A
FIG. 29B

ETHERNET TRANSCEIVER WITH SINGLE-STATE DECISION FEEDBACK EQUALIZER

CROSS REFERENCE TO RELATED APPLICATIONS

This patent application is a continuation of U.S. patent application Ser. No. 10/086,618, filed Feb. 28, 2002 (now U.S. Pat. No. 6,778,602), entitled "Multi-pair Gigabit Ethernet Transceiver," which is a continuation of U.S. patent application Ser. No. 09/437,719, filed Nov. 9, 1999 (now U.S. Pat. No. 6,477,200), entitled "Multi-pair Gigabit Ethernet Transceiver." The contents of both of the above-referenced applications are hereby expressly incorporated herein by reference.

The present application claims priority on the basis of the following provisional applications: Ser. No. 60/130,616 entitled "Multi-Pair Gigabit Ethernet Transceiver," filed on Apr. 22, 1999, Ser. No. 60/116,946, entitled "Multiple Decision Feedback Equalizer," filed on Jan. 20, 1999, Ser. No. 60/108,648, entitled "Clock Generation and Distribution in an Ethernet Transceiver," filed on Nov. 16, 1998, Ser. No. 60/108,319, entitled "Gigabit Ethernet Transceiver" filed on Nov. 13, 1998, Ser. No. 60/107,874, entitled "Apparatus for and Method of Distributing Clock Signals in a Communication System," filed Nov. 9, 1998, and Ser. No. 60/107,880, entitled "Apparatus for and Method of Reducing Power Dissipation in a Communication System," filed Nov. 9, 1998.

The present application is related to the following co-pending applications, commonly owned by the assignee of the present application, the entire contents of each of which are expressly incorporated herein by reference: Ser. No. 09/370,370 (now U.S. Pat. No. 6,253,345), entitled "System and Method for Trellis Decoding in a Multi-Pair Transceiver System," Ser. No. 09/370,353 (now U.S. Pat. No. 6,226,332), entitled "Multi-Pair Transceiver Decoder System with Low Computation Slicer," Ser. No. 09/370,354 (now U.S. Pat. No. 6,249,544), entitled "System and Method for High Speed Decoding and ISI Compensation in a Multi-Pair Transceiver System," Ser. No. 09/370,491 (now U.S. Pat. No. 6,252,904), entitled "High-Speed Decoder for Multi-Pair Gigabit Transceiver," all filed Oct. 10, 1999, and Ser. No. 09/390,856 (now U.S. Pat. No. 6,289,047), entitled "Dynamic Regulation of Power Consumption in a High-speed Communication System," filed Sep. 3, 1999.

The present application is also related to the following co-pending applications, filed on instant date herewith and commonly owned by the assignee of the present application, the entire contents of each of which are expressly incorporated herein by reference: Ser. No. 09/437,72 1 (now U.S. Pat. No. 6,363,129), entitled "Timing Recovery System for a Multi-Pair Gigabit Transceiver," and Ser. No. 09/437,724 (now U.S. Pat. No. 6,307,905), entitled "Switching Noise Reduction in a Multi-Clock Domain Transceiver."

FIELD OF THE INVENTION

The present invention relates generally to high speed networking transceivers and, more particularly to gigabit Ethernet transceivers having reduced power consumption, efficient clock domain partitioning and able to decode input symbols within a symbol period with a minimum of computational intensity.

DESCRIPTION OF THE RELATED ART

In recent years, local area network (LAN) applications have become more and more prevalent as a means for providing local interconnect between personal computer systems, work stations and servers. Because, of the breadth of its installed base, the 10BASE-T implementation of Ethernet remains the most pervasive if not the dominant, network technology for LANs. However, as the need to exchange information becomes more and more imperative, and as the scope and size of the information being exchanged increases, higher and higher speeds (greater bandwidth) are required from network interconnect technologies. Among the highspeed LAN technologies currently available, fast Ethernet, commonly termed 100BASE-T, has emerged as the clear technological choice. Fast Ethernet technology provides a smooth, non-disruptive evolution from the 10 megabit per second (Mbps) performance of 10BASE-T applications to the 100 Mbps performance of 100BASE-T. The growing use of 100BASE-T interconnections between servers and desktops is creating a definite need for an even higher speed network technology at the backbone and server level.

One of the more suitable solutions to this need has been proposed in the IEEE 802.3ab standard for gigabit Ethernet, also termed 1000BASE-T. Gigabit Ethernet is defined as able to provide 1 gigabit per second (Gbps) bandwidth in combination with the simplicity of an Ethernet architecture, at a lower cost than other technologies of comparable speed. Moreover, gigabit Ethernet offers a smooth, seamless upgrade path for present 10BASE-T or 100BASE-T Ethernet installations.

In order to obtain the requisite gigabit performance levels, gigabit Ethernet transceivers are interconnected with a multi-pair transmission channel architecture. In particular, transceivers are interconnected using four separate pairs of twisted Category-5 copper wires. Gigabit communication, in practice, involves the simultaneous, parallel transmission of information signals, with each signal conveying information at a rate of 250 megabits per second (Mb/s). Simultaneous, parallel transmission of four information signals over four twisted wire pairs poses substantial challenges to bidirectional communication transceivers, even though the data rate on any one wire pair is "only" 250 Mbps.

In particular, the gigabit Ethernet standard requires that digital information being processed for transmission be symbolically represented in accordance with a five-level pulse amplitude modulation scheme (PAM-5) and encoded in accordance with an 8-state Trellis coding methodology. Coded information is then communicated over a multi-dimensional parallel transmission channel to a designated receiver, where the original information must be extracted (demodulated) from a multi-level signal. In gigabit Ethernet, it is important to note that it is the concatenation of signal samples received simultaneously on all four twisted pair lines of the channel that defines a symbol. Thus, demodulator/decoder architectures must be implemented with a degree of computational complexity that allows them to accommodate not only the "state width" of Trellis coded signals, but also the "dimensional depth" represented by the transmission channel.

Computational complexity is not the only challenge presented to modern gigabit capable communication devices. A perhaps greater challenge is that the complex computations required to process "deep" and "wide" signal representations must be performed in an almost vanishingly small period of time. For example, in gigabit applications, each of the four-dimensional signal samples, formed by the four signals received simultaneously over the four twisted wire pairs, must be efficiently decoded within a particular allocated symbol time window of about 8 nanoseconds.

Successfully accomplishing the multitude of sequential processing operations required to decode gigabit signal samples within an 8 nanosecond window requires that the switching capabilities of the integrated circuit technology from which the transceiver is constructed be pushed to almost its fundamental limits. If performed in conventional fashion, sequential signal processing operations necessary for signal decoding and demodulation would result in a propagation delay through the logic circuits that would exceed the clock period, rendering the transceiver circuit non-functional. Fundamentally, then, the challenge imposed by timing constraints must be addressed if gigabit Ethernet is to retain its viability and achieve the same reputation for accurate and robust operation enjoyed by its 10BASE-T and 100BASE-T siblings.

In addition to the challenges imposed by decoding and demodulating multilevel signal samples, transceiver systems must also be able to deal with intersymbol interference (ISI) introduced by transmission channel artifacts as well as by modulation and pulse shaping components in the transmission path of a remote transceiver system. During the demodulation and decoding process of Trellis coded information, ISI components are introduced by either means must also be considered and compensated, further expanding the computational complexity and thus, system latency of the transceiver system. Without a transceiver system capable of efficient, high-speed signal decoding as well as simultaneous ISI compensation, gigabit Ethernet would likely not remain a viable concept.

In a Gigabit Ethernet communication system that conforms to the 1000BASE-T standard, gigabit transceivers are connected via Category 5 twisted pairs of copper cables. Cable responses vary drastically among different cables. Thus, the computations, and hence power consumption, required to compensate for noise (such as echo, near-end crosstalk, far-end crosstalk) will vary widely depending on the particular cable that is used.

In integrated circuit technology, power consumption is generally recognized as being a function of the switching (clock) speed of transistor elements making up the circuitry, as well as the number of component elements operating within a given time period. The more transistor elements operating at one time, and the higher the operational speed of the component circuitry, the higher the relative degree of power consumption for that circuit. This is particularly relevant in the case of Gigabit Ethernet, since all computational circuits are clocked at 125 Mhz (corresponding to 250 Mbps per twisted pair of cable), and the processing requirements of such circuits require rather large blocks of computational circuitry, particularly in the filter elements. Power consumption figures in the range of from about 4.5 Watts to about 6.0 Watts are not unreasonable when the speed and complexity of modern gigabit communication circuitry is considered.

Pertinent to an analysis of power consumption is the realization that power is dissipated, in integrated circuits, as heat. As power consumption increases, not only must the system be provided with a more robust power supply, but also with enhanced heat dissipation schemes, such as heat sinks (dissipation fins coupled to the IC package), cooling fans, increased interior volume for enhanced air flow, and the like. All of these dissipation schemes involve considerable additional manufacturing costs and an extended design cycle due to the need to plan for thermal considerations.

Prior high speed communication circuits have not adequately addressed these thermal considerations, because of the primary necessity of accommodating high data rates with a sufficient level of signal quality. Prior devices have, in effect, "hard wired" their processing capability, such that processing circuitry is always operative to maximize signal quality, whether that degree of processing is required or not. Where channel quality is high, full-filter-tap signal processing more often obeys the law of diminishing returns, with very small incremental noise margin gains recovered from the use of additional large blocks of active filter circuitry.

This trade-off between power consumption and signal quality has heretofore limited the options available to an integrated circuit communication system designer. If low power consumption is made a system requirement, the system typically exhibits poor noise margin or bit-error-rate performance. Conversely, if system performance is made the primary requirement, power consumption must fall where it may with the corresponding consequences to system cost and reliability.

Accordingly, there is a need for a high speed integrated circuit communication system design which is able to accommodate a wide variety of worst-case channel (cable) responses, while adaptively evaluating signal quality metrics in order that processing circuitry might be disabled, and power consumption might thereby be reduced, at any such time that the circuitry is not necessary to assure a given minimum level of signal quality.

Such a system should be able to adaptively determine and achieve the highest level of signal quality consistent with a given maximum power consumption specification. In addition, such a system should be able to adaptively determine and achieve the lowest level of power consumption consistent with a given minimum signal quality specification.

SUMMARY OF THE INVENTION

The present invention is a method and a system for providing an input signal from a multiple decision feedback equalizer to a decoder based on a tail value and a subset of coefficient values received from a decision-feedback equalizer. A set of pre-computed values based on the subset of coefficient values is generated. Each of the pre-computed values is combined with the tail value to generate a tentative sample. One of the tentative samples is selected as the input signal to the decoder.

In one aspect of the system, tentative samples are saturated and then stored in a set of registers before being outputted to a multiplexer which selects one of the tentative samples as the input signal to the decoder. This operation of storing the tentative samples in the registers before providing the tentative samples to the multiplexer facilitates high-speed operation by breaking up a critical path of computations into substantially balanced first and second portions, the first portion including computations in the decision-feedback equalizer and the multiple decision feedback equalizer, the second portion including computations in the decoder.

The present invention can be directed to a system and method for decoding and ISI compensating received signal samples, modulated for transmission in accordance with a multi-level alphabet, and encoded in accordance with a multi-state encoding scheme. Modulated and encoded signal samples are received and decoded in an integrated circuit receiver which includes a multi-state signal decoder. The multi-state signal decoder includes a symbol decoder adapted to receive a set of signal samples representing multi-state signals and evaluate the multi-state signals in accordance with the multi-level modulation alphabet and the multi-state encoding scheme. The symbol decoder outputs tentative decisions.

An ISI compensation circuit is configured to provide ISI compensated signal samples to the symbol decoder. The ISI compensation circuit is constructed of a single decision feedback equalizer, with the single decision feedback equalizer providing ISI compensated signal samples to the symbol decoder based on tentative decisions outputted by the symbol decoder.

In one aspect of the invention, a path memory module is coupled to the symbol decoder and receives decisions and error terms from the symbol decoder. The path memory module includes a plurality of sequential registers, with each corresponding to a respective one of consecutive time intervals. The registers store decisions corresponding to the respective ones of the states of the multi-state encoded signals. Decision circuitry selects a best decision from corresponding ones of the registers, with the best decision of a distal register defining a final decision. The best decision of an intermediate register defines a tentative decision which is output to the ISI compensation circuit.

The single decision feedback equalizer is configured as an FIR filter, and is characterized by a multiplicity of coefficients, subdivided into a set of high-order coefficients and a set of low-order coefficients. Tentative decisions from the path memory module are forced to the single decision feedback equalizer at various locations along the filter delay line and are combined with the high-order coefficients in order to define a partial ISI component. The partial ISI component is arithmetically combined with an input signal sample in order to generate a partially ISI compensated intermediate signal called tail signal.

Low-order coefficients from the single decision feedback equalizer are directed to a convolution engine wherein they are combined with values representing the levels of a multi-level modulation alphabet. The convolution engine outputs a multiplicity of signals, representing the convolution results, each of which are arithmetically combined with the tail signal to define a set of ISI compensated tentative signal samples.

In a particular aspect of the invention, the ISI compensated tentative signal samples are saturated and then stored in a set of registers before being outputted to a multiplexer circuit which selects one of the tentative signal samples as the input signal to the symbol decoder. Storing tentative signal samples in the set of registers before providing the tentative signal samples to the multiplexer, facilitates high-speed operation by breaking up a critical path of computations into substantially balanced first and second portions, the first portion including computation in the ISI compensation circuitry, including the single decision feedback equalizer and the multiple decision feedback equalizer, the second portion including computations in the symbol decoder.

In a further aspect of the present invention, symbol decoder circuitry is implemented as a Viterbi decoder, the Viterbi decoder computing path metrics for each of the N states of a Trellis code, and outputting decisions based on the path metrics. A path memory module is coupled to the Viterbi decoder for receiving decisions. The path memory module is implemented with a number of depth levels corresponding to consecutive time intervals. Each of the depth levels includes N registers for storing decisions corresponding to the N states of the trellis code. Each of the depth levels further includes a multiplexer for selecting a best decision from the corresponding N registers, the best decision at the last depth level defining the final decision, the best decisions at other selected depth levels defining tentative decisions.

In a particular aspect of the invention, tentative decisions are generated from the first three depth levels of the path memory module. These tentative decisions are forced to a single decision feedback equalizer to generate a partial ISI component based on the first three tentative decisions and a set of high-order coefficients. The partial ISI component is arithmetically combined with an input signal sample in order to define a partially ISI compensated tentative signal sample.

The first two coefficients of the single decision feedback equalizer are linearly combined with values representing the five levels of a PAM-5 symbol alphabet, thereby generating a set of 25 pre-computed values, each of which are arithmetically combined with the partial ISI compensated signal sample to develop a set of 25 samples, one of which is a fully ISI compensated signal sample and is chosen as the input to the symbol decoder.

The present invention is further directed to a system and method for decoding information signals modulated in accordance with a multi-level modulation scheme and encoded in accordance with a multi-state encoding scheme by computing a distance between a received word from a codeword included in a plurality of code-subsets. Codewords are formed from a concatenation of symbols from a multi-level alphabet, with the symbols selected from two disjoint symbol-subsets X and Y. A received word is represented by L inputs, with L representing the number of dimensions of a multi-dimensional communication channel. Each of the L inputs uniquely corresponds to one of the L dimensions. A set of 1-dimensional (1D) errors is produced from the L inputs, with each of the 1D errors representing a distance metric between a respective one of the L inputs and a symbol in one of the two disjoint symbol-subsets. 1D errors are combined in order to produce a set of L-dimensional errors such that each of the L-dimensional errors represents a distance between the received word and a nearest codeword in one of the code-subsets.

In one embodiment of the invention, each of the L inputs is sliced with respect to each of the two disjoint symbol-subsets X and Y in order to produce a set of X-based errors, a set of Y-based errors and corresponding sets of X-based and Y-based decisions. The sets of X-based and Y-based errors form the set of 1D errors, while the sets of X-based and Y-based decisions form a set of 1D decisions. Each of the X-based and Y-based decisions corresponds to a symbol, in a corresponding symbol subset, closest in distance (value) to one of the L inputs. Each of the 1D errors represents a distance metric between a corresponding 1D decision and the respective one of the L inputs.

In another embodiment of the invention, each of the L inputs are sliced with respect to each of the two disjoint symbol subsets X and Y in order to produce a set of 1D decisions. Each of the L inputs is further sliced with respect to a symbol-set including all of the symbols of the two disjoint symbol-subsets in order to produce a set of hard decisions. The X-based and Y-based 1D decisions are combined with a set of hard decisions in order to produce a set of 1D errors, with each of the 1D errors representing a distance metric between a corresponding 1D decision and a respective one of the L inputs.

In one embodiment of the present invention, 1-dimensional errors are combined in a first set of adders in order to produce a set of 2-dimensional errors. A second set of adders combines the 2-dimensional errors in order to produce intermediate L-dimensional errors, with the intermediate L-dimensional errors being arranged into pairs of errors such that the pairs of errors correspond one-to-one to the code-subsets. A minimum-select module determines a minimum for each of the pairs of errors. Once determined, the minima are defined as the L-dimensional errors.

The present invention is further directed to a method for dynamically regulating the power consumption of a high-speed integrated circuit which includes a multiplicity of processing blocks. A first metric and a second metric, which are respectively related to a first performance parameter and a second performance parameter of the integrated circuit, are defined. The first metric is set at a pre-defined value. Selected blocks of the multiplicity of processing blocks are disabled in accordance with a set of pre-determined patterns. The second metric is evaluated, while the disabling operation is being performed, to generate a range of values of the second metric. Each of the values corresponds to the pre-defined value of the first metric. A most desirable value of the second metric is determined from the range of values and is matched to a corresponding pre-determined pattern. The integrated circuit is subsequently operated with selected processing blocks disabled in accordance with the matching pre-determined pattern.

In particular, the first and second performance parameters are distinct and are chosen from the parametric group consisting of power consumption and a signal quality figure of merit. The signal quality figure of merit is evaluated while selected blocks of the multiplicity of processing blocks are disabled. The set of selected blocks which give the lowest power consumption, when disabled, while at the same time maintaining an acceptable signal quality figure of merit at a pre-defined threshold level is maintained in a disabled condition while the integrated circuit is subsequently operated.

In one aspect of the present invention, reduced power dissipation is chosen as the most desirable metric to evaluate, while a signal quality figure of merit is accorded secondary consideration. Alternatively, a signal quality figure of merit is chosen as the most desirable metric to evaluate, while power dissipation is accorded a secondary consideration. In a further aspect of the present invention, both signal quality and power dissipation are accorded equal consideration with selective blocks of the multiplicity of processing blocks being disabled and the resultant signal quality and power dissipation figures of merit being evaluated so as to defame a co-existing local maxima of signal quality with a local minima of power dissipation.

In one particular embodiment, the present invention may be characterized as a method for dynamically regulating the power consumption of a communication system which includes at least a first module. The first module can be any circuit block, not necessarily a signal processing block. Power regulation proceeds by specifying a power dissipation value and an error value. An information error metric and a power metric is computed. Activation and deactivation of at least a portion of the first module of the communication system is controlled according to a particular criterion. The criterion is based on at least one of the information error metric, the power metric, the specified error and the specified power, to regulate at least one of the information metric and the power metric.

In particular, at least a portion of the first module is activated if the information error metric is greater than the specified error and the first module portion is deactivated if the information error metric is less than the specified error. In an additional aspect of the invention, the first module portion is activated if the information error metric is greater than the specified error and the power metric is smaller than the specified power. The first module portion is deactivated if the information error metric is smaller than the specified error or the power metric is greater than the specified power. In yet a further aspect of the invention, the first module portion is activated if the information error metric is greater than the specified error and is deactivated if the information error metric is smaller than a target value, the target value being smaller than the specified error. In yet another aspect of the invention, the first module portion is activated if the information error metric is greater than the specified error and the power metric is smaller than the specified power. The first module portion is deactivated if the information error metric is smaller than a target value, the target value being smaller than the specified error, or the power metric is greater than the specified power.

Advantageously, the information error metric is related to a bit error rate of the communication system and the information error metric is a measure of performance degradation in the communication system caused by deactivation of the portion of the first module. Where the module is a filter which includes a set of taps, with each of the taps including a filter coefficient, the information error metric is a measure of performance degradation of a transceiver caused by operation of the filter.

Power dissipation reduction is implemented by deactivating subsets of taps which make up the filter, until such time as performance degradation caused by the truncated filter reaches a pre-determined threshold level.

The present invention further provides a method for reducing system performance degradation caused by switching noise in a system which includes a set of subsystems. Each of the subsystems includes an analog section and a digital section. Each of the analog sections operates in accordance with a corresponding one of a set of sampling clock signals which are synchronous in frequency. The digital sections operate in accordance with a receive clock signal. The receive clock signal is generated such that it is synchronous in frequency with the sampling clock signals and has a phase offset with respect to one of the sampling clock signals. This phase offset is adjusted such that system performance degradation due to coupling of switching noise from the digital sections to the analog sections is substantially minimized.

BRIEF DESCRIPTION OF THE DRAWINGS

These and other features, aspects and advantages of the present invention will be more fully understood when considered with respect to the following detailed description, appended claims and accompanying drawings, wherein:

FIG. 16 shows the word lengths used in one embodiment of this invention.

FIG. 17 shows an exemplary lookup table suitable for use in computing squared one-dimensional error terms.

FIGS. 18A and 18B are an exemplary look-up table which describes the computation of the decisions and squared errors for both the X and Y subsets directly from one component of the 4D Viterbi input of the 1D slicers of FIG. 7.

FIG. 29A is a simplified structure diagram of an adaptive FIR filter as might be implemented as an echo/NEXT canceller circuit in one embodiment of a transceiver in accordance with the present invention;

FIG. 29B is an equivalent structure of the adaptive FIR filter shown in FIG. 29A;

DETAILED DESCRIPTION OF THE INVENTION

Figure 1:
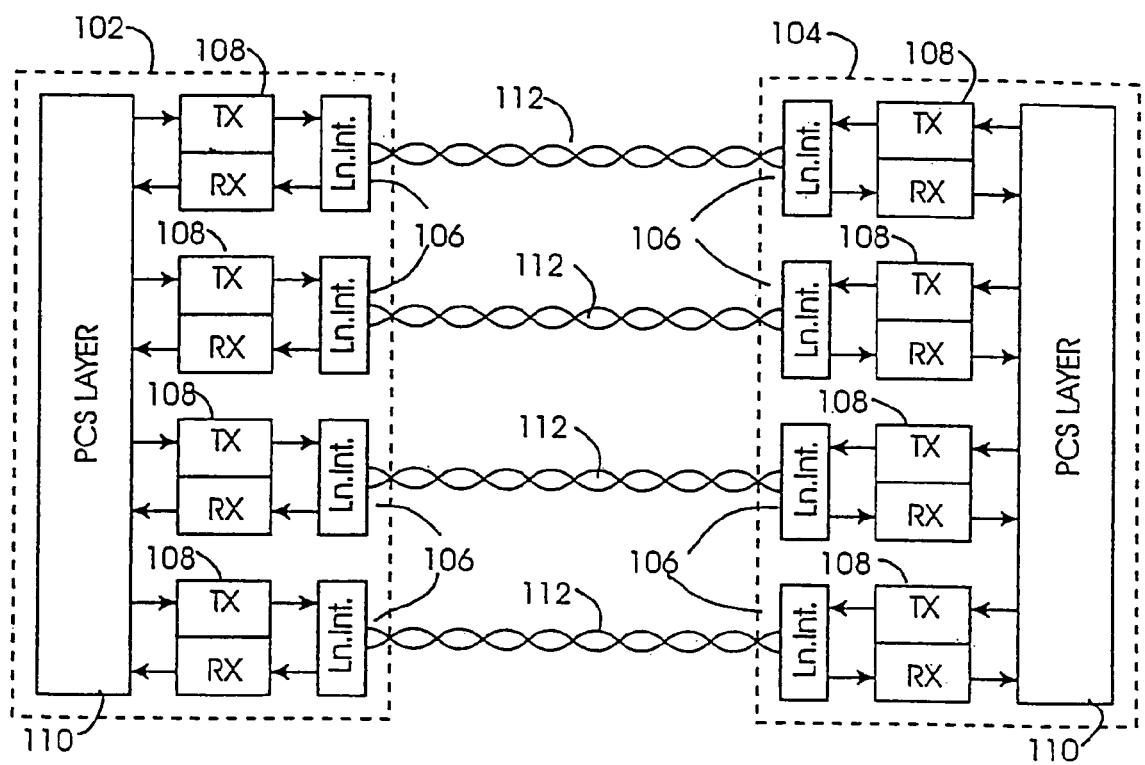
FIG. 1 is a simplified, semi-schematic block diagram of a high-speed bidirectional communication system exemplified by two transceivers configured to communicate over multiple twisted-pair wiring channels.

In the context of an exemplary integrated circuit-type bidirectional communication system, the present invention might be characterized as a system and method for accommodating efficient, high speed decoding of signal samples encoded according to the trellis code specified in the IEEE 802.3ab standard (also termed 1000BASE-T standard).

As will be understood by one having skill in the art, high speed data transmission is often limited by the ability of decoder systems to quickly, accurately and effectively process a transmitted symbol within a given time period. In a 1000BASE-T application (aptly termed gigabit) for example, the symbol decode period is typically taken to be approximately 8 nanoseconds. Pertinent to any discussion of symbol decoding is the realization that 1000BASE-T systems are layered to receive 4-dimensional (4D) signals (each signal corresponding to a respective one of four twisted pair cables) with each of the 4-dimensional signals represented by five analog levels. Accordingly, the decoder circuitry portions of transceiver demodulation blocks require a multiplicity of operational steps to be taken in order to effectively decode each symbol. Such a multiplicity of operations is computationally complex and often pushes the switching speeds of integrated circuit transistors which make up the computational blocks to their fundamental limits.

In accordance with the present invention, a transceiver decoder is able to substantially reduce the computational complexity of symbol decoding, and thus avoid substantial amounts of propagation delay (i.e., increase operational speed), by making use of truncated (or partial) representations of various quantities that make up the decoding/ISI compensation process.

Sample slicing is performed in a manner such that one-dimensional (1D) square error terms are developed in a representation having, at most, three bits if the terms signify a Euclidean distance, and one bit if the terms signify a Hamming distance. Truncated 1D error term representation significantly reduces subsequent error processing complexity because of the fewer number of bits.

Likewise, ISI compensation of sample signals, prior to Viterbi decoding, is performed in a DFE, operatively responsive to tentative decisions made by the Viterbi. Use of tentative decisions, instead of a Viterbis final decision, reduces system latency by a factor directly related to the path memory sequence distance between the tentative decision used, and the final decision, i.e., if there are N steps in the path memory from input to final decision output, and latency is a function of N, forcing the DFE with a tentative decision at step N-6 causes latency to become a function of N-6. A trade-off between latency reduction and accuracy may be made by choosing a tentative decision step either closer to the final decision point or closer to the initial point.

Computations associated with removing impairments due to intersymbol interference (ISI) are substantially simplified, in accordance with the present invention, by a combination of techniques that involves the recognition that intersymbol interference results from two primary causes, a partial response pulse shaping filter in a transmitter and from the characteristics of a unshielded twisted pair transmission channel. During the initial start-up, ISI impairments are processed in independent portions of electronic circuitry, with ISI caused by a partial response pulse shaping filter being compensated in an inverse partial response filter in a feedforward equalizer (FFE) at system startup, and ISI caused by transmission channel characteristics compensated by a decision feedback equalizer (DFE) operating in conjunction with a multiple decision feedback equalizer (MDFE) stage to provide ISI pre-compensated signals (representing a symbol) to a decoder stage for symbolic decode. Performing the computations necessary for ISI cancellation in a bifurcated manner allows for fast DFE convergence as well as assists a transceiver in achieving fast acquisition in a robust and reliable manner. After the start-up, all ISI is compensated by the combination of the DFE and MDFE.

In order to appreciate the advantages of the present invention, it will be beneficial to describe the invention in the context of an exemplary bidirectional communication device, such as a gigabit Ethernet transceiver. The particular exemplary implementation chosen is depicted in FIG. 1, which is a simplified block diagram of a multi-pair communication system operating in conformance with the IEEE 802.3ab standard for one gigabit (Gb/s) Ethernet full-duplex communication over four twisted pairs of Category-5 copper wires.

The communication system illustrated in FIG. 1 is represented as a point-to-point system, in order to simplify the explanation, and includes two main transceiver blocks 102 and 104, coupled together with four twisted-pair cables. Each of the wire pairs 112a, b, c, d is coupled between the transceiver blocks through a respective one of four line interface circuits 106 and communicate information developed by respective ones of four transmitter/receiver circuits (constituent transceivers) 108 coupled between respective interface circuits- and a physical coding sublayer (PCS) block 110. Four constituent transceivers 108 are capable of operating simultaneously at 250 megabits per second (Mb/s), and are coupled through respective interface circuits to facilitate full-duplex bidirectional operation. Thus, one Gb/s communication throughput of each of the transceiver blocks 102 and 104 is achieved by using four 250 Mb/s (125 Megabaud at 2 bits per symbol) constituent transceivers 108 for each of the transceiver blocks and four twisted pairs of copper cables to connect the two transceivers together.

Figure 2:
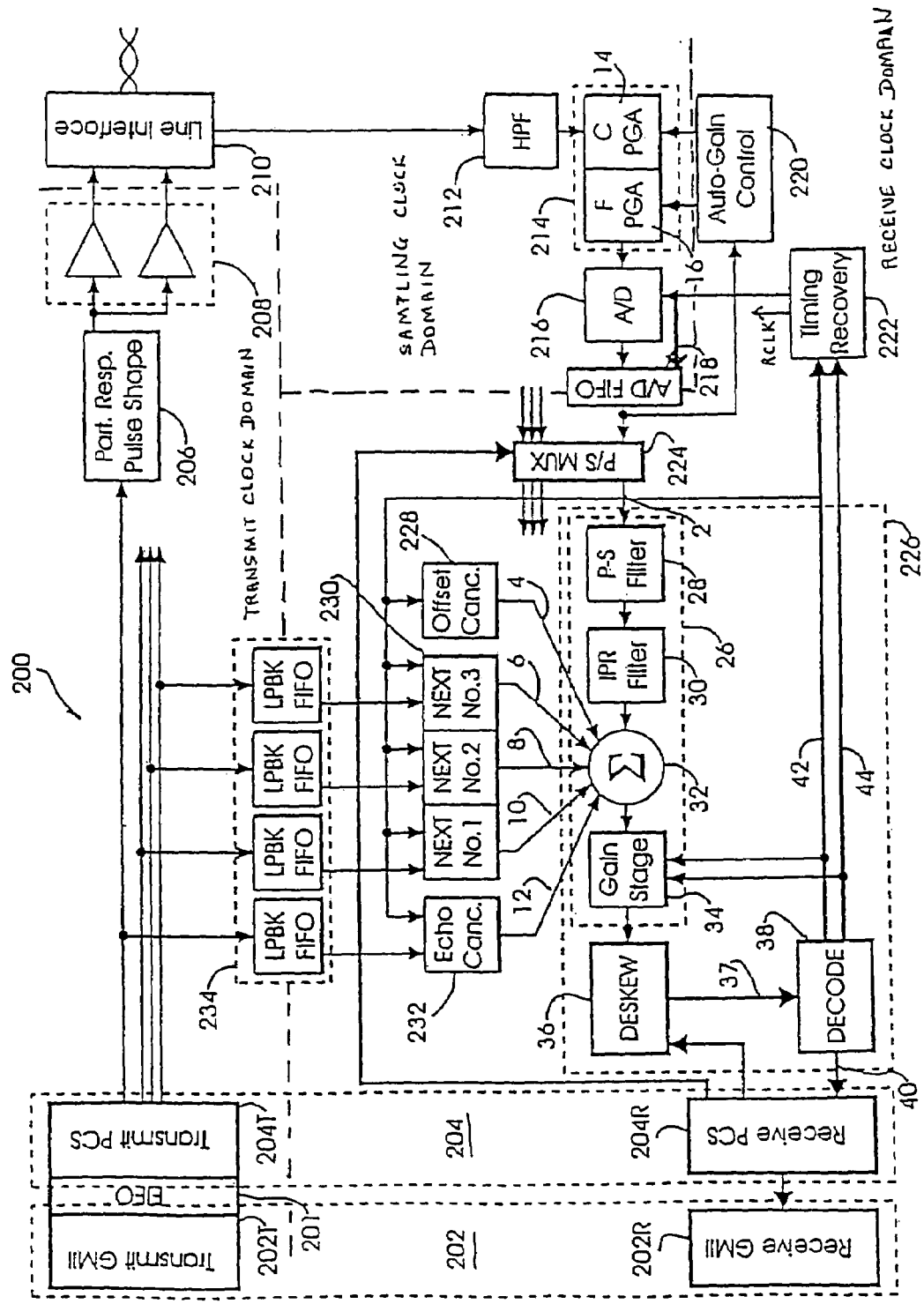
FIG. 2 is a simplified, semi-schematic block diagram of a bidirectional communication transceiver system, constructed in accordance with the present invention.

FIG. 2 is a simplified block diagram of the functional architecture and internal construction of an exemplary transceiver block, indicated generally at 200, such as transceiver 102 of FIG. 1. Since the illustrated transceiver application relates to gigabit Ethernet transmission, the transceiver will be referred to as the "gigabit transceiver." For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks in the signal lines in the exemplary embodiment of FIG. 2 perform and carry 4-dimensional (4-D) functions and 4-D signals, respectively. By 4-D, it is meant that the data from the four constituent transceivers are used simultaneously. In order to clarify signal relationships in FIG. 2, thin lines correspond to 1-dimensional functions or signals (i.e., relating to only a single transceiver), and thick lines correspond to 4-D functions or signals (relating to all four transceivers).

With reference to FIG. 2, the gigabit transceiver 200 includes a Gigabit Medium Independent Interface (GMII) block 202, a Physical Coding Sublayer (PCS) block 204, a pulse shaping filter 206, a digital-to-analog (D/A) converter 208, a line interface block 210, a highpass filter 212, a programmable gain amplifier (PGA) 214, an analog-to-digital (A/D) converter 216, an automatic gain control block 220, a timing recovery block 222, a pair-swap multiplexer block 224, a demodulator 226, an offset canceller 228, a near-end crosstalk (NEXT) canceller block 230 having three NEXT cancellers, and an echo canceller 232. The gigabit transceiver 200 also includes an A/D first-in-first-out buffer (FIFO) 218 to facilitate proper transfer of data from the analog clock region to the receive clock region, and a FIFO block 234 to facilitate proper transfer of data from the transmit clock region to the receive clock region. The gigabit transceiver 200 can optionally include a filter to cancel far-end crosstalk noise (FEXT canceller).

On the transmit path, the transmit section of the GMII block 202 receives data from a Media Access Control (MAC) module (not shown in FIG. 2) and passes the digital data to the transmit section 204T of the PCS block 204 via a FIFO 201 in byte-wide format at the rate of 125 MHz. The FIFO 201 is essentially a synchronization buffer device and is provided to ensure proper data transfer from the MAC layer to the Physical Coding (PHY) layer, since the transmit clock of the PHY layer is not necessarily synchronized with the clock of the MAC layer. This small FIFO 201 can be constructed with from three to five memory cells to accommodate the elasticity requirement which is a function of frame size and frequency offset.

The transmit section 204T of the PCS block 204 performs scrambling and coding of the data and other control functions. Transmit section 204T of the PCS block 204 generates four 1D symbols, one for each of the four constituent transceivers. The 1D symbol generated for the constituent transceiver depicted in FIG. 2 is filtered by a partial response pulse shaping filter 206 so that the radiated emission of the output of the transceiver may fall within the EMI requirements of the Federal Communications Commission. The pulse shaping filter 206 is constructed with a transfer function $0.75+0.25z^{-1}$, such that the power spectrum of the output of the transceiver falls below the power spectrum of a 100Base-Tx signal. The 100Base-Tx is a widely used and accepted Fast Ethernet standard for 100 Mb/s operation on two pairs of category-5 twisted pair cables. The output of the pulse shaping filter 206 is converted to an analog signal by the D/A converter 208 operating at 125 MHz. The analog signal passes through the line interface block 210, and is placed on the corresponding twisted pair cable for communication to a remote receiver.

On the receive path, the line interface block 210 receives an analog signal from the twisted pair cable. The received analog signal is preconditioned by a highpass filter 212 and a programmable gain amplifier (PGA) 214 before being converted to a digital signal by the A/D converter 216 operating at a sampling rate of 125 MHz. Sample timing of the A/D converter 216 is controlled by the output of a timing recovery block 222 controlled, in turn, by decision and error signals from a demodulator 226. The resulting digital signal is properly transferred from the analog clock region to the receive clock region by an A/D FIFO 218, an output of which is also used by an automatic gain control circuit 220 to control the operation of the PGA 214.

The output of the A/D FIFO 218, along with the outputs from the A/D FIFOs of the other three constituent transceivers are inputted to a pair-swap multiplexer block 224. The pair-swap multiplexer block 224 is operatively responsive to a 4D pair-swap control signal, asserted by the receive section 204R of PCS block 204, to sort out the 4 input signals and send the correct signals to the respective demodulators of the 4 constituent transceivers. Since the coding scheme used for the gigabit transceivers 102, 104 (referring to FIG. 1) is based on the fact that each twisted pair of wire corresponds to a 1D constellation, and that the four twisted pairs, collectively, form a 4D constellation, for symbol decoding to function properly, each of the four twisted pairs must be uniquely identified with one of the four dimensions. Any undetected swapping of the four pairs would necessarily result in erroneous decoding. Although described as performed by the receive section 204R of PCS block 204 and the pair-swap multiplexer block 224, in the exemplary embodiment of FIG. 2, the pair-swapping control might alternatively be performed by the demodulator 226.

Demodulator 226 receives the particular received signal 2 intended for it from the pair-swap multiplexer block 224, and functions to demodulate and decode the signal prior to directing the decoded symbols to the PCS layer 204 for transfer to the MAC. The demodulator 226 includes a multi-component feedforward equalizer (FFE) 26, having its output coupled to a de-skew memory circuit 36 and a trellis decoder 38. The FFE 26 is multi-component in the sense that it includes a pulse shaping filter 28, a programmable inverse partial response (IPR) filter 30, a summing device 32, and an adaptive gain stage 34. Functionally, the FFE 26 might be characterized as a least-mean-squares (LMS) type adaptive filter which performs channel equalization as described in the following.

Pulse shaping filter 28 is coupled to receive an input signal 2 from the pair swap MUX 224 and functions to generate a precursor to the input signal 2. Used for timing recovery, the precursor might be aptly described as a zero-crossing inserted at a precursor position of the signal. Such a zero-crossing assists a timing recovery circuit in determining phase relationships between signals, by giving the timing recovery circuit an accurately determinable signal transition point for use as a reference. The pulse shaping filter 28 can be placed anywhere before the decoder block 38. In the exemplary embodiment of FIG. 2, the pulse shaping filter 28 is positioned at the input of the FFE 26.

The pulse shaping filter 28 transfer function may be represented by a function of the form $-\gamma+z^{-1}$, $\gamma$ to $\frac{1}{16}$ for short cables (less than 80 meters) and $\frac{1}{8}$ for long cables (more than 80 m). The determination of the length of a cable is based on the gain of the coarse PGA section 14 of the PGA 214.

A programmable inverse partial response (IPR) filter 30 is coupled to receive the output of the pulse shaping filter 28, and functions to compensate the ISI introduced by the partial response pulse shaping in the transmitter section of the remote transceiver which transmitted the analog equivalent of the digital signal 2. The IPR filter 30 transfer function may be represented by a function of the form $1/(1+Kz^{-1})$ and may also be described as dynamic. In particular, the filter's K value is dynamically varied from an initial non-zero setting, valid at system start-up, to a final setting. K may take any positive value strictly less than 1. In the illustrated embodiment, K might take on a value of about 0.484375 during startup, and be dynamically ramped down to zero after convergence of the decision feedback equalizer included inside the trellis decoder 38.

The foregoing is particularly advantageous in high-speed data recovery systems, since by compensating the transmitter induced ISI at start-up, prior to decoding, it reduces the amount of processing required by the decoder to that required only for compensating transmission channel induced ISI. This "bifurcated" or divided ISI compensation process allows for fast acquisition in a robust and reliable manner. After DFE convergence, noise enhancement in the feedforward equalizer 26 is avoided by dynamically ramping the feedback gain factor K of the IPR filter 30 to zero, effectively removing the filter from the active computational path.

A summing device 32 subtracts from the output of the IPR filter 30 the signals received from the offset canceller 228, the NEXT cancellers 230, and the echo canceller 232. The offset canceller 228 is an adaptive filter which generates an estimate of the offset introduced at the analog front end which includes the PGA 214 and the A/D converter 216.

Likewise, the three NEXT cancellers 230 are adaptive filters used for modeling the NEXT impairments in the received signal caused by the symbols sent by the three local transmitters of the other three constituent transceivers. The impairments are due to a near-end crosstalk mechanism between the pairs of cables. Since each receiver has access to the data transmitted by the other three local transmitters, it is possible to nearly replicate the NEXT impairments through filtering. Referring to FIG. 2, the three NEXT cancellers 230 filter the signals sent by the PCS block 204 to the other three local transmitters and produce three signals replicating the respective NEXT impairments. By subtracting these three signals from the output of the IPR filter 30, the NEXT impairments are approximately cancelled.

Due to the bi-directional nature of the channel, each local transmitter causes an echo impairment on the received signal of the local receiver with which it is paired to form a constituent transceiver. The echo canceller 232 is an adaptive filter used for modeling the echo impairment. The echo canceller 232 filters the signal sent by the PCS block 204 to the local transmitter associated with the receiver, and produces a replica of the echo impairment. By subtracting this replica signal from the output of the IPR filter 30, the echo impairment is approximately cancelled.

Following NEXT, echo and offset cancellation, the signal is coupled to an adaptive gain stage 34 which functions to fine tune the gain of the signal path using a zero-forcing LMS algorithm. Since this adaptive gain stage 34 trains on the basis of errors of the adaptive offset, NEXT and echo cancellation filters 228, 230 and 232 respectively, it provides a more accurate signal gain than the PGA 214.

The output of the adaptive gain stage 34, which is also the output of the FFE 26, is inputted to a de-skew memory 36. The de-skew memory 36 is a four-dimensional function block, i.e., it also receives the outputs of the three FFEs of the other three constituent transceivers as well as the output of FFE 26 illustrated in FIG. 2. There may be a relative skew in the outputs of the 4 FFEs, which are the 4 signal samples representing the 4 symbols to be decoded. This relative skew can be up to 50 nanoseconds, and is due to the variations in the way the copper wire pairs are twisted. In order to correctly decode the four symbols, the four signal samples must be properly aligned. The de-skew memory is responsive to a 4D de-skew control signal asserted by the PCS block 204 to de-skew and align the four signal samples received from the four FFEs. The four de-skewed signal samples are then directed to the trellis decoder 38 for decoding.

Data received at the local transceiver was encoded, prior to transmission by a remote transceiver, using an 8-state four-dimensional trellis code. In the absence of inter-symbol interference (ISI), a proper 8-state Viterbi decoder would provide optimal decoding of this code. However, in the case of Gigabit Ethernet, the Category-5 twisted pair cable introduces a significant amount of ISI. In addition, as was described above in connection with the FFE stage 26, the partial response filter of the remote transmitter on the other end of the communication channel also contributes a certain component of ISI. Therefore, during nominal operation, the trellis decoder 38 must decode both the trellis code and compensate for at least transmission channel induced ISI, at a substantially high computational rate, corresponding to a symbol rate of about 125 Mhz.

In the illustrated embodiment of the gigabit transceiver of FIG. 2, the trellis decoder 38 suitably includes an 8-state Viterbi decoder for symbol decoding, and incorporates circuitry which implements a decision-feedback sequence estimation approach in order to compensate the ISI components perturbing the signal which represents transmitted symbols. The 4D output 40 of the trellis decoder 38 is provided to the receive section 204R of the PCS block. The receive section 204R of PCS block de-scrambles and further decodes the symbol stream and then passes the decoded packets and idle stream to the receive section of the GMII block 202 for transfer to the MAC module.

The 4D outputs 42 and 44, which represent the error and tentative decision signals defined by the decoder, respectively, are provided to the timing recovery block 222, whose output controls the sampling time of the A/D converter 216. One of the four components of the error 42 and one of the four components of the tentative decision 44 correspond to the signal stream pertinent to the particular receiver section, illustrated in FIG. 2, and are provided to the adaptive gain stage 34 to adjust the gain of the signal path.

The component 42A of the 4D error 42, which corresponds to the receiver shown in FIG. 2, is further provided to the adaptation circuitry of each of the adaptive offset, NEXT and echo cancellation filters 228, 230, 232. Adaptation circuitry evaluates the content of the error component and, initially, adapts the filter's training process to develop suitable filter coefficient values. During nominal operation, adaptation circuitry monitors the error component and provides periodic updates to the filter coefficients in response thereto.

As implemented in the exemplary Ethernet gigabit transceiver, the trellis decoder 38 functions to decode symbols that have been encoded in accordance with the trellis code specified in the IEEE 802.3ab standard (1000BASE-T, or gigabit). As mentioned above, information signals are communicated between transceivers at a symbol rate of about 125 Mhz, on each of the pairs of twisted copper cables that make up the transmission channel. In accordance with established Ethernet communication protocols, information signals are modulated for transmission in accordance with a 5-level Pulse Amplitude Modulation (PAM-5) modulation scheme. Thus, since information signals are represented by five amplitude levels, it will be understood that symbols can be expressed in a three bit representation on each twisted wire pair.

Figures 4A, 4B:
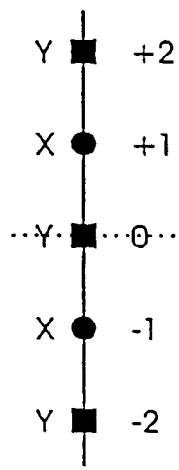
FIG. 4A illustrates an exemplary PAM-5 constellation and the one-dimensional symbol-subset partitioning.
FIG. 4B illustrates the eight 4D code-subsets constructed from the one-dimensional symbol-subset partitioning of the constellation of FIG. 4A.

Turning now to FIGS. 4A and 4B, an exemplary PAM-5 constellation is depicted in FIG. 4A which also depicts the one-dimensional symbol subset partitioning within the constellation. As illustrated in FIG. 4A, the constellation is a representation of five amplitude levels, +2, +1, 0, −1, −2, in decreasing order. Symbol subset partitioning occurs by dividing the five levels into two 1D subsets, X and Y, and assigning X and Y subset designations to the five levels on an alternating basis. Thus +2, 0 and −2 are assigned to the Y subset; +1 and −1 are assigned to the X subset. The partitioning could, of course, be reversed, with +1 and −1 being assigned a Y designation.

It should be recognized that although the X and Y subsets represent different absolute amplitude levels, the vector distance between neighboring amplitudes within the subsets are the same, i.e., two (2). The X subset therefore includes amplitude level designations which differ by a value of two, (−1, +1), as does the Y subset (−2, 0, +2). This partitioning offers certain advantages to slicer circuitry in a decoder, as will be developed further below.

In FIG. 4B, the 1D subsets have been combined into 4D subsets representing the four twisted pairs of the transmission channel. Since 1D subset definition is binary (X:Y) and there are four wire pairs, there are sixteen possible combinations of 4D subsets. These sixteen possible combinations are assigned into eight 4D subsets, s0 to s7 inclusive, in accordance with a trellis coding scheme. Each of the 4D subsets (also termed code subsets) are constructed of a union of two complementary 4D sub-subsets, e.g., code-subset three (identified as s3) is the union of sub-subset X:X:Y:X and its complementary image Y:Y:X:Y.

Figure 6:
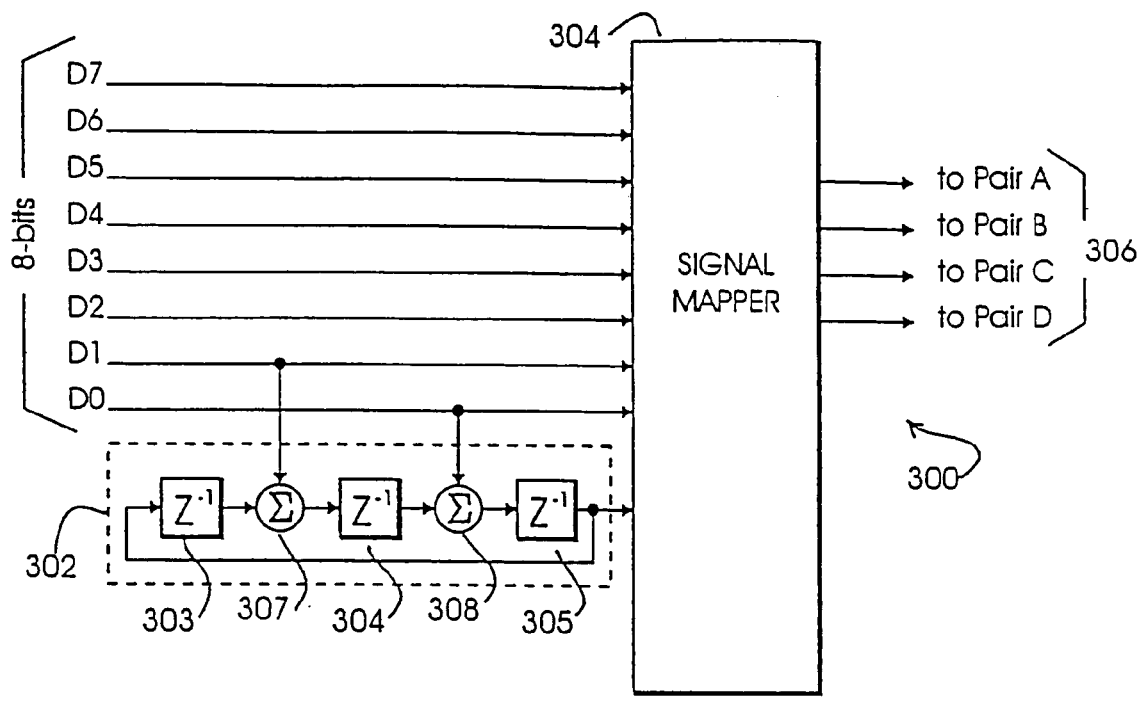
FIG. 6 is a simplified, semi-schematic block diagram of an exemplary trellis encoder.

Data being processed for transmission is encoded using the above described 4-dimensional (4D) 8-state trellis code, in an encoder circuit, such as illustrated in the exemplary block diagram of FIG. 6, according to an encoding algorithm specified in the 1000BASE-T standard. Referring to FIG. 6, an exemplary encoder 300, which is commonly provided in the transmit PCS portion of a gigabit transceiver, might be represented in simplified form as a convolutional encoder 302 in combination with a signal mapper 304. Data received by the transmit PCS from the MAC module via the transmit gigabit medium independent interface are encoded with control data and scrambled, resulting in an eight bit data word represented by input bits $D_0$ through $D_7$ which are introduced to the signal mapper 304 of the encoder 300 at a data rate of about 125 MHz. The two least significant bits, $D_0$ and $D_1$, are also inputted, in parallel fashion, into a convolutional encoder 302, implemented as a linear feedback shift register, in order to generate a redundancy bit C which is a necessary condition for the provision of the coding gain of the code.

As described above, the convolutional encoder 302 is a linear feedback shift register, constructed of three delay elements 303, 304 and 305 (conventionally denoted by $z^{-1}$) interspersed with and separated by two summing circuits 307 and 308 which function to combine the two least significant bits (LSBs), $D_0$ and $D_1$, of the input word with the output of the first and second delay elements, 303 and 304 respectively. The two time sequences formed by the streams of the two LSBs are convolved with the coefficients of the linear feedback shift register to produce the time sequence of the redundancy bit C. Thus, the convolutional encoder might be viewed as a state machine.

The signal mapper 304 maps the 9 bits ($D_0$-$D_7$ and C) into a particular 4-dimensional constellation point. Each of the four dimensions uniquely corresponds to one of the four twisted wire pairs. In each dimension, the possible symbols are from the symbol set $\{-2, -1, 0, +1, +2\}$. The symbol set is partitioned into two disjoint symbol subsets X and Y, with X=$\{-1, +1\}$ and Y=$\{-2, 0, +2\}$, as described above and shown in FIG. 4A.

Referring to FIG. 4B, the eight code subsets s0 through s7 define the constellation of the code in the signal space. Each of the code subsets is formed by the union of two code sub-subsets, each of the code sub-subsets being formed by 4D patterns obtained from concatenation of symbols taken from the symbol subsets X and Y. For example, the code subset s0 is formed by the union of the 4D patterns from the 4D code sub-subsets XXXX and YYYY. It should be noted that the distance between any two arbitrary even (respectively, odd) code-subsets is $\sqrt{2}$. It should be further noted that each of the code subsets is able to define at least 72 constellation points. However, only 64 constellation points in each code subset are recognized as codewords of the trellis code specified in the 1000BASE-T standard.

This reduced constellation is termed the pruned constellation. Hereinafter, the term "codeword" is used to indicate a 4D symbol that belongs to the pruned constellation. A valid codeword is part of a valid path in the trellis diagram.

Referring now to FIG. 6 and with reference to FIGS. 4A and 4B, in operation, the signal mapper 304 uses the 3 bits $D_1$, $D_0$ and C to select one of the code subsets s0-s7, and uses the 6 MSB bits of the input signal, $D_2$-$D_7$ to select one of 64 particular points in the selected code subset. These 64 particular points of the selected coded subset correspond to codewords of the trellis code. The signal mapper 304 outputs the selected 4D constellation point 306 which will be placed on the four twisted wire pairs after pulse shape filtering and digital-to-analog conversion.

Figure 5:
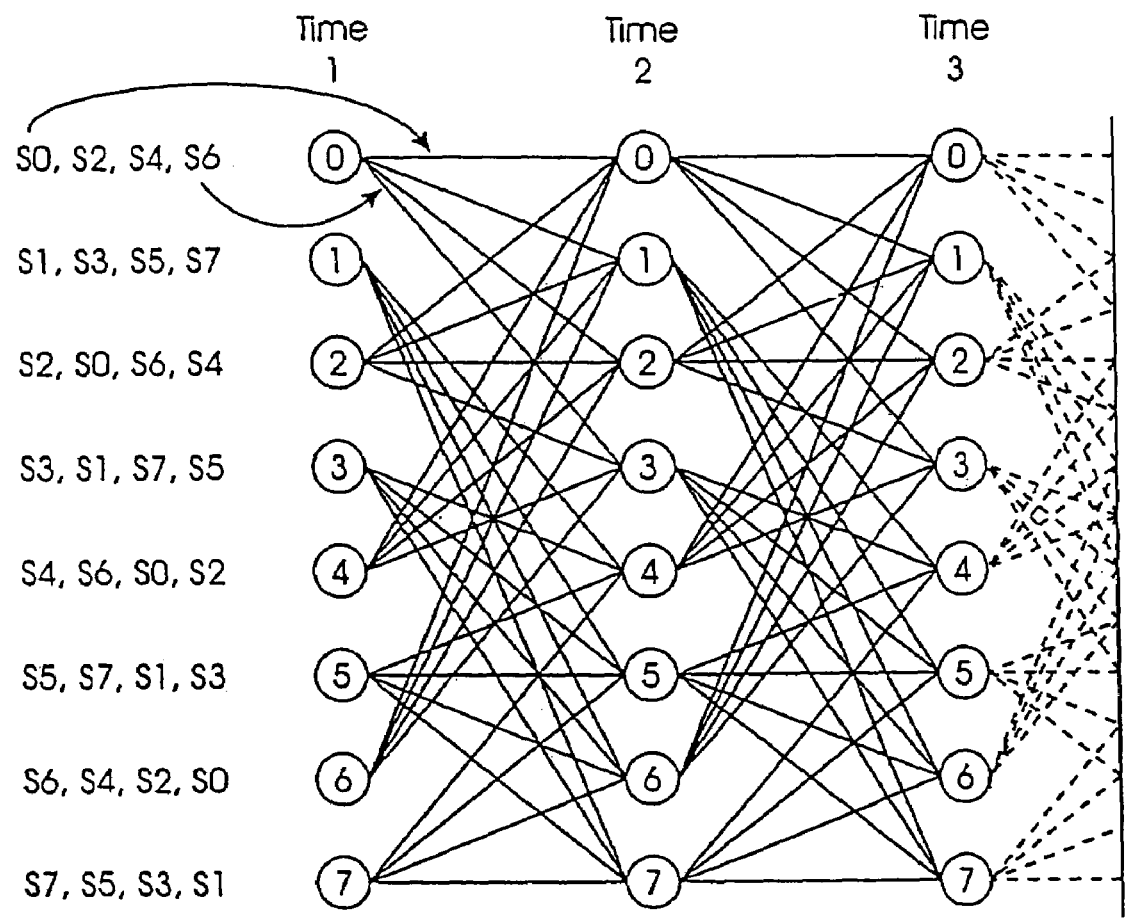
FIG. 5 illustrates the trellis diagram for the code.

FIG. 5 shows the trellis diagram for the trellis code specified in the 1000BASE-T standard. In the trellis diagram, each vertical column of nodes represents the possible states that the encoder 300 (FIG. 6) can assume at a point in time. It is noted that the states of the encoder 300 are dictated by the states of the convolutional encoder 302 (FIG. 6). Since the convolutional encoder 302 has three delay elements, there are eight distinct states. Successive columns of nodes represent the possible states that might be defined by the convolutional encoder state machine at successive points in time.

Referring to FIG. 5, the eight distinct states of the encoder 300 are identified by numerals 0 through 7, inclusive. From any given current state, each subsequent transmitted 4D symbol must correspond to a transition of the encoder 300 from the given state to a permissible successor state. For example, from the current state 0 (respectively, from current states 2, 4, 6), a transmitted 4D symbol taken from the code subset s0 corresponds to a transition to the successor state 0 (respectively, to successor states 1, 2 or 3). Similarly, from current state 0, a transmitted 4D symbol taken from code subset s2 (respectively, code subsets s4, s6) corresponds to a transition to successor state 1 (respectively, successor states 2, 3).

Familiarity with the trellis diagram of FIG. 5, illustrates that from any even state (i.e., states 0, 2, 4 or 6), valid transitions can only be made to certain ones of the successor states, i.e., states 0, 1, 2 or 3. From any odd state (states 1, 3, 5 or 7), valid transitions can only be made to the remaining successor states, i.e., states 4, 5, 6 or 7. Each transition in the trellis diagram, also called a branch, may be thought of as being characterized by the predecessor state (the state it leaves), the successor state (the state it enters) and the corresponding transmitted 4D symbol. A valid sequence of states is represented by a path through the trellis which follows the above noted rules. A valid sequence of states corresponds to a valid sequence of transmitted 4D symbols.

At the receiving end of the communication channel, the trellis decoder 38 uses the methodology represented by the trellis diagram of FIG. 5 to decode a sequence of received signal samples into their symbolic representation, in accordance with the well known Viterbi algorithm. A traditional Viterbi decoder processes information signals iteratively, on an information frame by information frame basis (in the Gigabit Ethernet case, each information frame is a 4D received signal sample corresponding to a 4D symbol), tracing through a trellis diagram corresponding to the one used by the encoder, in an attempt to emulate the encoders behavior. At any particular frame time, the decoder is not instantaneously aware of which node (or state) the encoder has reached, thus, it does not try to decode the node at that particular frame time. Instead, given the received sequence of signal samples, the decoder calculates the most likely path to every node and determines the distance between each of such paths and the received sequence in order to determine a quantity called the path metric.

In the next frame time, the decoder determines the most likely path to each of the new nodes of that frame time. To get to any one of the new nodes, a path must pass through one of the old nodes. Possible paths to each new node are obtained by extending to this new node each of the old paths that are allowed to be thus extended, as specified by the trellis diagram. In the trellis diagram of FIG. 5, there are four possible paths to each new node. For each new node, the extended path with the smallest path metric is selected as the most likely path to this new node.

By continuing the above path-extending process, the decoder determines a set of surviving paths to the set of nodes at the nth frame time. If all of the paths pass through the same node at the first frame time, then the traditional decoder knows which most likely node the encoder entered at the first frame time, regardless of which node the encoder entered at the nth frame time. In other words, the decoder knows how to decode the received information associated with the first frame time, even though it has not yet made a decision for the received information associated with the nth frame time. At the nth frame time, the traditional decoder examines all surviving paths to see if they pass through the same first branch in the first frame time. If they do, then the valid symbol associated with this first branch is outputted by the decoder as the decoded information frame for the first frame time. Then, the decoder drops the first frame and takes in a new frame for the next iteration. Again, if all surviving paths pass through the same node of the oldest surviving frame, then this information frame is decoded. The decoder continues this frame-by-frame decoding process indefinitely so long as information is received.

The number of symbols that the decoder can store is called the decoding-window width. The decoder must have a decoding window width large enough to ensure that a well-defined decision will almost always be made at a frame time. As discussed later in connection with FIGS. 13 and 14, the decoding window width of the trellis decoder 38 of FIG. 2 is 10 symbols. This length of the decoding window is selected based on results of computer simulation of the trellis decoder 38.

A decoding failure occurs when not all of the surviving paths to the set of nodes at frame time n pass through a common first branch at frame time 0. In such a case, the traditional decoder would defer making a decision and would continue tracing deeper in the trellis. This would cause unacceptable latency for a high-speed system such as the gigabit Ethernet transceiver. Unlike the traditional decoder, the trellis decoder 38 of the present invention does not check whether the surviving paths pass through a common first branch. Rather, the trellis decoder, in accordance with the invention, makes an assumption that the surviving paths at frame time n pass through such a branch, and outputs a decision for frame time 0 on the basis of that assumption. If this decision is incorrect, the trellis decoder 38 will necessarily output a few additional incorrect decisions based on the initial perturbation, but will soon recover due to the nature of the particular relationship between the code and the characteristics of the transmission channel. It should, further, be noted that this potential error introduction source is relatively trivial in actual practice, since the assumption made by the trellis decoder 38 that all the surviving paths at frame time n pass through a common first branch at frame time 0 is a correct one to a very high statistical probability.

Figure 3:
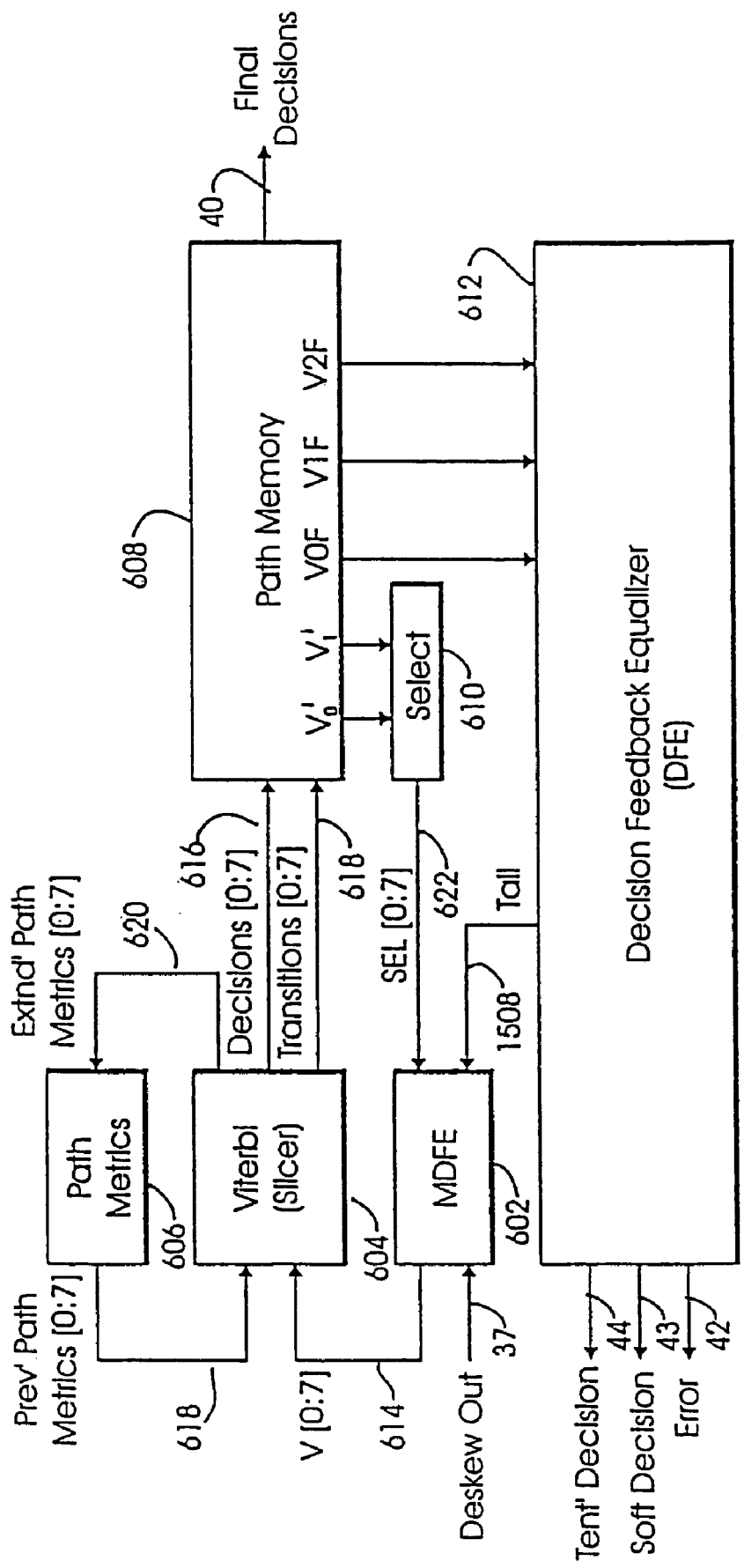
FIG. 3 is a simplified, semi-schematic block diagram of an exemplary trellis decoder, including a Viterbi decoder, in accordance with the invention, suitable for decoding signals coded by the exemplary trellis encoder of FIG. 6.

FIG. 3 is a simplified block diagram of the construction details of an exemplary trellis decoder such as described in connection with FIG. 2. The exemplary trellis decoder (again indicated generally at 38) is constructed to include a multiple decision feedback equalizer (MDFE) 602, Viterbi decoder circuitry 604, a path metrics module 606, a path memory module 608, a select logic 610, and a decision feedback equalizer 612. In general, a Viterbi decoder is often thought of as including the path metrics module and the path memory module. However, because of the unique arrangement and functional operation of the elements of the exemplary trellis decoder 38, the functional element which performs the slicing operation will be referred to herein as Viterbi decoder circuitry, a Viterbi decoder, or colloquially a Viterbi.

The Viterbi decoder circuitry 604 performs 4D slicing of signals received at the Viterbi inputs 614, and computes the branch metrics. A branch metric, as the term is used herein, is well known and refers to an elemental path between neighboring Trellis nodes. A plurality of branch metrics will thus be understood to make up a path metric. An extended path metric will be understood to refer to a path metric, which is extended by a next branch metric to thereby form an extension to the path. Based on the branch metrics and the previous path metrics information 618 received from the path metrics module 606, the Viterbi decoder 604 extends the paths and computes the extended path metrics 620 which are returned to the path metrics module 606. The Viterbi decoder 604 selects the best path incoming to each of the eight states, updates the path memory stored in the path memory module 608 and the path metrics stored in the path metrics module 606.

In the traditional Viterbi decoding algorithm, the inputs to a decoder are the same for all the states of the code. Thus, a traditional Viterbi decoder would have only one 4D input for a 4D 8-state code. In contrast, and in accordance with the present invention, the inputs 614 to the Viterbi decoder 604 are different for each of the eight states. This is the result of the fact the Viterbi inputs 614 are defined by feedback signals generated by the MDFE 602 and are different for each of the eight paths (one path per state) of the Viterbi decoder 604, as will be discussed later.

There are eight Viterbi inputs 614 and eight Viterbi decisions 616, each corresponding to a respective one of the eight states of the code. Each of the eight Viterbi inputs 614, and each of the decision outputs 618, is a 4-dimensional vector whose four components are the Viterbi inputs and decision outputs for the four constituent transceivers, respectively. In other words, the four components of each of the eight Viterbi inputs 614 are associated with the four pairs of the Category-5 cable. The four components are a received word that corresponds to a valid codeword. From the foregoing, it should be understood that detection (decoding, demodulation, and the like) of information signals in a gigabit system is inherently computationally intensive. When it is further realized that received information must be detected at a very high speed and in the presence of ISI channel impairments, the difficulty in achieving robust and reliable signal detection will become apparent.

In accordance with the present invention, the Viterbi decoder 604 detects a non-binary word by first producing a set of one-dimensional (1D) decisions and a corresponding set of 1D errors from the 4D inputs. By combining the 1D decisions with the 1D errors, the decoder produces a set of 4D decisions and a corresponding set of 4D errors. Hereinafter, this generation of 4D decisions and errors from the 4D inputs is referred to as 4D slicing. Each of the 1D errors represents the distance metric between one 1D component of the eight 4D-inputs and a symbol in one of the two disjoint symbol-subsets X, Y. Each of the 4D errors is the distance between the received word and the corresponding 4D decision which is a codeword nearest to the received word with respect to one of the code-subsets $s_i$, where $i=0, \ldots 7$.

4D errors may also be characterized as the branch metrics in the Viterbi algorithm. The branch metrics are added to the previous values of path metrics 618 received from the path metrics module 606 to form the extended path metrics 620 which are then stored in the path metrics module 606, replacing the previous path metrics. For any one given state of the eight states of the code, there are four incoming paths. For a given state, the Viterbi decoder 604 selects the best path, i.e., the path having the lowest metric of the four paths incoming to that state, and discards the other three paths. The best path is saved in the path memory module 608. The metric associated with the best path is stored in the path metrics module 606, replacing the previous value of the path metric stored in that module.

In the following, the 4D slicing function of the Viterbi decoder 604 will be described in detail. 4D slicing may be described as being performed in three sequential steps. In a first step, a set of 1D decisions and corresponding 1D errors are generated from the 4D Viterbi inputs. Next, the 1D decisions and 1D errors are combined to form a set of 2D decisions and corresponding 2D errors. Finally, the 2D decisions and 2D errors are combined to form 4D decisions and corresponding 4D errors.

Figure 7:
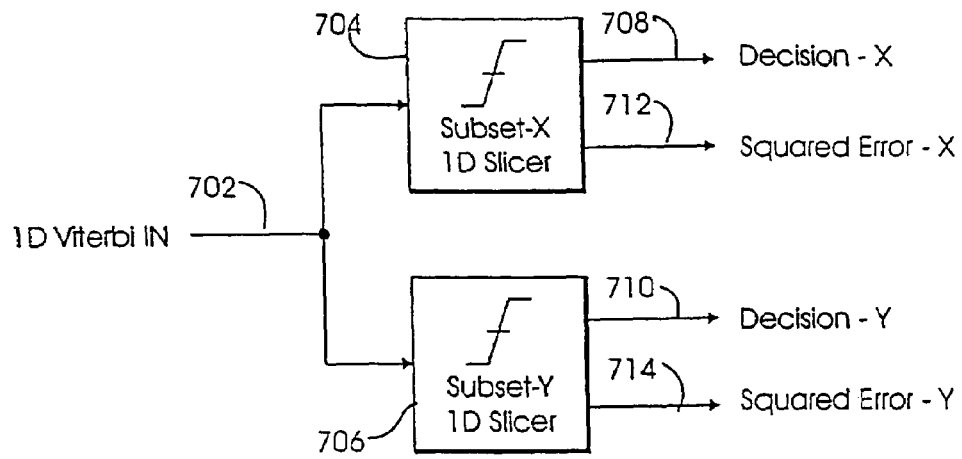
FIG. 7 is a simplified block diagram of a first exemplary embodiment of a structural analog of a 1D slicing function as might be implemented in the Viterbi decoder of FIG. 3.

FIG. 7 is a simplified, conceptual block diagram of a first exemplary embodiment of a 1D slicing function such as might be implemented by the Viterbi decoder 604 of FIG. 3. Referring to FIG. 7, a 1D component 702 of the eight 4D Viterbi inputs (614 of FIG. 3) is sliced, i.e., detected, in parallel fashion, by a pair of 1D slicers 704 and 706 with respect to the X and Y symbol-subsets. Each slicer 704 and 706 outputs a respective 1D decision 708 and 710 with respect to the appropriate respective symbol-subset X, Y and an associated squared error value 712 and 714. Each 1D decision 708 or 710 is the symbol which is closest to the 1D input 702 in the appropriate symbol-subset X and Y, respectively. The squared error values 712 and 714 each represent the square of the difference between the 1D input 702 and their respective 1D decisions 708 and 710.

The 1D slicing function shown in FIG. 7 is performed for all four constituent transceivers and for all eight states of the trellis code in order to produce one pair of 1D decisions per transceiver and per state. Thus, the Viterbi decoder 604 has a total of 32 pairs of 1D slicers disposed in a manner identical to the pair of slicers 704, 706 illustrated in FIG. 7.

Figure 8:
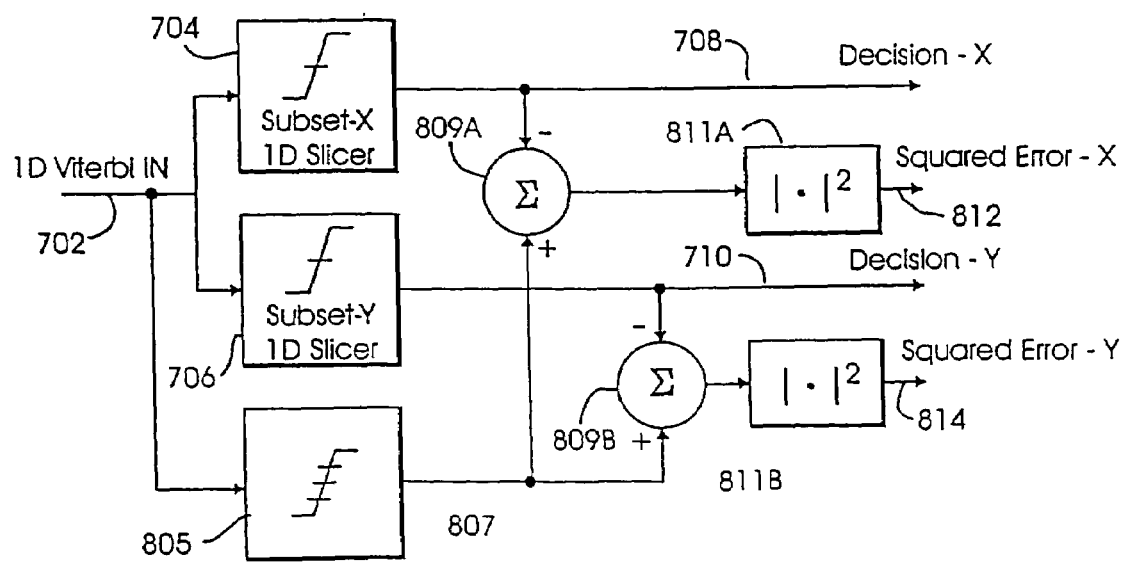
FIG. 8 is a simplified block diagram of a second exemplary embodiment of a structural analog of a 1D slicing function as might be implemented in the Viterbi decoder of FIG. 3.

FIG. 8 is a simplified block diagram of a second exemplary embodiment of circuitry capable of implementing a 1D slicing function suitable for incorporation in the Viterbi decoder 604 of FIG. 5. Referring to FIG. 8, the 1D component 702 of the eight 4D Viterbi inputs is sliced, i.e., detected, by a first pair of 1D slicers 704 and 706, with respect to the X and Y symbol-subsets, and also by a 5-level slicer 805 with respect to the symbol set which represents the five levels (+2, +1, 0, −1, −2) of the constellation, i.e., a union of the X and Y symbol-subsets. As in the previous case described in connection with FIG. 7, the slicers 704 and 706 output 1D decisions 708 and 710. The 1D decision 708 is the symbol which is nearest the 1D input 702 in the symbol-subset X, while 1D decision 710 corresponds to the symbol which is nearest the 1D input 702 in the symbol-subset Y. The output 807 of the 5-level slicer 805 corresponds to the particular one of the five constellation symbols which is determined to be closest to the 1D input 702.

The difference between each decision 708 and 710 and the 5-level slicer output 807 is processed, in a manner to be described in greater detail below, to generate respective quasi-squared error terms 812 and 814. In contrast to the 1D error terms 712, 714 obtained with the first exemplary embodiment of a 1D slicer depicted in FIG. 7, the 1D error terms 812, 814 generated by the exemplary embodiment of FIG. 8 are more easily adapted to discerning relative differences between a 1D decision and a 1D Viterbi input.

In particular, the slicer embodiment of FIG. 7 may be viewed as performing a "soft decoded," with 1D error terms 712 and 714 represented by Euclidean metrics. The slicer embodiment depicted in FIG. 8 may be viewed as performing a "hard decode," with its respective 1D error terms 812 and 814 expressed in Hamming metrics (i.e., 1 or 0). Thus, there is less ambiguity as to whether the 1D Viterbi input is closer to the X symbol subset or to the Y symbol subset. Furthermore, Hamming metrics can be expressed in a fewer number of bits, than Euclidean metrics, resulting in a system that is substantially less computationally complex and substantially faster.

In the exemplary embodiment of FIG. 8, error terms are generated by combining the output of the five level slicer 805 with the outputs of the 1D slicers 704 and 706 in respective adder circuits 809A and 809B. The outputs of the adders are directed to respective squared magnitude blocks 811A and 811B which generate the binary squared error terms 812 and 814, respectively.

Implementation of squared error terms by use of circuit elements such as adders 809A, 809B and the magnitude squared blocks 811A, 811B is done for descriptive convenience and conceptual illustration purposes only. In practice, squared error term definition is implemented with a look-up table that contains possible values for error-X and error-Y for a given set of decision-X, decision-Y and Viterbi input values. The look-up table can be implemented with a read-only-memory device or alternatively, a random logic device or PLA. Examples of look-up tables, suitable for use in practice of the present invention, are illustrated in FIGS. 17, 18A and 18B.

The 1D slicing function exemplified in FIG. 8 is performed for all four constituent transceivers and for all eight states of the trellis code in order to produce one pair of 1D decisions per transceiver and per state. Thus, the Viterbi decoder 604 has a total of thirty two pairs of 1D slicers that correspond to the pair of slicers 704, 706, and thirty two 5-level slicers that correspond to the 5-level slicer 805 of FIG. 8.

Each of the 1D errors is represented by substantially fewer bits than each 1D component of the 4D inputs. For example, in the embodiment of FIG. 7, the 1D component of the 4D Viterbi input is represented by 5 bits, while the 1D error is represented by 2 or 3 bits. Traditionally, proper soft decision decoding of such a trellis code would require that the distance metric (Euclidean distance) be represented by 6 to 8 bits. One advantageous feature of the present invention is that only 2 or 3 bits are required for the distance metric in soft decision decoding of this trellis code.

In the embodiment of FIG. 8, the 1D error can be represented by just 1 bit. It is noted that, since the 1D error is represented by 1 bit, the distance metric used in this trellis decoding is no longer the Euclidean distance, which is usually associated with trellis decoding, but is instead the Hamming distance, which is usually associated with hard decision decoding of binary codewords. This is another particularly advantageous feature of the present invention.

Figure 9:
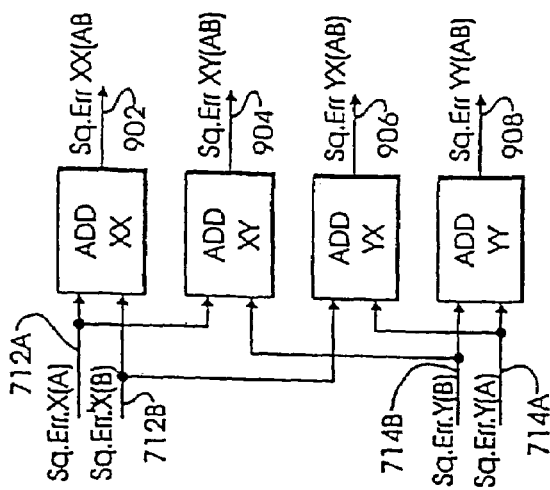
FIG. 9 is a simplified block diagram of a 2D error term generation machine, illustrating the generation of 2D square error terms from the 1D square error terms developed by the exemplary slicers of FIG. 7 or 8.

FIG. 9 is a block diagram illustrating the generation of the 2D errors from the 1D errors for twisted pairs A and B (corresponding to constituent transceivers A and B). Since the generation of errors is similar for twisted pairs C and D, this discussion will only concern itself with the A:B 2D case. It will be understood that the discussion is equally applicable to the C:D 2D case with the appropriate change in notation. Referring to FIG. 9, 1D error signals 712A, 712B, 714A, 714B might be produced by the exemplary 1D slicing functional blocks shown in FIG. 7 or 8. The 1D error term signal 712A (or respectively, 712B) is obtained by slicing, with respect to symbol-subset X, the 1D component of the 4D Viterbi input, which corresponds to pair A (or respectively, pair B). The 1D error term 714A (respectively, 714B) is obtained by slicing, with respect to symbol-subset Y, the 1D component of the 4D Viterbi input, which corresponds to pair A (respectively, B). The 1D errors 712A, 712B, 714A, 714B are added according to all possible combinations (XX, XY, YX and YY) to produce 2D error terms 902AB, 904AB, 906AB, 908AB for pairs A and B. Similarly, the 1D errors 712C, 712D, 714C, 714D (not shown) are added according to the four different symbol-subset combinations XX, XY, YX and YY) to produce corresponding 2D error terms for wire pairs C and D.

Figure 10:
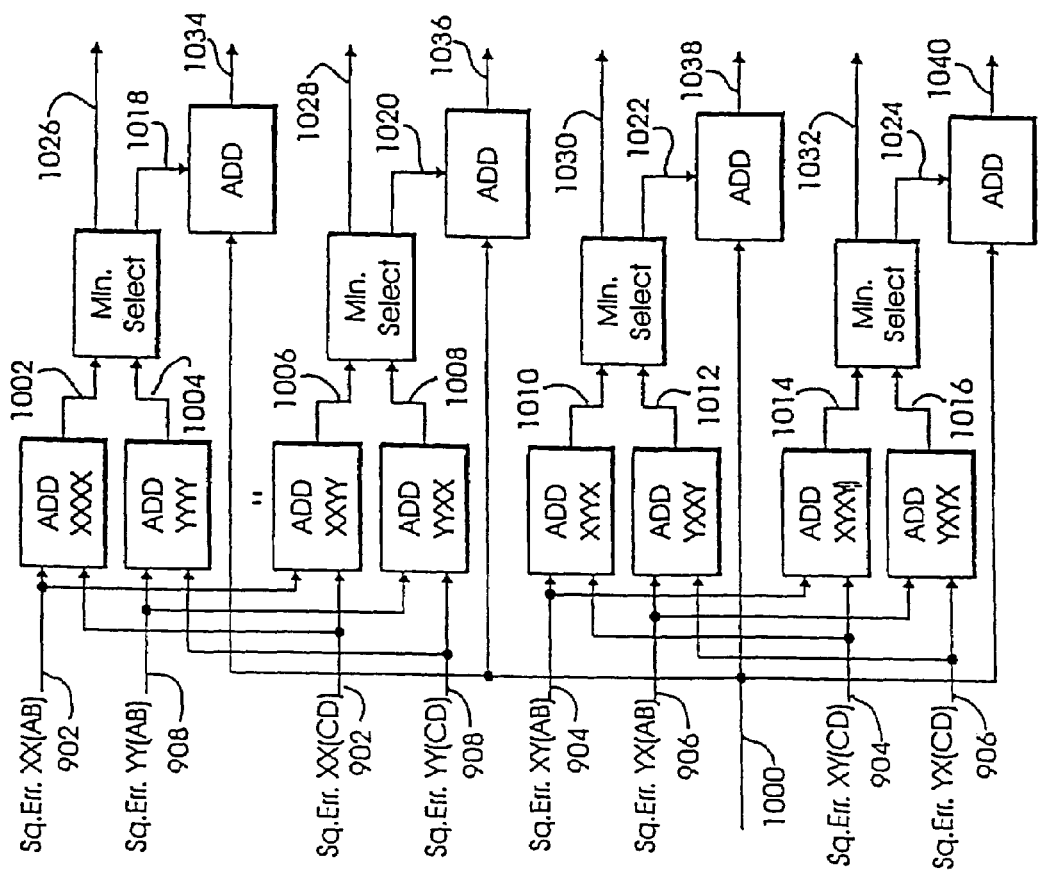
FIG. 10 is a simplified block diagram of a 4D error term generation machine, illustrating the generation of 4D square error terms and the generation of extended path metrics for the 4 extended paths outgoing from state 0.

FIG. 10 is a block diagram illustrating the generation of the 4D errors and extended path metrics for the four extended paths outgoing from state 0. Referring to FIG. 10, the 2D errors 902AB, 902CD, 904AB, 904CD, 906AB, 906CD, 908AB, 908CD are added in pairs according to eight different combinations to produce eight intermediate 4D errors 1002, 1004, 1006, 1008, 1010, 1012, 1014, 1016. For example, the 2D error 902AB, which is the squared error with respect to XX from pairs A and B, are added to the 2D error 902CD, which is the squared error with respect to XX from pairs C and D, to form the intermediate 4D error 1002 which is the squared error with respect to sub-subset XXXX for pairs A, B, C and D. Similarly, the intermediate 4D error 1004 which corresponds to the squared error with respect to sub-subset YYYY is formed from the 2D errors 908AB and 908CD.

The eight intermediate 4D errors are grouped in pairs to correspond to the code subsets s0, s2, s4 and s6 represented in FIG. 4B. For example, the intermediate 4D errors 1002 and 1004 are grouped together to correspond to the code subset s0 which is formed by the union of the XXXX and YYYY sub-subsets. From each pair of intermediate 4D errors, the one with the lowest value is selected (the other one being discarded) in order to provide the branch metric of a transition in the trellis diagram from state 0 to a subsequent state. It is noted that, according to the trellis diagram, transitions from an even state (i.e., 0, 2, 4 and 6) are only allowed to be to the states 0, 1, 2 and 3, and transitions from an odd state (i.e., 1, 3, 5 and 7) are only allowed to be to the states 4, 5, 6 and 7. Each of the index signals 1026, 1028, 1030, 1032 indicates which of the 2 sub-subsets the selected intermediate 4D error corresponds to. The branch metrics 1018, 1020, 1022, 1024 are the branch metrics for the transitions in the trellis diagram of FIG. 5 associated with code-subsets s0, s2, s4 and s6 respectively, from state 0 to states 0, 1, 2 and 3, respectively. The branch metrics are added to the previous path metric 1000 for state 0 in order to produce the extended path metrics 1034, 1036, 1038, 1040 of the four extended paths outgoing from state 0 to states 0, 1, 2 and 3, respectively.

Associated with the eight intermediate 4D errors 1002, 1004, 1006, 1008, 1010, 1012, 1014, 1016 are the 4D decisions which are formed from the 1D decisions made by one of the exemplary slicer embodiments of FIG. 7 or 8. Associated with the branch metrics 1018, 1020, 1022, 1024 are the 4D symbols derived by selecting the 4D decisions using the index outputs 1026, 1028, 1030, 1032.

Figure 11:
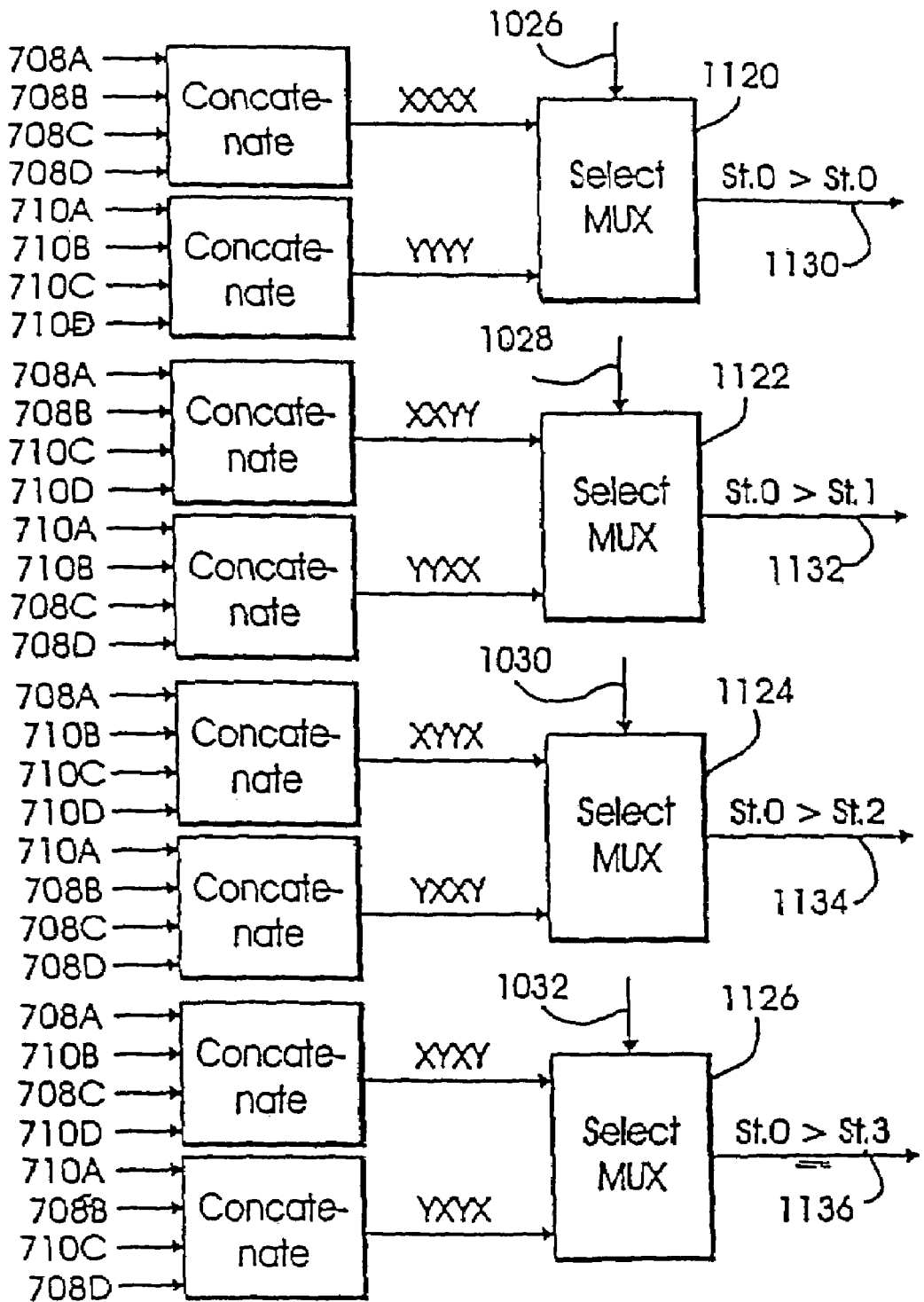
FIG. 11 is a simplified block diagram of a 4D symbol generation machine.

FIG. 11 shows the generation of the 4D symbols associated with the branch metrics 1018, 1020, 1022, 1024. Referring to FIG. 11, the 1D decisions 708A, 708B, 708C, 708D are the 1D decisions with respect to symbol-subset X (as shown in FIG. 7) for constituent transceivers A, B, C, D, respectively, and the 1D decisions 710A, 710, 710C, 710D are the 1D decisions with respect to symbol-subset Y for constituent transceivers A, B, C and D, respectively. The 1D decisions are concatenated according to the combinations which correspond to a left or right hand portion of the code subsets s0, s2, s4 and s6, as depicted in FIG. 4B. For example, the 1D decisions 708A, 708B, 708C, 708D are concatenated to correspond to the left hand portion, XXXX, of the code subset s0. The 4D decisions are grouped in pairs to correspond to the union of symbol-subset portions making up the code subsets s0, s2, s4 and s6. In particular, the 4D decisions are grouped together to correspond to the code subset s0 which is formed by the union of the XXXX and YYYY subset portions.

Referring to FIG. 11, the pairs of 4D decisions are inputted to the multiplexers 1120, 1122, 1124, 1126 which receive the index signals 1026, 1028, 1030, 1032 (FIG. 10) as select signals. Each of the multiplexers selects from a pair of the 4D decisions, the 4D decision which corresponds to the sub-subset indicated by the corresponding index signal and outputs the selected 4D decision as the 4D symbol for the branch whose branch metric is associated with the index signal. The 4D symbols 1130, 1132, 1134, 1136 correspond to the transitions in the trellis diagram of FIG. 5 associated with code-subsets s0, s2, s4 and s6 respectively, from state 0 to states 0, 1, 2 and 3, respectively. Each of the 4D symbols 1130, 1132, 1134, 1136 is the codeword in the corresponding code-subset (s0, s2, s4 and s6) which is closest to the 4D Viterbi input for state 0 (there is a 4D Viterbi input for each state). The associated branch metric (FIG. 10) is the 4D squared distance between the codeword and the 4D Viterbi input for state 0.

Figure 12:
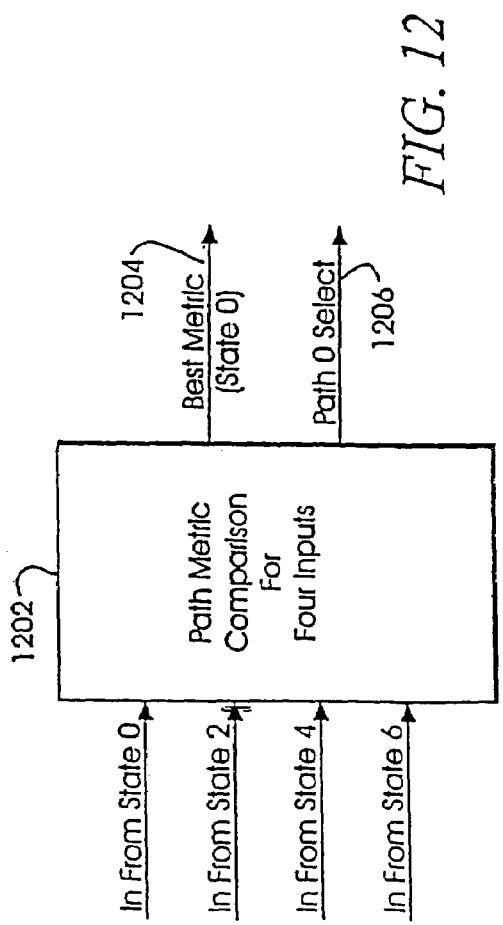
FIG. 12 illustrates the selection of the best path incoming to state 0.

FIG. 12 illustrates the selection of the best path incoming to state 0. The extended path metrics of the four paths incoming to state 0 from states 0, 2, 4 and 6 are inputted to the comparator module 1202 which selects the best path, i.e., the path with the lowest path metric, and outputs the Path 0 Select signal 1206 as an indicator of this path selection, and the associated path metric 1204.

The procedure described above for processing a 4D Viterbi input for state 0 of the code to obtain four branch metrics, four extended path metrics, and four corresponding 4D symbols is similar for the other states. For each of the other states, the selection of the best path from the four incoming paths to that state is also similar to the procedure described in connection with FIG. 12.

The above discussion of the computation of the branch metrics, illustrated by FIG. 7 through 11, is an exemplary application of the method for slicing (detecting) a received L-dimensional word and for computing the distance of the received L-dimensional word from a codeword, for the particular case where L is equal to 4.

In general terms, i.e., for any value of L greater than 2, the method can be described as follows. The codewords of the trellis code are constellation points chosen from $2^{L-1}$ code-subsets. A codeword is a concatenation of L symbols selected from two disjoint symbol-subsets and is a constellation point belonging to one of the $2^{L-1}$ code-subsets. At the receiver, L inputs are received, each of the L inputs uniquely corresponding to one of the L dimensions. The received word is formed by the L inputs. To detect the received word, $2^{L-1}$ identical input sets are formed by assigning the same L inputs to each of the $2^{L-1}$ input sets. Each of the L inputs of each of the $2^{L-1}$ input sets is sliced with respect to each of the two disjoint symbol-subsets to produce an error set of 2L one-dimensional errors for each of the $2^{L-1}$ code-subsets. For the particular case of the trellis code of the type described by the trellis diagram of FIG. 5, the one-dimensional errors are combined within each of the $2^{L-1}$ error sets to produce $2^{L-2}$ L-dimensional errors for the corresponding code-subset such that each of the $2^{L-2}$ L-dimensional errors is a distance between the received word and one of the codewords in the corresponding code-subset.

One embodiment of this combining operation can be described as follows. First, the 2L one-dimensional errors are combined to produce 2L two-dimensional errors (FIG. 9). Then, the 2L two-dimensional errors are combined to produce $2^L$ intermediate L-dimensional errors which are arranged into $2^{L-1}$ pairs of errors such that these pairs of errors correspond one-to-one to the $2^{L-1}$ code-subsets (FIG. 10, signals 1002 through 1016). A minimum is selected for each of the $2^{L-1}$ pairs of errors (FIG. 10, signals 1026, 1028, 1030, 1032). These minima are the $2^{L-1}$ L-dimensional errors. Due to the constraints on transitions from one state to a successor state, as shown in the trellis diagram of FIG. 5, only half of the $2^{L-1}$ L-dimensional errors correspond to allowed transitions in the trellis diagram. These $2^{L-2}$ L-dimensional errors are associated with $2^{L-2}$ L-dimensional decisions. Each of the $2^{L-2}$ L-dimensional decisions is a codeword closest in distance to the received word (the distance being represented by one of the $2^{L-2}$ L-dimensional errors), the codeword being in one of half of the $2^{L-1}$ code-subsets, i.e., in one of $2^{L-2}$ code-subsets of the $2^{L-1}$ code-subsets (due to the particular constraint of the trellis code described by the trellis diagram of FIG. 5).

It is important to note that the details of the combining operation on the 2L one-dimensional errors to produce the final L-dimensional errors and the number of the final L-dimensional errors are functions of a particular trellis code. In other words, they vary depending on the particular trellis code.

Figure 13:
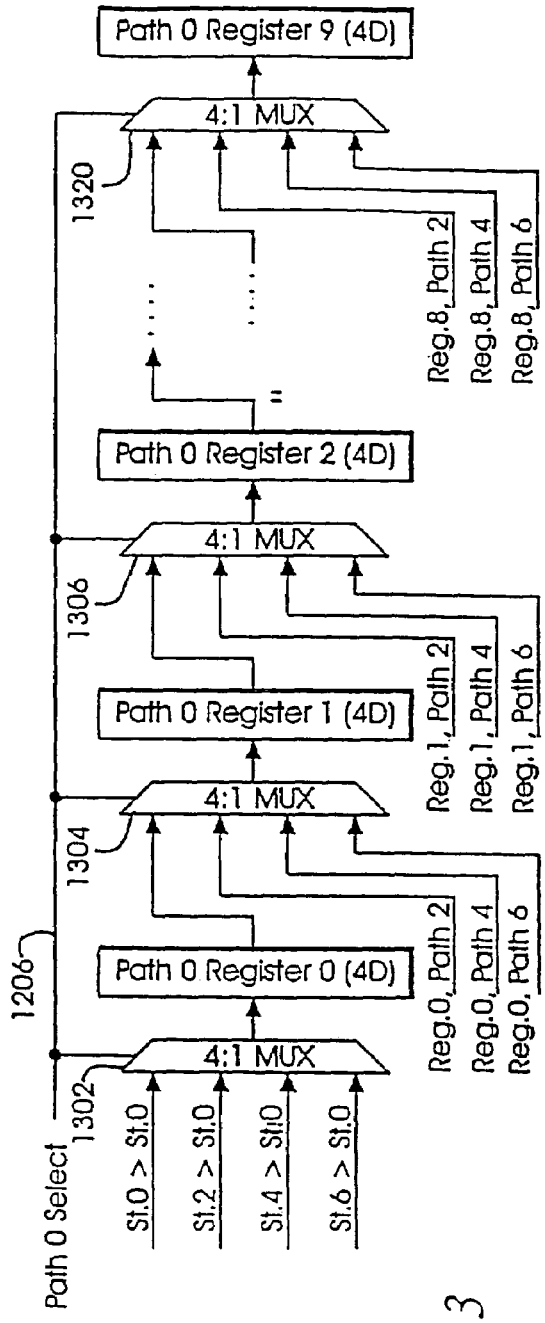
FIG. 13 is a semi-schematic block diagram illustrating the internal arrangement of a portion of the path memory module of FIG. 3.

FIG. 13 illustrates the construction of the path memory module 608 as implemented in the embodiment of FIG. 6. The path memory module 608 includes a path memory for each of the eight paths. In the illustrated embodiment of the invention, the path memory for each path is implemented as a register stack, ten levels in depth. At each level, a 4D symbol is stored in a register. The number of path memory levels is chosen as a tradeoff between receiver latency and detection accuracy. FIG. 13 only shows the path memory for path 0 and continues with the example discussed in FIGS. 7-12. FIG. 13 illustrates how the 4D decision for the path 0 is stored in the path memory module 608, and how the Path 0 Select signal, i.e., the information about which one of the four incoming extended paths to state 0 was selected, is used in the corresponding path memory to force merging of the paths at all depth levels (levels 0 through 9) in the path memory.

Referring to FIG. 13, each of the ten levels of the path memory includes a 4-to-1 multiplexer (4:1 MUX) and a register to store a 4D decision. The registers are numbered according to their depth levels. For example, register 0 is at depth level 0. The Path 0 Select signal 1206 (FIG. 12) is used as the select input for the 4:1 MUXes 1302, 1304, 1306, . . . , 1320. The 4D decisions 1130, 1132, 1134, 1136 (FIG. 11) are inputted to the 4:1 MUX 1302 which selects one of the four 4D decisions based on the Path 0 select signal 1206 and stores it in the register 0 of path 0. One symbol period later, the register 0 of path 0 outputs the selected 4D decision to the 4:1 MUX 1304. The other three 4D decisions inputted to the 4:1 MUX 1304 are from the registers 0 of paths 2, 4, and 6. Based on the Path 0 Select signal 1206, the 4:1 MUX 1304 selects one of the four 4D decisions and stores it in the register 1 of path 0. One symbol period later, the register 1 of path 0 outputs the selected 4D decision to the 4:1 MUX 1306. The other three 4D decisions inputted to the 4:1 MUX 1306 are from the registers 1 of paths 2, 4, and 6. Based on the Path 0 Select signal 1206, the 4:1 MUX 1306 selects one of the four 4D decisions and stores it in the register 2 of path 0. This procedure continues for levels 3 through 9 of the path memory for path 0. During continuous operation, ten 4D symbols representing path 0 are stored in registers 0 through 9 of the path memory for path 0.

Similarly to path 0, each of the paths 1 though 7 is stored as ten 4D symbols in the registers of the corresponding path memory. The connections between the MUX of one path and registers of different paths follows the trellis diagram of FIG. 2. For example, the MUX at level k for path 1 receives as inputs the outputs of the registers at level k−1 for paths 1, 3, 5, 7, and the MUX at level k for path 2 receives as inputs the outputs of the registers at level k−1 for paths 0, 2, 4, 6.

Figure 14:
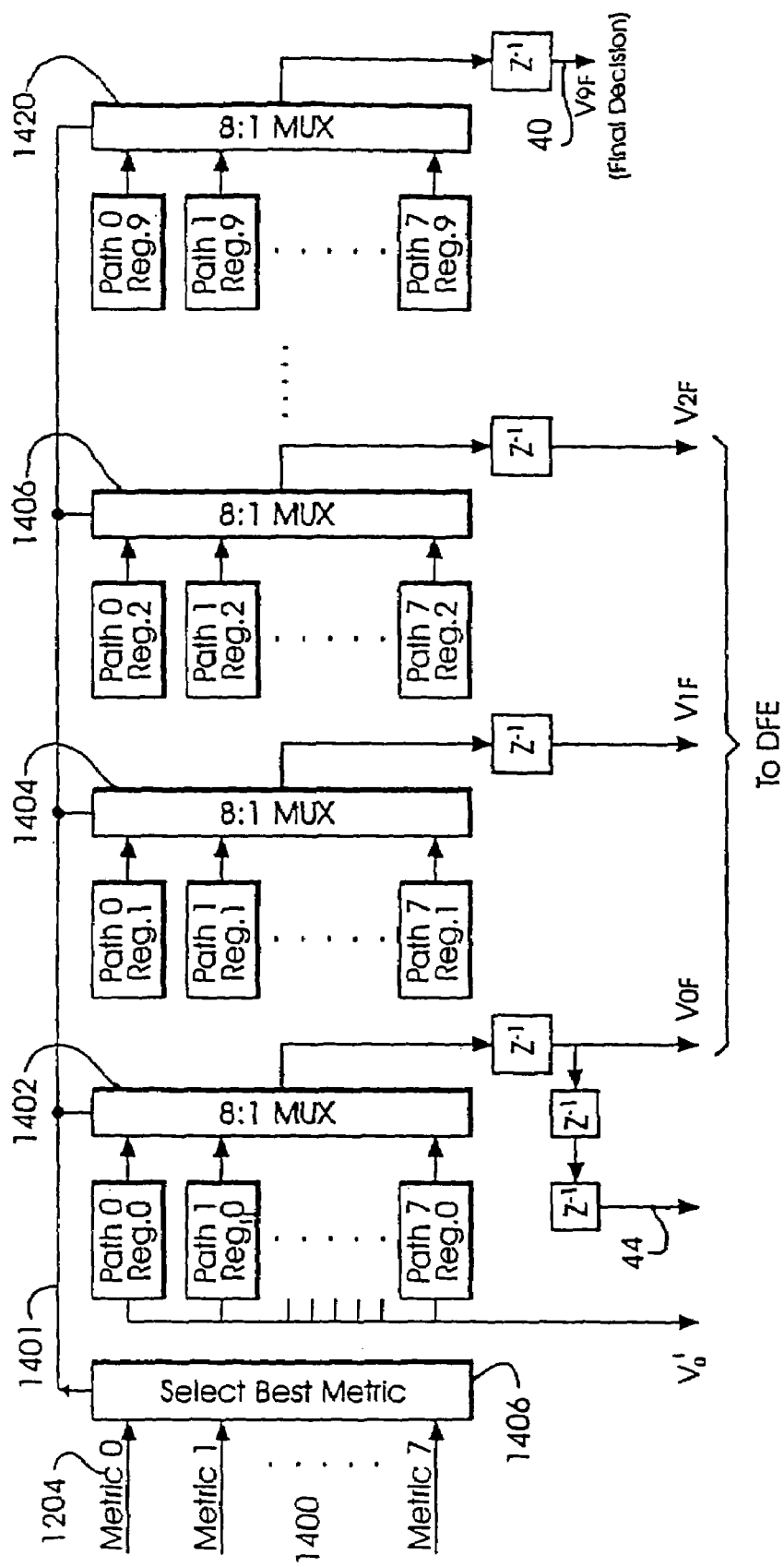
FIG. 14 is a block diagram illustrating the computation of the final decision and the tentative decisions in the path memory module based on the 4D symbols stored in the path memory for each state.

FIG. 14 is a block diagram illustrating the computation of the final decision and the tentative decisions in the path memory module 608 based on the 4D symbols stored in the path memory for each state. At each iteration of the Viterbi algorithm, the best of the eight states, i.e., the one associated with the path having the lowest path metric, is selected, and the 4D symbol from the associated path stored at the last level of the path memory is selected as the final decision 40 (FIG. 3). Symbols at lower depth levels are selected as tentative decisions, which are used to feed the delay line of the DFE 612 (FIG. 3).

Referring to FIG. 14, the path metrics 1402 of the eight states, obtained from the procedure of FIG. 12, are inputted to the comparator module 1406 which selects the one with the lowest value and provides an indicator 1401 of this selection to the select inputs of the 8-to-1 multiplexers (8:1 MUXes) 1402, 1404, 1406, Y, 1420, which are located at path memory depth levels 0 through 9, respectively. Each of the 8:1 MUXes receives eight 4D symbols outputted from corresponding registers for the eight paths, the corresponding registers being located at the same depth level as the MUX, and selects one of the eight 4D symbols to output, based on the select signal 1401. The outputs of the 8:1 MUXes located at depth levels 0 through 9 are $V_0$, $V_1$, $V_2$, Y, $V_9$, respectively.

In the illustrated embodiment, one set of eight signals, output by the first register set (the register 0 set) to the first MUX 1402, is also taken off as a set of eight outputs, denoted $V_0^i$ and provided to the MDFE (602 of FIG. 3) as a select signal which is used in a manner to be described below. Although only the first register set is illustrated as providing outputs to the DFE, the invention contemplates the second, or even higher order, register sets also providing similar outputs. In cases where multiple register sets provide outputs, these are identified by the register set depth order as a subscript, as in $V_1^i$, and the like.

In the illustrated embodiment, the MUX outputs $V_0$, $V_1$, $V_2$ ate delayed by one unit of time, and are then provided as the tentative decisions $V_{0F}$, $V_{1F}$, $V_{2F}$ to the DFE 612. The number of the outputs $V_i$ to be used as tentative decisions depends on the required accuracy and speed of decoding operation. After further delay, the output $V_0$ of the first MUX 1402 is also provided as the 4D tentative decision 44 (FIG. 2) to the Feedforward Equalizers 26 of the four constituent transceivers and the timing recovery block 222 (FIG. 2). The 4D symbol $V_{9F}$, which is the output $V_9$ of the 8:1 MUX 1420 delayed by one time unit, is provided as the final decision 40 to the receive section of the PCS 204R (FIG. 2).

The following is the discussion on how outputs $V_0^j$, $V_1^i$, $V_{0F}$, $V_{1F}$, $V_{2F}$ of the path memory module 608 might be used in the select logic 610, the MDFE 602, and the DFE 612 (FIG. 3).

Figure 15:
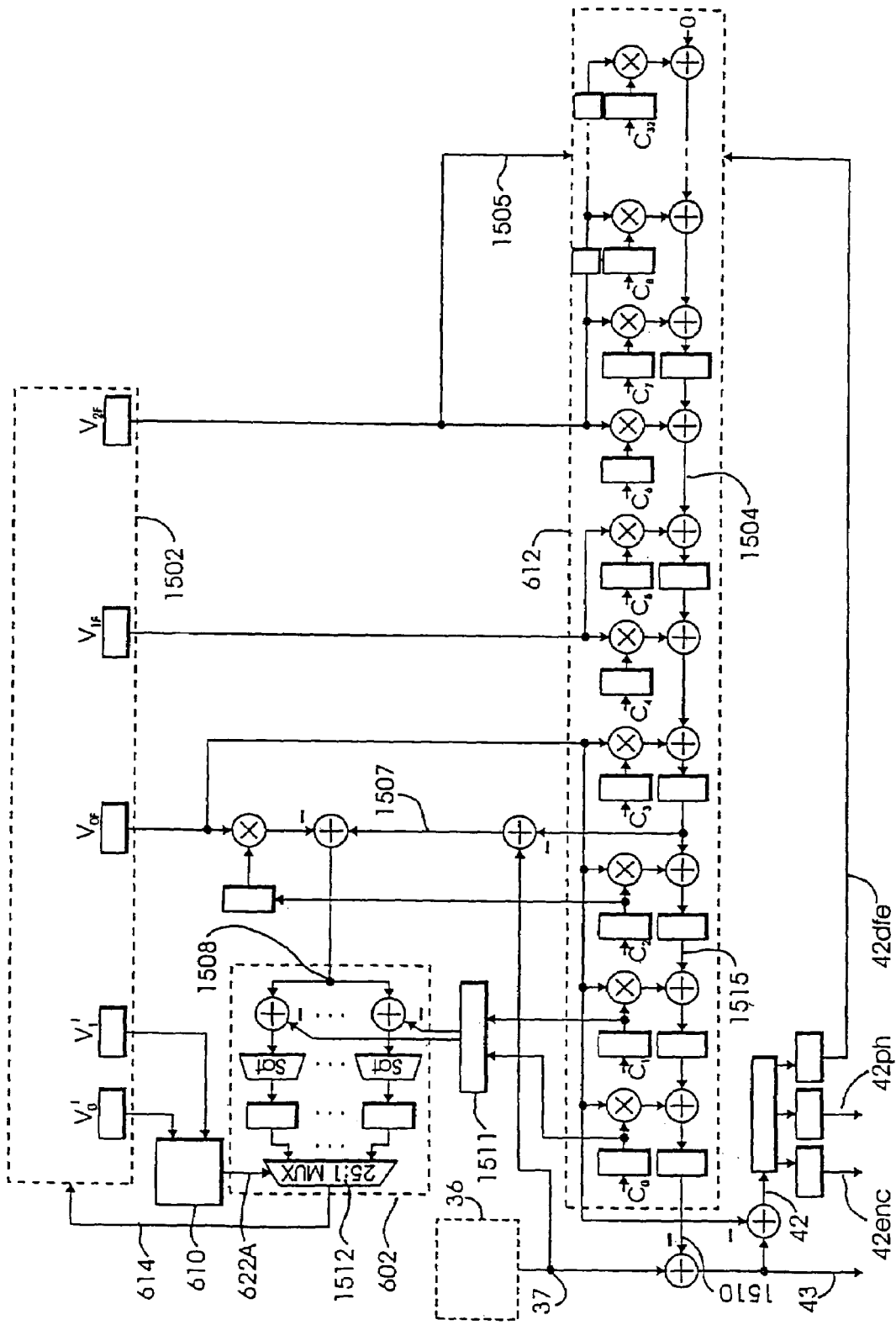
FIG. 15 is a detailed diagram illustrating the processing of the outputs $V_0^{(i)}$, $V_1^{(i)}$, with i=0, ..., 7, and $V_{0F}$, $V_{1F}$, $V_{2F}$ of the path memory module of FIG. 3.

FIG. 15 is a block level diagram of the ISI compensation portion of the decoder, including construction and operational details of the DFE and MDFE circuitry (612 and 602 of FIG. 3, respectively). The ISI compensation embodiment depicted in FIG. 15 is adapted to receive signal samples from the deskew memory (36 of FIG. 2) and provide ISI compensated signal samples to the Viterbi (slicer) for decoding. The embodiment illustrated in FIG. 15 includes the Viterbi block 1502 (which includes the Viterbi decoder 604, the path metrics module 606 and the path memory module 608), the select logic 610, the MDFE 602 and the DFE 612.

The MDFE 602 computes an independent feedback signal for each of the paths stored in the path memory module 608. These feedback signals represent different hypotheses for the intersymbol interference component present in the input 37 (FIGS. 2 and 6) to the trellis decoder 38. The different hypotheses for the intersymbol interference component correspond to the different hypotheses about the previous symbols which are represented by the different paths of the Viterbi decoder.

The Viterbi algorithm tests these hypotheses and identifies the most likely one. It is an essential aspect of the Viterbi algorithm to postpone this identifying decision until there is enough information to minimize the probability of error in the decision. In the meantime, all the possibilities are kept open. Ideally, the MDFE block would use the entire path memory to compute the different feedback signals using the entire length of the path memory. In practice, this is not possible because this would lead to unacceptable complexity. By "unacceptable," it is meant requiring a very large number of components and an extremely complex interconnection pattern.

Therefore, in the exemplary embodiment, the part of the feedback signal computation that is performed on a per-path basis is limited to the two most recent symbols stored in register set 0 and register set 1 of all paths in the path memory module 608, namely $V_0^i$ and $V_1^i$ with i=0, . . . , 7, indicating the path. For symbols older than two periods, a hard decision is forced, and only one replica of a "tail" component of the intersymbol interference is computed. This results in some marginal loss of performance, but is more than adequately compensated for by a simpler system implementation.

The DFE 612 computes this "tail" component of the intersymbol interference, based on the tentative decisions $V_{0F}$, $V_{1F}$, and $V_{2F}$. The reason for using three different tentative decisions is that the reliability of the decisions increases with the increasing depth into the path memory. For example, $V_{1F}$ is a more reliable version of $V_{0F}$ delayed by one symbol period. In the absence of errors, $V_{1F}$ would be always equal to a delayed version of $V_{0F}$. In the presence of errors, $V_{1F}$ is different from $V_{0F}$, and the probability of $V_{1F}$ being in error is lower than the probability of $V_{0F}$ being in error. Similarly, $V_{2F}$ is a more reliable delayed version of $V_{1F}$.

Referring to FIG. 15, the DFE 612 is a filter having 33 coefficients $c_0$ through $c_{32}$ corresponding to 33 taps and a delay line 1504. The delay line is constructed of sequentially disposed summing junctions and delay elements, such as registers, as is well understood in the art of filter design. In the illustrated embodiment, the coefficients of the DFE 612 are updated once every four symbol periods, i.e., 32 nanoseconds, in well known fashion, using the well known Least Mean Squares algorithm, based on a decision input 1505 from the Viterbi block and an error input 42 dfe.

The symbols $V_{0F}$, $V_{1F}$, and $V_{2F}$ are "jammed," meaning inputted at various locations, into the delay line 1504 of the DFE 612. Based on these symbols, the DFE 612 produces an intersymbol interference (ISI) replica portion associated with all previous symbols except the two most recent (since it was derived without using the first two taps of the DFE 612). The ISI replica portion represents a single-state ISI compensation signal. The ISI replica portion is subtracted form the output 37 of the deskew memory block 36 to produce the signal 1508 which is then fed to the MDFE block. The signal 1508 is denoted as the "tail" component in FIG. 3. In the illustrated embodiment, the DFE 612 has 33 taps, numbered from 0 through 32, and the tail component 1508 is associated with taps 2 through 32. As shown in FIG. 15, due to a circuit layout reason, the tail component 1508 is obtained in two steps. First, the ISI replica associated with taps 3 through 32 is subtracted from the deskew memory output 37 to produce an intermediate signal 1507. Then, the ISI replica associated with the tap 2 is subtracted from the intermediate signal 1507 to produce the tail component 1508.

The DFE 612 also computes the ISI replica 1510 associated with the two most recent symbols, based on tentative decisions $V_{0F}$, $V_{1F}$, and $V_{2F}$. This ISI replica 1510 is subtracted from a delayed version of the output 37 of the deskew memory block 36 to provide a soft decision 43. The tentative decision $V_{0F}$ is subtracted from the soft decision 43 in order to provide an error signal 42. Error signal 42 is further processed into several additional representations, identified as 42 enc, 42 ph and 42 dfe. The error 42 enc is provided to the echo cancellers and NEXT cancellers of the constituent transceivers. The error 42 ph is provided to the FFEs 26 (FIG. 2) of the four constituent transceivers and the timing recovery block 222. The error 42 dfe is directed to the DFE 612, where it is used for the adaptive updating of the coefficients of the DFE together with the last tentative decision $V_{2F}$ from the Viterbi block 1502. The tentative decision 44 shown in FIG. 3 is a delayed version of $V_{0F}$. The soft decision 43 is outputted to a test interface for display purposes.

The DFE 612 provides the tail component 1508 and the values of the two "initial" coefficients $C_0$ and $C_1$ to the MDFE 602. The MDFE 602 computes eight different replicas of the ISI associated with the first two coefficients of the DFE 612. Each of these ISI replicas corresponds to a different path in the path memory module 608. This computation is part of the so-called "critical path" of the trellis decoder 38, in other words, the sequence of computations that must be completed in a single symbol period. At the speed of operation of the Gigabit Ethernet transceivers, the symbol period is 8 nanoseconds. All the challenging computations for 4D slicing, branch metrics, path extensions, selection of best path, and update of path memory must be completed within one symbol period. In addition, before these computations can even begin, the MDFE 602 must have completed the computation of the eight 4D Viterbi inputs 614 (FIG. 3) which involves computing the ISI replicas and subtracting them from the output 37 of the de-skew memory block 36 (FIG. 2). This bottleneck in the computations is very difficult to resolve. The system of the present invention allows the computations to be carried out smoothly in the allocated time.

Referring to FIG. 15, the MDFE 602 provides ISI compensation to received signal samples, provided by the deskew memory (37 of FIG. 2) before providing them, in turn, to the input of the Viterbi block 1502. ISI compensation is preformed by subtracting a multiplicity of derived ISI replica components from a received signal sample so as to develop a multiplicity of signals that, together, represents various expressions of ISI compensation that might be associated with any arbitrary symbol. One of the ISI compensated arbitrary symbolic representations is then chosen, based on two tentative decisions made by the Viterbi block, as the input signal sample to the Viterbi.

Since the symbols under consideration belong to a PAM-5 alphabet, they can be expressed in one of only 5 possible values (−2, −1, 0, +1, +2). Representations of these five values are stored in a convolution engine 1511, where they are convolved with the values of the first two filter coefficients $C_0$ and $C_1$ of the DFE 612. Because there are two coefficient values and five level representations, the convolution engine 1511 necessarily gives a twenty five value result that might be expressed as $(a_i C_0 + b_j C_1)$, with $C_0$ and $C_1$ representing the coefficients, and with $a_i$ and $b_j$ representing the level expressions (with i=1,2,3,4,5 and j=1,2,3,4,5 ranging independently).

These twenty five values are negatively combined with the tail component 1508 received from the DFE 612. The tail component 1508 is a signal sample from which a partial ISI component associated with taps 2 through 32 of the DFE 612 has been subtracted. In effect, the MDFE 602 is operating on a partially ISI compensated (pre-compensated) signal sample. Each of the twenty five pre-computed values is subtracted from the partially compensated signal sample in a respective one of a stack of twenty five summing junctions. The MDFE then saturates the twenty five results to make them fit in a predetermined range. This saturation process is done to reduce the number of bits of each of the 1D components of the Viterbi input 614 in order to facilitate lookup table computations of branch metrics. The MDFE 602 then stores the resultant ISI compensated signal samples in a stack of twenty five registers, which makes the samples available to a 25:1 MUX for input sample selection. One of the contents of the twenty five registers will correspond to a component of a 4D Viterbi input with the ISI correctly cancelled, provided that there was no decision error (meaning the hard decision regarding the best path forced upon taps 2 through 32 of the DFE 612) in the computation of the tail component. In the absence of noise, this particular value will coincide with one of the ideal 5-level symbol values (i.e., −2, −1, 0, 1, 2). In practice, there will always be noise, so this value will be in general different than any of the ideal symbol values.

This ISI compensation scheme can be expanded to accommodate any number of symbolic levels. If signal processing were performed on PAM-7 signals, for example, the convolution engine 1511 would output forty nine values, i.e., $a_i$ and $b_j$ would range from 1 to 7. Error rate could be reduced, i.e., performance could be improved, at the expense of greater system complexity, by increasing the number of DFE coefficients inputted to the convolution engine 1511. The reason for this improvement is that the forced hard decision (regarding the best path forced upon taps 2 through 32 of the DFE 612) that goes into the "tail" computation is delayed. If $C_2$ were added to the process, and the symbols are again expressed in a PAM-5 alphabet, the convolution engine 1511 would output one hundred twenty five (125) values. Error rate is reduced by decreasing the tail component computation, but at the expense of now requiring 125 summing junctions and registers, and a 125:1 MUX.

It is important to note that, as inputs to the DFE 612, the tentative decisions $V_{0F}$, $V_{1F}$, $V_{2F}$ are time sequences, and not just instantaneous isolated symbols. If there is no error in the tentative decision sequence $V_{0F}$, then the time sequence $V_{2F}$ will be the same as the time sequence $V_{1F}$ delayed by one time unit, and the same as the time sequence $V_{0F}$ delayed by two time units. However, due to occasional decision error in the time sequence $V_{0F}$, which may have been corrected by the more reliable time sequence $V_{1F}$ or $V_{2F}$, time sequences $V_{1F}$ and $V_{2F}$ may not exactly correspond to time-shifted versions of time sequence $V_{0F}$. For this reason, instead of using just one sequence $V_{0F}$, all three sequences $V_{0F}$, $V_{1F}$ and $V_{2F}$ are used as inputs to the DFE 612. Although this implementation is essentially equivalent to convolving $V_{0F}$ with all the DFEs coefficients when there is no decision error in $V_{0F}$, it has the added advantage of reducing the probability of introducing a decision error into the DFE 612. It is noted that other tentative decision sequences along the depth of the path memory 608 may be used instead of the sequences $V_{0F}$, $V_{1F}$ and $V_{2F}$.

Tentative decisions, developed by the Viterbi, are taken from selected locations in the path memory 608 and "jammed" into the DFE 612 at various locations along its computational path. In the illustrated embodiment (FIG. 15), the tentative decision sequence $V_{0F}$ is convolved with the DFEs coefficients $C_0$ through $C_3$, the sequence $V_{1F}$ is convolved with the DFEs coefficients $C_4$ and $C_5$, and the sequence $V_{2F}$ is convolved with the DFEs coefficients $C_6$ through $C_{32}$. It is noted that, since the partial ISI component that is subtracted from the deskew memory output 37 to form the signal 1508 is essentially taken (in two steps as described above) from tap 2 of the DFE 612, this partial ISI component is associated with the DFEs coefficients $C_2$ through $C_{32}$. It is also noted that, in another embodiment, instead of using the two-step computation, this partial ISI component can be directly taken from the DFE 612 at point 1515 and subtracted from signal 37 to form signal 1508.

It is noted that the sequences $V_{0F}$, $V_{1F}$, $V_{2F}$ correspond to a hard decision regarding the choice of the best path among the eight paths (path i is the path ending at state i). Thus, the partial ISI component associated with the DFEs coefficients $C_2$ through $C_{32}$ is the result of forcing a hard decision on the group of higher ordered coefficients of the DFE 612. The underlying reason for computing only one partial ISI signal instead of eight complete ISI signals for the eight states (as done conventionally) is to save in computational complexity and to avoid timing problems. In effect, the combination of the DFE and the MDFE of the present invention can be thought of as performing the functions of a group of eight different conventional DFEs having the same tap coefficients except for the first two tap coefficients.

For each state, there remains to determine which path to use for the remaining two coefficients in a very short interval of time (about 16 nanoseconds). This is done by the use of the convolution engine 1511 and the MDFE 602. It is noted that the convolution engine 1511 can be implemented as an integral part of the MDFE 602. It is also noted that, for each constituent transceiver, i.e., for each 1D component of the Viterbi input 614 (the Viterbi input 614 is practically eight 4D Viterbi inputs), there is only one convolution engine 1511 for all the eight states but there are eight replicas of the select logic 610 and eight replicas of the MUX 1512.

The convolution engine 1511 computes all the possible values for the ISI associated with the coefficients $C_0$ and $C_1$. There are only twenty five possible values, since this ISI is a convolution of these two coefficients with a decision sequence of length 2, and each decision in the sequence can only have five values (−2, −1, 0, +1, +2). Only one of these twenty five values is a correct value for this ISI. These twenty five hypotheses of ISI are then provided to the MDFE 602.

In the MDFE 602, the twenty five possible values of ISI are subtracted from the partial ISI compensated signal 1508 using a set of adders connected in parallel The resulting signals are then saturated to fit in a predetermined range, using a set of saturators. The saturated results are then stored in a set of twenty five registers. Provided that there was no decision error regarding the best path (among the eight paths) forced upon taps 2 through 32 of the DFE 612, one of the twenty five registers would contain one 1D component of the Viterbi input 614 with the ISI correctly cancelled for one of the eight states.

For each of the eight states, the generation of the Viterbi input is limited to selecting the correct value out of these 25 possible values. This is done, for each of the eight states, using a 25-to-1 multiplexer 1512 whose select input is the output of the select logic 610. The select logic 610 receives $V_0^{(i)}$ and $V_1^{(i)}$ (i=0, . . . , 7) for a particular state i from the path memory module 608 of the Viterbi block 1502. The select logic 610 uses a pre-computed lookup table to determine the value of the select signal 622A based on the values of $V_0^{(i)}$ and $V_1^{(i)}$ for the particular state i. The select signal 622A is one component of the 8-component select signal 622 shown in FIG. 3. Based on the select signal 622A, the 25-to-1 multiplexer 1512 selects one of the contents of the twenty five registers as a 1D component of the Viterbi input 614 for the corresponding state i.

FIG. 15 only shows the select logic and the 25-to-1 multiplexer for one state and for one constituent transceiver. There are identical select logics and 25-to-1 multiplexers for the eight states and for each constituent transceiver. In other words, the computation of the 25 values is done only once for all the eight states, but the 25:1 MUX and the select logic are replicated eight times, one for each state. The input 614 to the Viterbi decoder 604 is, as a practical matter, eight 4D Viterbi inputs. Therefore, the output of the MDFE 602 is an 8-state representation signal More generally, in a system utilizing N states, the output of the MDFE 602 is an N-state representation signal. Because the MDFE 602 produces an N-state representation signal based on a single-state ISI compensation signal, the MDFE can be referred to as a state multiplication circuit.

In the case of the DFE, however, only a single DFE is contemplated for practice of the invention. In contrast to alternative systems where eight DFEs are required, one for each of the eight states imposed by the trellis encoding scheme, a single DFE is sufficient since the decision as to which path among the eight is the probable best was made in the Viterbi block and forced to the DFE as a tentative decision. State status is maintained at the Viterbi decoder input by controlling the MDFE output with the state specific signals developed by the 8 select logics (610 of FIG. 3) in response to the eight state specific signals $V_0^i$ and $V_1^i$, i=0, . . . , 7, from the path memory module (608 of FIG. 3). Although identified as a singular DFE, it will be understood that the 4D architectural requirements of the system means that the DFE is also 4D. Each of the four dimensions (twisted pairs) will exhibit their own independent contributions to ISI and these should be dealt with accordingly. Thus, the DFE is singular, with respect to state architecture, when its 4D nature is taken into account.

In the architecture of the system of the present invention, the Viterbi input computation becomes a very small part of the critical path since the multiplexers have extremely low delay due largely to the placement of the 25 registers between the 25:1 multiplexer and the saturators. If a register is placed at the input to the MDFE 602, then the 25 registers would not be needed. However, this would cause the Viterbi input computation to be a larger part of the critical path due to the delays caused by the adders and saturators. Thus, by using 25 registers at a location proximate to the MDFE output instead of using one register located at the input of the MDFE, the critical path of the MDFE and the Viterbi decoder is broken up into 2 approximately balanced components. This architecture makes it possible to meet the very demanding timing requirements of the Gigabit Ethernet transceiver.

Another advantageous factor in achieving high-speed operation for the trellis decoder 38 is the use of heavily truncated representations for the metrics of the Viterbi decoder. Although this may result in a mathematically non-zero decrease in theoretical performance, the resulting vestigial precision is nevertheless quite sufficient to support healthy error margins. Moreover, the use of heavily truncated representations for the metrics of the Viterbi decoder greatly assists in achieving the requisite high operational speeds in a gigabit environment. In addition, the reduced precision facilitates the use of random logic or simple lookup tables to compute the squared errors, i.e., the distance metrics, consequently reducing the use of valuable silicon real estate for merely ancillary circuitry.

FIG. 16 shows the word lengths used in one embodiment of the Viterbi decoder of this invention. In FIG. 16, the word lengths are denoted by S or U followed by two numbers separated by a period. The first number indicates the total number of bits in the word length. The second number indicates the number of bits after the decimal point. The letter S denotes a signed number, while the letter U denotes an unsigned number. For example, each 1D component of the 4D Viterbi input is a signed 5-bit number having 3 bits after the decimal point.

FIG. 17 shows an exemplary lookup table that can be used to compute the squared 1-dimensional errors. The logic function described by this table can be implemented using read-only-memory devices, random logic circuitry or PLA circuitry. Logic design techniques well known to a person of ordinary skill in the art can be used to implement the logic function described by the table of FIG. 17 in random logic.

FIGS. 18A and 18B provide a more complete table describing the computation of the decisions and squared errors for both the X and Y subsets directly from one component of the 4D Viterbi input to the 1D slicers (FIG. 7). This table completely specifies the operation of the slicers of FIG. 7.

An exemplary demodulator including a high speed decoder has been described and includes various components that facilitate robust and accurate acquisition and decoding of PAM-5 constellation signals at speeds consistent with gigabit operation. Symbol decoding, including ISI compensation, is accurately performed in a symbol period of about 8 ns, by a transceiver demodulator circuit constructed in a manner so as to first, bifurcate the ISI compensation function between an FFE, operating to compensate partial response pulse shaping filter (remote transmitter) induced ISI, and a decoder operating to compensate ISI perturbations induced by transmission channel characteristics, and second, by bifurcating critical path computations into substantially balanced first and second portions, the first portion including computations performed in a DFE and MDFE element and a second portion including computations performed in a Viterbi decoder.

The DFE element is further advantageous in that it is implemented as only a single conceptual DFE (taking into account its 4D nature) rather than an eight element stack, each of which defines a multi-dimensional input to an eight-state Viterbi. The DFE is "stuffed," at particular chosen locations, by the first several stages of a sequential, multi-stage tentative decision path memory module, so as to develop a set of "tail" coefficient values in the DFE which, taken together, represent the algebraic sum of a truncated set of DFE coefficients $C_2$ to $C_{32}$. A received symbol, represented by a five level constellation, is convolved with the remaining two DFE coefficients, $C_0$ and $C_1$, which are taken to represent the transmission channel induced ISI.

As deskewed signals enter the decoder, the previous symbol, convolved with the DFE coefficients $C_3$ to $C_{32}$, is first subtracted therefrom. Then the previous symbol convolved with $C_2$ is subtracted and the resultant (intermediate) symbol is directed to the MDFE. This resultant signal might be described as the receive symbol with partial ISI introduced by previous symbols subtracted. In the MDFE, all possible convolutions of the primary coefficients, $C_0$ and $C_1$, with the possible symbol values, is subtracted from the intermediate symbol to provide a receive symbol without perturbations induced by ISI.

It will be evident to one having skill in the art that although the transceiver has been described in the context of a trellis encoded, PAM-5 signal representation, communicated over a multi-pair transmission channel, the invention is not limited to any particular communication technique. Specifically, the decoder architecture and signal processing methodology in accord with the invention is suitable for use with any form of communication in which the symbolic content of the communication is represented by multi-level signals. The invention, indeed, becomes particularly appropriate as the number of signal levels increases.

Neither is the invention limited to signals encoded in accordance with, a 4D, eight-state, trellis methodology. Trellis encoding forces the system to be constructed so as to accommodate the eight states inherent in the trellis methodology. Other coding methodologies and architectures are expressly contemplated by the invention and can be implemented by making the proper modifications to an alternative coding architectures "state width," as will be apparent to a skilled integrated circuit transceiver designer. Likewise, the "dimensional depth," 1D, 2D, 4D . . . for example, may be suitably increased, or decreased to accommodate different forms of transmission channel implementations. As in the case of increasing signal level representations, the systems and methods of the invention are particularly suitable for channels with increased "depth," such as six, eight, or even higher numbers, of twisted pair cabling, single conductor cabling, parallel wireless channels, and the like.

In the context of an exemplary integrated circuit-type bidirectional communication system, a further aspect of the invention might be characterized as a system and method for adaptively and dynamically regulating the power consumption of an integrated circuit communication system as a function of particular, user defined signal quality metrics. Signal quality metrics might include a signals bit error rate (BER), a signal-to-noise ratio (SNR) specification, noise margin figure, dynamic range, or the like. Indeed, signal quality is a generalized term used to describe a signals functional fidelity.

As will be understood by one having skill in the art, signal quality is a measurable operational characteristic of various component portions of modem communication systems. Various forms of signal quality metrics are used to define the features and functionality of signal processing portions of integrated circuit communication devices, particularly coder/decoder circuitry, equalizers and filters, each of which require large amounts of silicon real estate for effective implementation, and a consequently large degree of power consumption during operation.

Figure 28:
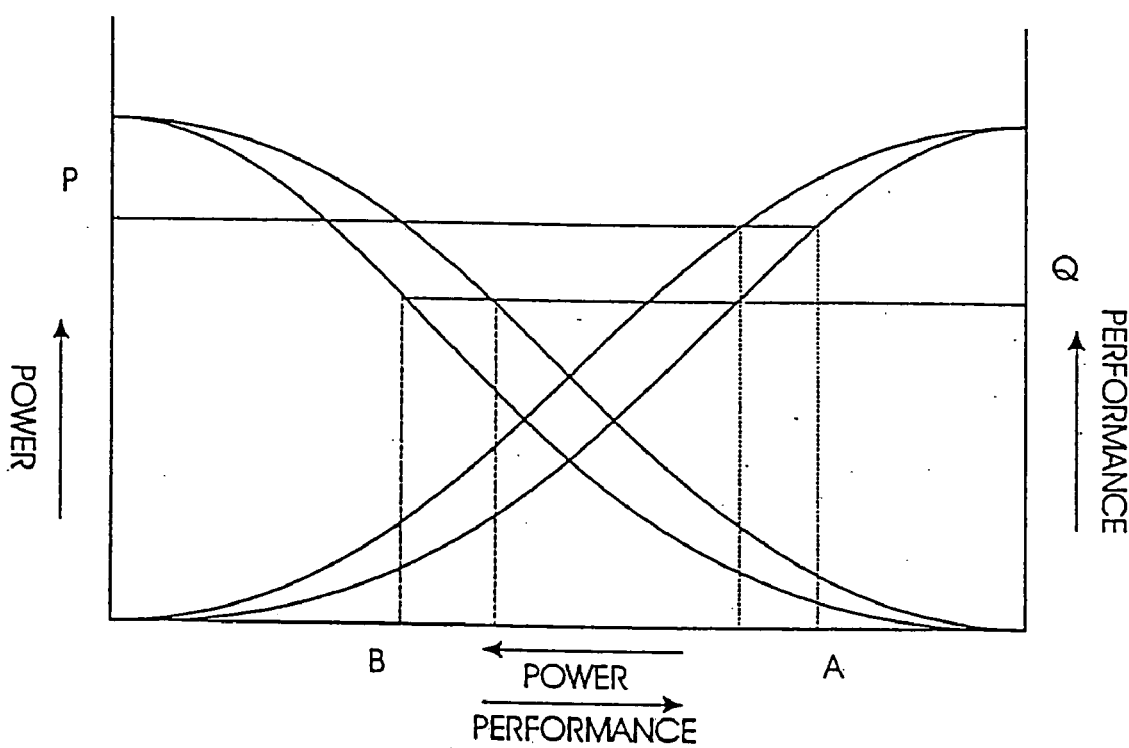
FIG. 28 is a simplified matrix diagram illustrating the relationship between power consumption and a performance metric.

Turning now to FIG. 28, the invention might be described briefly as a methodology for balancing the conflicting circuit performance requirements represented by signal quality and power consumption and might be illustrated as the implementation of a decision matrix having power consumption as one of the dimensions and a chosen signal quality metric as another. From FIG. 28, it will be understood that integrated circuit power consumption is directly related to processed signal quality. This is particularly true in the case of integrated circuits incorporating high order digital filter elements, having a large number of taps, all of which consume power when in operation.

However, it has been generally accepted integrated circuit design practice to construct an integrated circuit communication device to accommodate the most stringent digital processing that might be required by a device in an actual application. In the case of an Ethernet transceiver, for example, provision must be made for processing signals transmitted over a wide variety of transmission channels exhibiting widely disparate transmission channel characteristics, ranging from extremely lossy, highly populated, long wiring run channels, to very short (<2 meters) point-to-point installations. In either case, all of the signal processing elements of conventional transceiver circuitry are operative to process a signal, whether needed or not, such that power consumption is relatively constant and large.

In FIG. 28, the evaluation matrix judges an output signal quality metric against a threshold standard, and where a measured quality metric is greater than the threshold, allows the power consumption of the device to be reduced by turning off various functional processing blocks until the output signal quality is reduced to the threshold value. This approach has particular utility in the case of digital filter elements, coder/decoder circuitry and equalizers, all of which include multiple elements that are required for processing signals propagated through harsh channel environments, but to various degrees unnecessary when signals are propagated through a more benign channel.

The evaluation matrix, as exemplified in FIG. 28, might be initialized by a user input requirement, such as the degree to which power consumption is an issue. A particular power consumption value might be set as an operational parameter (indicated as "P" in FIG. 28), and portions of the device adaptively turned off until the desired power value is reached. This will necessarily affect the signal quality of a signal processed by such truncated circuitry, but, in accordance with the invention, signal quality is able to be locally maximized to a pre-determined power consumption metric, such that device performance is not unduly sacrificed.

Various portions of the device might be powered-down in predetermined sequential combinations with each combination resulting in a particular performance metric. Signal performance is evaluated at each sequential step. Thus, any one power consumption specification, i.e., "P," will give a range of performance values (represented as "A" in FIG. 28). The best signal performance result is necessarily the chosen metric for deciding which of the multiplicity of power-down configurations is implemented. Consequently, where power is the primary concern, signal quality defaults to the best signal performance achievable at the specified power level.

Where signal quality (performance) is the primary concern, the system is allowed to function normally, with all processing blocks operative. In this circumstance, power consumption will be expected to be nominal.

Where signal quality is desirable, but some accommodation must be made to power consumption, a user may set a signal quality metric as a threshold standard (indicated as "Q" in FIG. 28), and allow the system to adaptively and dynamically run through a multiplicity of power-down configurations, resulting in a range of power consumption values (indicated as "B" in FIG. 28) in order to determine which of the configurations gives the lowest power consumption while retaining the desired signal quality metric. This methodology is particularly effective in high order filters with multiple taps, and in decoder blocks that might implement a trellis decoder in a fully functional form, but which might be adequate when truncated to a simple slicer in certain situations.

No matter how implemented, however, all that is required for practice of the invention is that power consumption be established as one basis of an evaluation matrix, and that some signal quality or device performance characteristic, having a relationship to device power consumption, be established as another. As one of the bases are defined, as by a user input, for example, the other basis is locally maximized (in the case of performance) or minimized (in the case of power) by an adaptive and dynamic procedure that chooses the most pertinent portions of an integrated circuit to disable. The procedure is adaptive in the sense that it is not fixed in time. As channel and signal characteristics can be expected to vary with time, a changing signal quality metric will force a re-evaluation of the matrix. A further reduction of power consumption, or a further enhancement of signal quality may be obtained.

In order to appreciate the advantages of the present invention, it will be beneficial to describe the invention in the context of an exemplary bidirectional communication device, such as an Ethernet transceiver. The particular exemplary implementation chosen is depicted in FIG. 1, which is a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires.

The communication system illustrated in FIG. 1 is represented as a point-to-point system, in order to simplify the explanation, and includes two main transceiver blocks 102 and 104, coupled together via four twisted-pair cables 112a, b, c and d. Each of the wire pairs 112a, b, c, d is coupled to each of the transceiver blocks 102, 104 through a respective one of four line interface circuits 106. Each of the wire pairs 112a, b, c, d facilitates communication of information between corresponding pairs of four pairs of transmitter/receiver circuits (constituent transceivers) 108. Each of the constituent transceivers 108 is coupled between a respective line interface circuit 106 and a Physical Coding Sublayer (PCS) block 110. At each of the transceiver blocks 102 and 104, the four constituent transceivers 108 are capable of operating simultaneously at 250 megabits of information data per second (Mb/s) each, and are coupled to the corresponding remote constituent transceivers through respective line interface circuits to facilitate full-duplex bidirectional operation. Thus, 1 Gb/s communication throughput of each of the transceiver blocks 102 and 104 is achieved by using four 250 Mb/s (125 Mbaud at 2 information data bits per symbol) constituent transceivers 108 for each of the transceiver blocks 102, 104 and four pairs of twisted copper cables to connect the two transceiver blocks 102, 104 together.

The exemplary communication system of FIG. 1 has a superficial resemblance to a 100BASE-T4 system, but is configured to operate at ten times the bit rate. As such, it should be understood that certain system performance characteristics, such as sampling rates and the like, will be consequently higher and cause a greater degree of power consumption. Also, at gigabit data rates over potentially noisy channels, a proportionately greater degree of signal processing is required in many instances to insure an adequate degree of signal fidelity and quality.

FIG. 2 is a simplified block diagram of the functional architecture and internal construction of an exemplary transceiver block, indicated generally at 200, such as transceiver 102 of FIG. 1. Since the illustrative transceiver application relates to gigabit Ethernet transmission, the transceiver will be referred to as the "gigabit transceiver." For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks and signal lines in the exemplary embodiment of FIG. 2 perform four-dimensional operations and carry four-dimensional (4-D) signals, respectively. By 4-D, it is meant that the data from the four constituent transceivers are used simultaneously. In order to clarify signal relationships in FIG. 2, thin lines correspond to 1-dimensional functions or signals (i.e., relating to only a single constituent transceiver), and thick lines correspond to 4-D functions or signals (relating to all four constituent transceivers).

Referring to FIG. 2, the gigabit transceiver 200 includes a Gigabit Medium Independent Interface (GMII) block 202 subdivided into a receive GMII circuit 202R and a transmit GMII circuit 202T. The transceiver also includes a Physical Coding Sublayer (PCS) block 204, subdivided into a receive PCS circuit 204R and a transmit PCS circuit 204T, a pulse shaping filter 206, a digital-to analog (D/A) converter block 208, and a line interface block 210, all generally encompassing the transmitter portion of the transceiver.

The receiver portion generally includes a highpass filter 212, a programmable gain amplifier (PGA) 214, an analog-to-digital (A/D) converter 216, an automatic gain control (AGC) block 220, a timing recovery block 222, a pair-swap multiplexer block 224, a demodulator 226, an offset canceller 228, a near-end crosstalk (NEXT) canceller block 230 having three constituent NEXT cancellers and an echo canceller 232.

The gigabit transceiver 200 also includes an A/D first-in-first-out buffer (FIFO) 218 to facilitate proper transfer of data from the analog clock region to the receive clock region, and a loopback FIFO block (LPBK) 234 to facilitate proper transfer of data from the transmit clock region to the receive clock region. The gigabit transceiver 200 can optionally include an additional adaptive filter to cancel far-end crosstalk noise (FEXT canceller).

In operational terms, on the transmit path, the transmit section 202T of the GMII block receives data from the Media Access Control (MAC) module in byte-wide format at the rate of 125 MHz and passes them to the transmit section 204T of the PCS block via the FIFO 201. The FIFO 201 ensures proper data transfer from the MAC layer to the Physical Coding (PHY) layer, since the transmit clock of the PHY layer is not necessarily synchronized with the clock of the MAC layer. In one embodiment, this small FIFO 201 has from about three to about five memory cells to accommodate the file elasticity requirement which is a function of frame size and frequency offset.

The PCS transmit section 204T performs certain scrambling operations and, in particular, is responsible for encoding digital data into the requisite codeword representations appropriate for transmission. In, the illustrated embodiment of FIG. 2, the transmit PCS section 204T incorporates a coding engine and signal mapper that implements a trellis coding architecture, such as required by the IEEE 802.3ab specification for gigabit transmission.

In accordance with this encoding architecture, the PCS transmit section 204T generates four 1-D symbols, one for each of the four constituent transceivers. The 1-D symbol generated for the constituent transceiver depicted in FIG. 2 is filtered by the pulse shaping filter 206. This filtering assists in reducing the radiated emission of the output of the transceiver such that it falls within the parameters required by the Federal Communications Commission. The pulse shaping filter 206 is implemented so as to define a transfer function of $0.75 + 0.25\, z^{-1}$. This particular implementation is chosen so that the power spectrum of the output of the transceiver falls below the power spectrum of a 100Base-Tx signal. The 100Base-Tx is a widely used and accepted Fast Ethernet standard for 100 Mb/s operation on two pairs of Category-5 twisted pair cables. The output of the pulse shaping filter 206 is converted to an analog signal by the D/A converter 208 operating at 125 MHz. The analog signal passes through the line interface block 210, and is placed on the corresponding twisted pair cable.

On the receive path, the line interface block 210 receives an analog signal from the twisted pair cable. The received analog signal is preconditioned by the highpass filter 212 and the PGA 214 before being converted to a digital signal by the A/D converter 216 operating at a sampling rate of 125 MHz. The timing of the A/D converter 216 is controlled by the output of the timing recovery block 222. The resulting digital signal is properly transferred from the analog clock region to the receive clock region by the A/D FIFO 218. The output of the A/D FIFO 218 is also used by the AGC 220 to control the operation of the PGA 214.

The output of the A/D FIFO 218, along with the outputs from the A/D FIFOs of the other three constituent transceivers are inputted to the pair-swap multiplexer block 224. The pair-swap multiplexer block 224 uses the 4-D pair-swap control signal from the receive section 204R of PCS block to sort out the four input signals and send the correct signals to the respective feedforward equalizers 26 of the demodulator 226. This pair-swapping control is needed for the following reason. The trellis coding methodology used for the gigabit transceivers (102 and 104 of FIG. 1) is based on the fact that a signal on each twisted pair of wire corresponds to a respective 1-D constellation, and that the signals transmitted over four twisted pairs collectively form a 4-D constellation. Thus, for the decoding to work, each of the four twisted pairs must be uniquely identified with one of the four dimensions. Any undetected swapping of the four pairs would result in erroneous decoding. In an alternate embodiment of the gigabit transceiver, the pair-swapping control is performed by the demodulator 226, instead of the combination of the PCS receive section 204R and the pair-swap multiplexer block 224.

The demodulator 226 includes a feed-forward equalizer (FFE) 26 for each constituent transceiver, coupled to a deskew memory circuit 36 and a decoder circuit 38, implemented in the illustrated embodiment as a trellis decoder. The deskew memory circuit 36 and the trellis decoder 38 are common to all four constituent transceivers. The FFE 26 receives the received signal intended for it from the pair-swap multiplexer block 224. The FFE 26 is suitably implemented to include a precursor filter 28, a programmable inverse partial response (IPR) filter 30, a summing device 32, and an adaptive gain stage 34. The FFE 26 is a least-mean-squares (LMS) type adaptive filter which is configured to perform channel equalization as will be described in greater detail below.

The precursor filter 28 generates a precursor to the input signal 2. This precursor is used for timing recovery. The transfer function of the precursor filter 28 might be represented as $-\gamma + z^{-1}$, with $\gamma$ equal to $1/16$ for short cables (less than 80 meters) and $1/8$ for long cables (more than 80 m). The determination of the length of a cable is based on the gain of the coarse PGA 14 of the programmable gain block 214.

The programmable IPR filter 30 compensates the ISI (intersymbol interference) introduced by the partial response pulse shaping in the transmitter section of a remote transceiver which transmitted the analog equivalent of the digital signal 2. The transfer function of the IPR filter 30 may be expressed as $1/(1 + K z_{31\_1})$. In the present example, K has an exemplary value of 0.484375 during startup, and is slowly ramped down to zero after convergence of the decision feedback equalizer included inside the trellis decoder 38. The value of K may also be any positive value strictly less than 1.

The summing device 32 receives the output of the IPR filter 30 and subtracts therefrom adaptively derived cancellation signals received from the adaptive filter block, namely signals developed by the offset canceller 228, the NEXT cancellers 230, and the echo canceller 232. The offset canceller 228 is an adaptive filter which generates an estimate of signal offset introduced by component circuitry of the transceivers analog front end, particularly offsets introduced by the PGA 214 and the A/D converter 216.

The three NEXT cancellers 230 may also be described as adaptive filters and are used, in the illustrated embodiment, for modeling the NEXT impairments in the received signal caused by interference generated by symbols sent by the three local transmitters of the other three constituent transceivers. These impairments are recognized as being caused by a crosstalk mechanism between neighboring pairs of cables, thus the term near-end crosstalk, or NEXT. Since each receiver has access to the data transmitted by the other three local transmitters, it is possible to approximately replicate the NEXT impairments through filtering. Referring to FIG. 2, the three NEXT cancellers 230 filter the signals sent by the PCS block to the other three local transmitters and produce three signals replicating the respective NEXT impairments. By subtracting these three signals from the output of the IPR filter 30, the NEXT impairments are approximately cancelled.

Due to the bi-directional nature of the channel, each local transmitter causes an echo impairment on the received signal of the local receiver with which it is paired to form a constituent transceiver. In order to remove this impairment, an echo canceller 232 is provided, which may also be characterized as an adaptive filter, and is used, in the illustrated embodiment, for modeling the signal impairment due to echo. The echo canceller 232 filters the signal sent by the PCS block to the local transmitter associated with the receiver, and produces an approximate replica of the echo impairment. By subtracting this replica signal from the output of the IPR filter 30, the echo impairment is approximately cancelled.

The adaptive gain stage 34 receives the processed signal from the summing circuit 32 and fine tunes the signal path gain using a zero-forcing LMS algorithm. Since this adaptive gain stage 34 trains on the basis of error signals generated by the adaptive filters 228, 230 and 232, it provides a more accurate signal gain than the one provided by the PGA 214 in the analog section.

The output of the adaptive gain stage 34, which is also the output of the FFE 26, is inputted to the deskew memory circuit 36. The deskew memory 36 is a four-dimensional function block, i.e., it also receives the outputs of the three FFEs of the other three constituent transceivers. There may be a relative skew in the outputs of the four FFEs, which are the four signal samples representing the four symbols to be decoded. This relative skew can be up to 50 nanoseconds, and is due to the variations in the way the copper wire pairs are twisted. In order to correctly decode the four symbols, the four signal samples must be properly aligned. The deskew memory aligns the four signal samples received from the four FFEs, then passes the deskewed four signal samples to a decoder circuit 38 for decoding.

In the context of the exemplary embodiment, the data received at the local transceiver was encoded before transmission, at the remote transceiver. In the present case, data might be encoded using an 8-state four-dimensional trellis code, and the decoder 38 might therefore be implemented as a trellis decoder. In the absence of intersymbol interference (ISI), a proper 8-state Viterbi decoder would provide optimal decoding of this code. However, in the case of Gigabit Ethernet, the Category-5 twisted pair cable introduces a significant amount of ISI. In addition, the partial response filter of the remote transmitter on the other end of the communication channel also contributes some ISI. Therefore, the trellis decoder 38 must decode both the trellis code and the ISI, at the high rate of 125 MHz. In the illustrated embodiment of the gigabit transceiver, the trellis decoder 38 includes an 8-state Viterbi decoder, and uses a decision-feedback sequence estimation approach to deal with the ISI components.

The 4-D output of the trellis decoder 38 is provided to the PCS receive section 204R. The receive section 204R of the PCS block de-scrambles and decodes the symbol stream, then passes the decoded packets and idle stream to the receive section 202T of the GMII block which passes them to the MAC module. The 4-D outputs, which are the error and tentative decision, respectively, are provided to the timing recovery block 222, whose output controls the sampling time of the A/D converter 216. One of the four components of the error and one of the four components of the tentative decision correspond to the receiver shown in FIG. 2, and are provided to the adaptive gain stage 34 of the FFE 26 to adjust the gain of the equalizer signal path. The error component portion of the decoder output signal is also provided, as a control signal, to adaptation circuitry incorporated in each of the adaptive filters 228, 229, 230, 231 and 232. Adaptation circuitry is used for the updating and training process of filter coefficients.

FIG. 3 is a block diagram of the trellis decoder 38 of FIG. 2 The trellis decoder 38 includes a multiple decision feedback equalizer (MDFE) 602, a Viterbi decoder 604, a path metrics module 606, a path memory module 608, a select logic 610, and a decision feedback equalizer 612. There are eight Viterbi inputs and eight Viterbi decisions corresponding to the eight states. Each of the eight Viterbi inputs (respectively, decisions) is a 4-dimensional vector whose four components are the Viterbi inputs (respectively, decisions) for the four constituent transceivers, respectively.

The adaptive filters used to implement the echo canceller 232 and the NEXT cancellers 229, 230 and 231 are typically finite impulse response (FIR) filters. FIG. 29A shows a structure of an adaptive FIR filter used as an echo/NEXT canceller in one embodiment of the gigabit transceiver.

Referring to FIG. 29A, the adaptive FIR filter includes an input signal path $P_{in}$, an output signal path $P_{out}$, and N taps (N is nine in FIG. 29A). Each tap connects a point on the input signal path $P_{in}$ to a point on the output signal path $P_{out}$. Each tap, except for the last tap, includes a coefficient $C_i$, a multiplier $M_i$ and an adder $A_i$, i=0, . . . , N−2. The last tap includes the coefficient $C_{N-1}$, the multiplier $M_{N-1}$, and no adder. The coefficients $C_i$, where i=0, . . . , N−1, are stored in coefficient registers. During each adaptation process, the values of the coefficients $C_i$ are trained using a well-known least-mean-squares algorithm by an adaptation circuitry (not shown in FIG. 29A). After training, the coefficients $C_i$ converge to stable values. The FIR filter includes a set of delay elements $D_i$, conventionally denoted by $z^{-1}$ in FIG. 29A. The number of delay elements $D_i$ determines the order of the FIR filter. The output y(n), i.e., the filter output at time instant n, is a function of the input at time instant n and of the past inputs at time instants n−1 through n-(N−1), and is expressed as:

$$y(n) \sum_{i=0}^{N-1} C_i x(n-i) \quad (1)$$

where x(n−i) denotes the input at time instant n−i, and N denotes the number of taps. The output y(n), as shown in Equation (1), is a weighted sum of the input data x(n−i), with i=0, . . . , N−1. The coefficients $C_i$ act as the weighting factors on the input data. If a coefficient $C_i$ has a very small absolute value, relative to the values of other coefficients, then the contribution of the corresponding input data x(n−i) to the value of y(n) is relatively insignificant.

FIG. 29B is an equivalent structure of the filter shown in FIG. 29A. The two structures in FIGS. 29A and 29B provide the same filter transfer function, but differ in certain performance characteristics. The difference is due to the placement of the delay elements $D_i$, i=1, . . . , N−1 (N=9 in FIGS. 29A, 29B). If all the delay elements are placed in the input path $P_{in}$, as in the well-known direct form of the FIR filter, then the registers that are used to implement the delay elements are small, need only to be of the same size as the input data x(n). If all the delay elements are placed on the output path $P_{out}$, as in the well-known transposed form of the FIR filter, then the registers used as the delay elements must have more bits in order to hold the largest possible sum of products $C_i*x(n-i)$. Large registers cost more and consume more power than small registers. Thus, the advantage of placing the delay elements on the input path instead of the output path is that fewer register bits are required. However, the larger the number of the delay elements on the input path, the lower the operating speed of the filter is.

If the propagation delay from the input of the filter to the last tap exceeds the required clock period, then the filter is not usable. To break the long propagation delay, that would occur if all the delay elements were placed on the input path $P_{in}$, into small delay intervals, some of the delay elements are placed on the output path $P_{out}$, at regular intervals, as shown in the filter structures in FIGS. 29A and 29B. The structure in FIG. 29B, which has a "two-to-one" split of delay elements between the input path and the output path, can operate at a higher clock speed than the structure in FIG. 29A, which has a "three-to-one" split. Computational results show that both of these structures are acceptable for use in a high-speed system such as the gigabit transceiver.

Figure 29C:
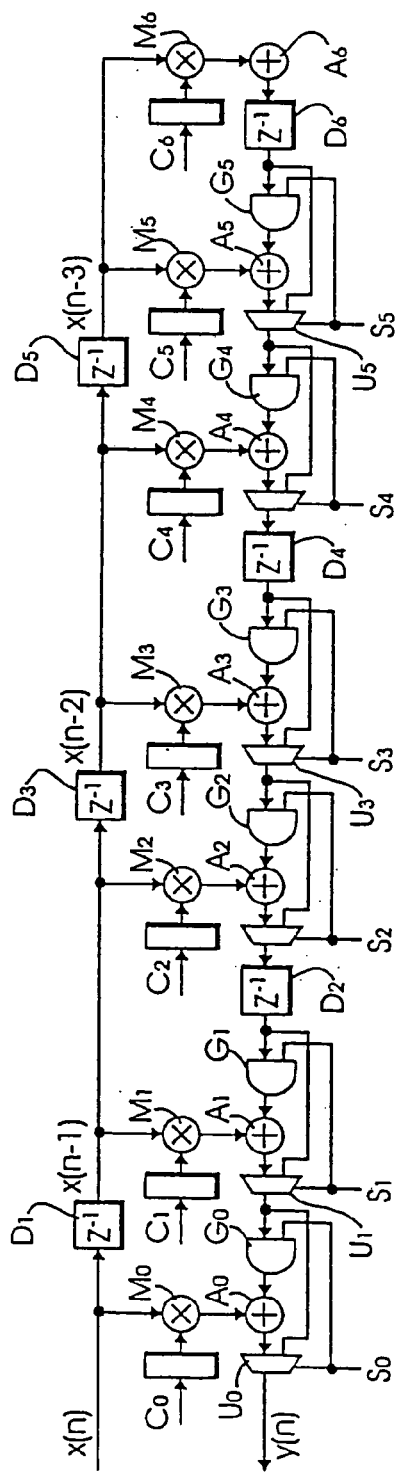
FIG. 29C is a simplified structure diagram of an alternative adaptive FIR filter including a modification to the structure of FIG. 29B to bypass a deactivated tap.

The taps of the adaptive FIR filters used in the gigabit transceiver can be switched from an active state to an inactive state. FIG. 29C shows a modification to the structure of FIG. 29B to bypass a deactivated tap.

Referring to FIG. 29C, the filter structure includes a bypass circuit for each adder $A_i$, i=0, . . . , N−1. Each bypass circuit includes a gate $G_i$ indicated as an AND gate, and a multiplexer $U_i$. Also associated with each bypass circuit is a control signal $S_i$ which indicates the active or inactive state of the tap having the coefficient $C_i$ and the adder $A_i$. $S_i$ is set equal to one if the tap is intended to be active, and set equal to zero if the tap is intended to be inactive. When $S_i$=1, the output of any arbitrarily chosen gate $G_i$ is equal to the data signal at the input of that gate $G_i$. At the corresponding multiplexer $U_i$, in the case where $S_i$=1, only the output signal from the adder $A_i$ is outputted by the multiplexer. In the case where $S_i$=0, the output of gate $G_i$ is zero, and the data signal at the input of gate $G_i$ flows to the multiplexer $U_i$ via the corresponding bypass connection $B_i$, bypassing the adder $A_i$. At the multiplexer $U_i$, due to $S_i$=0, only the data signal from the bypass connection $B_i$ is outputted.

The foregoing is only one exemplary implementation of a filter configuration wherein taps can be switched between active and inactive states. An alternative implementation is one where the multipliers $M_i$ coupled to receive filter coefficients from associated coefficient registers are able to be switched between active and inactive states.

Figure 29D:
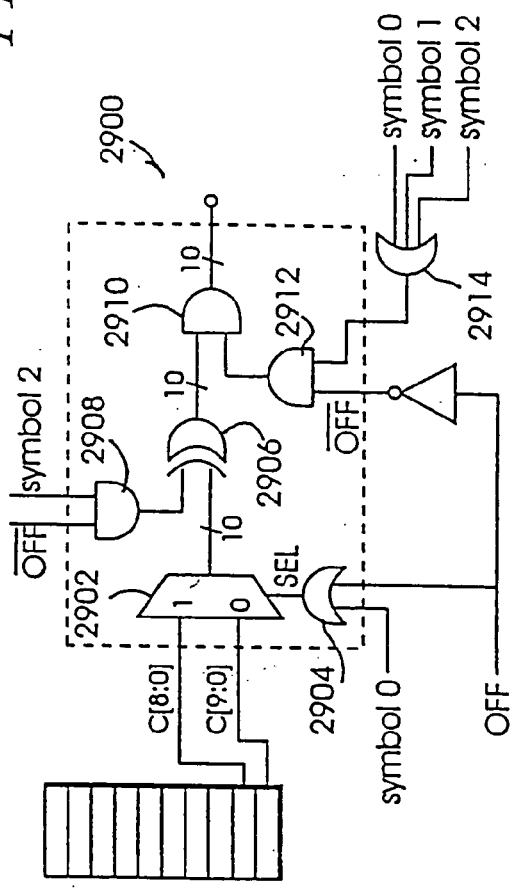
FIG. 29D is a simplified block diagram of a deactivateable coefficient multiplier circuit such as might be implemented in the filters of FIGS. 29A, 29B and 29C.

FIG. 29D is a semi-schematic block diagram of a multiplier 2900, such as might be associated with each tap coefficient. The multiplier 2900 is configured to receive a coefficient word, from a corresponding coefficient register. The coefficient word is received in a multiplexer circuit 2902, which receives the coefficient in two configurations: a first "raw" configuration taken directly from the coefficient register, and a second "times 2" configuration taken from the register but shifted one position to the left. The second coefficient configuration, then, represents the "raw" value multiplied by two. Since the second coefficient configuration is a shifted one and, necessarily contains one fewer bit than the "raw" coefficient, the "times two" coefficient set is padded by the bit value 0 (this is done by tying the least significant bit to $V_{ss}$, which is ground). This is a particularly efficient implementation of a multiplier which takes advantage of the fact that the symbols can only have the values {−2, −1, 0, +1, +2}. The symbols are represented by three bits in sign-magnitude representation, with bit 2 indicating the sign (+ or −).

A select OR gate 2904 "ORs" an OFF signal with the value of symbol bit 0 to select which coefficient representation is selected to pass through the multiplexer 2902. When the value of symbol bit 0 is 1, the "raw" coefficient, representing either −1, 0, +1 is selected. When OFF is equal to logical 1, the same condition applies. The coefficient selected by multiplexer 2902 is directed to one input of an XOR gate where it is exclusively "ORed" with an output signal from a select AND gate 2908. The AND gate 2908 "ANDs" an inverted OFF signal with the symbol bit 2 value. When OFF is logical 0, i.e., inverted OFF is logical 1, and when symbol bit 2 is 1, the XOR functions to designate that the sign of the coefficient is negative. It should be understood that the XOR is configured as a stack (of 10 individual XOR gates), and that manipulation of the carry bit determines the sign of the coefficients.

The signed coefficient is directed to an additional AND gate 2910, where it is "ANDed" with the output of a second select AND gate 2912. The output of second select AND gate 2912 is developed by "ANDing" the inverted OFF signal with the "ORed" result between symbol bits 0, 1 and 2. The effective function of OR gate 2914 is to differentiate between the symbol zero value and the other symbol values. In effect, OR gate 2914 is a symbol {0} detect circuit.

Tap disablement is a function of the OFF signal value. When OFF is logical 1, the multiplexer is set to select "one," i.e., the "raw" coefficient. When OFF equal to logical 1, inverted OFF is logical 0, causing the first and second select AND gates 2908 and 2912 to output a zero regardless of the value of the symbol bit input. Since the output of AND gate 2912 is zero, the AND gate stack 2910 also outputs a zero, which is directed to a corresponding tap adder $A_i$ in the output path of the adaptive filter (FIGS. 29A, 29B or 29C). Adding a zero requires no computation and the tap is thus effectively deactivated.

The underlying reason for ORing the OFF signal in the OR gate 2904 and for ANDing the inverse OFF signal in the AND gate 2908 is to ensure that no transitions take place inside the multiplier when the tap is deactivated. Without the OFF signal as input to the OR gate 2904, the select input to the multiplexer 2902 will toggle depending on the value of the symbol bit 0. Without the inverse OFF signal as input to the AND gate 2908, one of the two inputs to the XOR 2906 will toggle depending on the value of the symbol bit 2. This toggling, or transition, would dissipate power. The reason for ANDing the inverse OFF signal in the AND gate 2912 is to ensure that the multiplier output (which is the output of AND gate 2910) is zero when the tap is deactivated.

Referring back to FIG. 2, the adaptive FIR filters used as the echo canceller 232 and the three NEXT cancellers 229, 230 and 231, require large numbers of taps to be effective as cancellers for a wide range of twisted pairs of cables. Echo/NEXT responses differ for different cables, and require different taps in the cancellers to model them. Therefore, cancellers are built with enough taps to provide adequate cancellation with the worst-case expected cable responses. For example, in the illustrated embodiment of the gigabit transceiver of FIG. 2, each echo canceller has one hundred ninety two (192) taps, and each NEXT canceller has thirty six (36) taps (it is noted that there is also a total of 132 taps in the DFE which are always active). Since there are four echo cancellers (one per constituent transceiver) and twelve NEXT cancellers (three per constituent transceiver) in the gigabit transceiver, the total number of taps that can be activated or deactivated in the gigabit transceiver is twelve hundred (1200). When active, each of these taps consumes a small amount of power. Due to their large number, if all of the taps are active at the same time, their individual power consumption values will sum to significantly large total power consumption figure. This power consumption, if not regulated, generally causes a high degree of localized heating in an integrated circuit; often resulting in reliability issues, skewed circuit performance and, in some cases, catastrophic device failure.

Regulation of this power consumption is possible since not all of the taps are required to be active on any given channel at any given time. The taps that are not required to be active are the ones that do not significantly contribute to the performance of the system. However, which taps are not required to be active at a given time is not known a priori.

Such unnecessary taps can become needed at a different time due to dynamic changes in the cable response. The present invention dynamically determines which, if any, taps are unnecessary for adequate performance in a particular application, and deactivates them. The present invention also re-activates any previously deactivated taps that subsequently become necessary, due to changes in the cable response, for system performance improvement. As applied to the adaptive filters, the method of the present invention might be characterized as a tap power regulation method.

Figure 30:
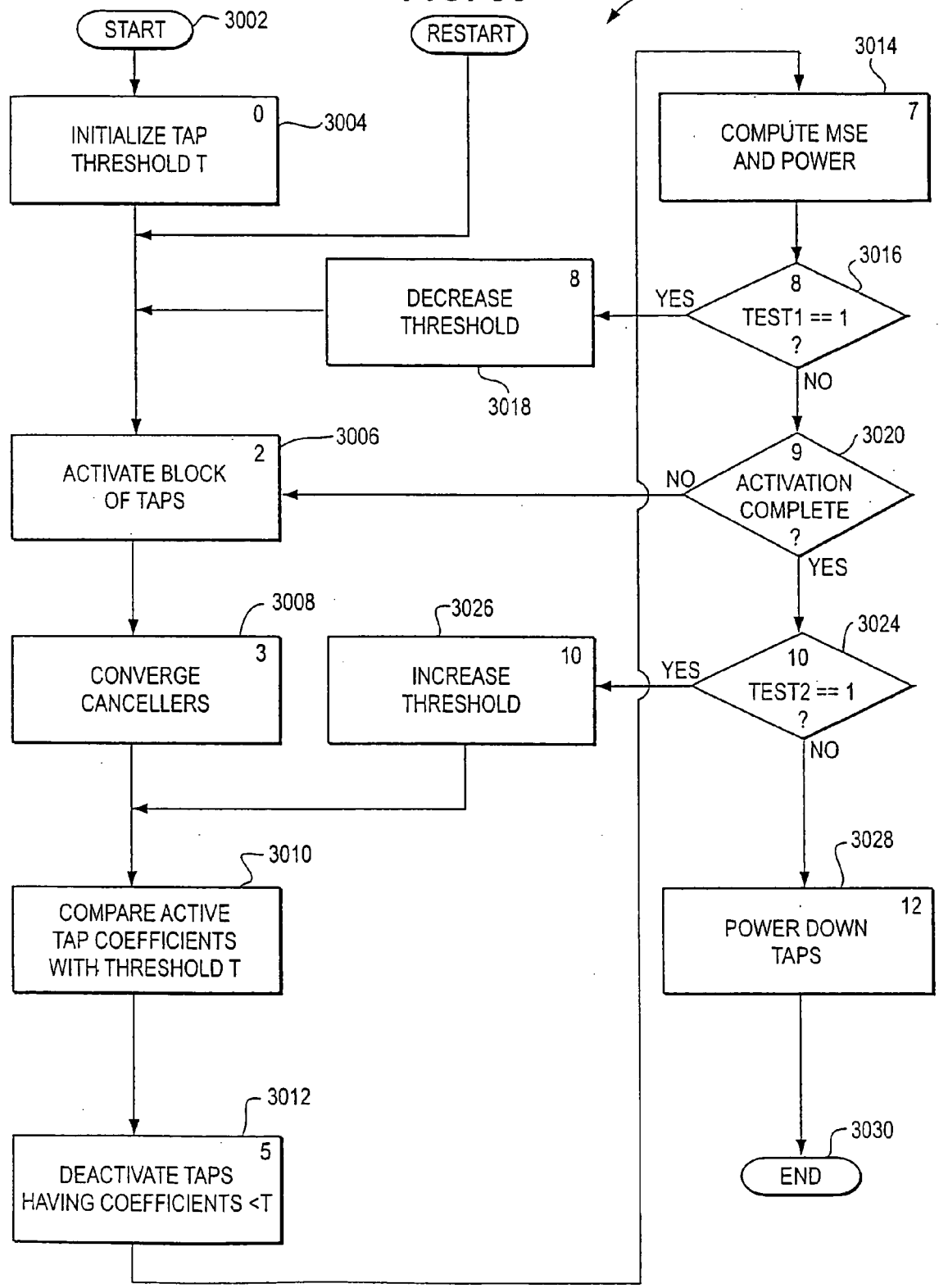
FIG. 30 is a flowchart depicting a first exemplary embodiment of an adaptive power reduction method according to the present invention.

FIG. 30 is a flowchart of a first exemplary embodiment of a method for implementing principles of the present invention. A specified error and a specified power are provided. They may be specified by a user. The specified power represents the maximum power consumption that is allowed. If no power is specified, it is assumed to be infinite. The specified error represents the maximum degradation of the system performance that is allowed and is preferably expressed as a mean squared error (MSE). Since the signal power is constant, the MSE corresponds to a ratio of mean squared error to signal(MSE/signal)usually expressed in decibels (dB)

In FIG. 30, before the start of process 3000, no coefficient is active. Upon start (block 3002), process 3000 initializes a threshold to a value (block 3004). This initial value of the threshold can result from a simulation test, or can be equal to the minimum absolute value of a tap coefficient (as known from past experiments). This value is not critical as long as it is sufficiently low to avoid a large degradation of the system performance. The taps in a first block are activated (block 3006). The size of this first block, i.e., the number of taps in the first block, depends on the application. In one application, this number is 120. The coefficients of the active taps are trained with the LMS algorithm until convergence (block 3008).

The absolute values of the active tap coefficients are compared with the threshold (block 3010). The taps whose absolute values are less than the threshold are deactivated (block 3012). An error metric, typically a mean squared error (MSE) corresponding to a ratio of mean squared error to signal, and a power metric are computed (block 3014). Process 3000 then checks whether a first test is satisfied (block 3016). In the first embodiment of the invention, this first test is satisfied when the error metric is greater than the specified error and the power metric is smaller than the specified maximum power. If the error metric is greater than the specified error, this implies that the threshold has been set too high, causing too many taps to be deactivated, and this has degraded the system performance by more than the specified amount. If the first test is satisfied, then the threshold is decreased (block 3018), and all the taps in the block being considered are activated again (block 3006) and process 3000 proceeds with a lower threshold. Otherwise, process 3000 determines whether all the taps of the filter have been considered (block 3020). If not, then the next block of taps is considered, and this new block of taps is activated (block 3006). A typical size of this next block of taps is 20. All of the active tap coefficients, including the new activated tap coefficients, are converged with an LMS algorithm (block 3008) and process 3000 proceeds as described above.

If all of the taps have been considered, then process 3000 checks whether a second test is satisfied (block 3024). In the first embodiment of the invention, the second test is satisfied when the error metric is smaller than the specified error or the power metric is larger than the specified power. If the error metric is smaller than the specified error, this implies that it is possible to increase the threshold to deactivate more taps and still meet the system performance requirement. If the power metric is greater than the specified power, then the threshold must be increased to lower the power consumption, regardless of the system performance requirement. If the second test is satisfied, then the threshold is increased (block 3026) and the active taps are compared with the updated threshold (block 3010). Otherwise, process 3000 turns off the power on the taps that are subsequent to the tap which has the last highest ordered active coefficient (block 3028). In other words, if $C_k$ is the last highest ordered active coefficient, then all the taps that have the deactivated coefficients $C_{k+1}$ through $C_{N-1}$ are powered down. More details on the power down function in block 3028 are provided below. Process 3000 then terminates (block 3030).

When process 3000 is restarted (block 3032), a block of taps is activated (block 3006). Upon restart of process 3000, the threshold is at its last value from the last application of process 3000. The coefficients that were previously deactivated are activated with their values remaining at their last values before deactivation. Then process 3000 proceeds as described above.

Periodic restart of process 3000 is desirable for the following reason. In some cases, the echo/NEXT path impulse response may change during normal operation. For example, this change may be a result of temperature changes. To correct for this change, process 3000 periodically restarts to turn on the deactivated coefficients in a sequential manner (block 3006), re-converges the coefficients (block 3008), and determines whether the previously deactivated coefficients are still below the threshold (block 3010). If the previously deactivated coefficients are now converged to values above the threshold, they remain active, otherwise they are deactivated (block 3012). Any of the initially active coefficients that now fall below the threshold are also deactivated (block 3012).

The underlying reason for activating the taps a few at a time (block 3006 through 3020) is the following. When the total number of taps is very large, the power consumption can be very large during the initial convergence transient. This peak power consumption is very undesirable, and is unaffected by the tap power regulation process (which can only reduce the average power consumption of the filters). One solution to this peak power consumption problem is to activate and converge the taps in an initial small block of taps (blocks 3006, 3008), deactivate some of the converged taps according to a criterion (block 3010 through block 3020), activate a next block of taps (block 3006), converge all the active taps including the newly activated taps (block 3008), and repeat the process of deactivation, activation and convergence until all the taps of the filter are processed.

Power-down block 3028, which is optional, of process 3000 helps further reduce the power consumption of the adaptive filters. Without block 3028, although the tap power regulating process 3000 already achieves a large reduction of the power consumption by reducing the number of active taps, there is still a significant amount of power dissipated by the long delay line of the adaptive filter. By delay line, it is meant the line connecting the delay elements together. Turning a tap off does not necessarily affect the configuration of the delay line. However, in many practical cases, many of the deactivated taps are located contiguously at the highest-ordered end of the filter. An example of such a case is when the cable is short and well behaved. In such cases, the portion of the delay line associated with these contiguously deactivated taps can be completely powered down without affecting the transfer function of the filter. This powering down contributes an additional reduction of power dissipation of the filter. In one exemplary application, this additional reduction of power dissipation is approximately 300 milliwatts (mW) per echo canceller and 70 mW per NEXT canceller, resulting in a power saving of 2.04 Watts for the gigabit transceiver.

An exemplary implementation of block 3028 is as follows. An additional bit, called the delay line enable bit, is associated with each tap of a filter. This bit is initially ON. When process 3000 reaches block 3028, all of the taps are scanned for active status starting from the highest-ordered end of the filter, i.e., the tap including the coefficient $C_{N-1}$, towards the lowest-ordered end, i.e., the tap including the coefficient $C_0$. During scanning, the delay line enable bits of the scanned inactive taps are switched OFF until the first highest-ordered active tap is found. At this point, the scanning for tap active status terminates. Then all the delay line sections corresponding to the taps whose delay line enable bits are OFF are powered down.

Figure 31:
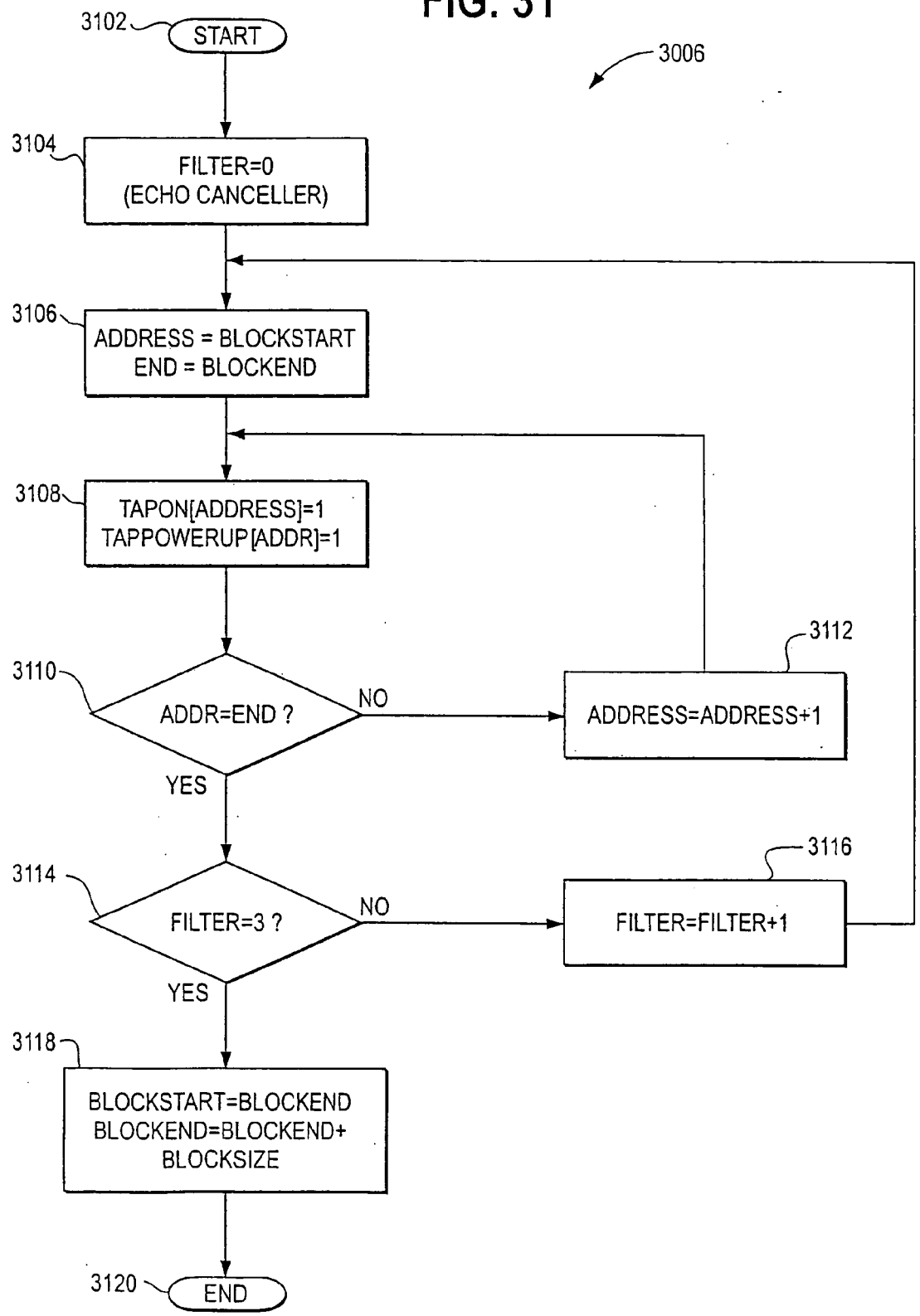
FIG. 31 is a flowchart depicting one exemplary embodiment of an activation block according to the method of FIG. 30.

Activation block 3006 of FIG. 30 is applied sequentially to the echo canceller 232 and the three NEXT cancellers 229, 230 and 231 (of FIG. 2). FIG. 31 illustrates the flowchart of one exemplary embodiment of the activation block 3006.

Referring to FIG. 31, upon start (block 3102), the process 3006 sets the filter number to zero (block 3104) to operate on the echo canceller. The filter number zero represents the echo canceller, while filter numbers 1 through 3 represent the three NEXT cancellers, respectively. Process 3006 then sets the address and the end equal to the start address and the end address of the block of taps, respectively (block 3106). The modules TapOn and Tap PowerUp are invoked with the address as argument (block 3108). The module TapOn turns on the circuitry of the tap having the specified address. This circuitry includes a 1-bit storage to indicate the active status of the tap. When the tap is turned on, the tap is included in the computation of the output y(n) of the filter (referring to Equation (1)), and in the adaptation process, i.e., the training and convergence of the filter coefficients. The module TapPowerUp turns the power on for the delay line section associated with the tap having the specified address. Process 3006 then determines whether the address is equal to the end. If it is not, then the address is increased by one (block 3112), to consider the next tap of the filter. If the address has reached the end address of the block of taps, then process 3006 determines whether filter number is equal to 3, i.e., whether all the filters in the transceiver have been considered (block 3114). If not, then filter number is increased by one, so that the next filter is considered. If process 3006 has operated on all the filters, then process 3006 sets the start address equal to the old end address, and sets the new end address equal to the sum of the old end address and the block size, the block size being the size of the next block of taps to be activated (block 3118). Process 3006 then terminates (block 3120).

Figure 32:
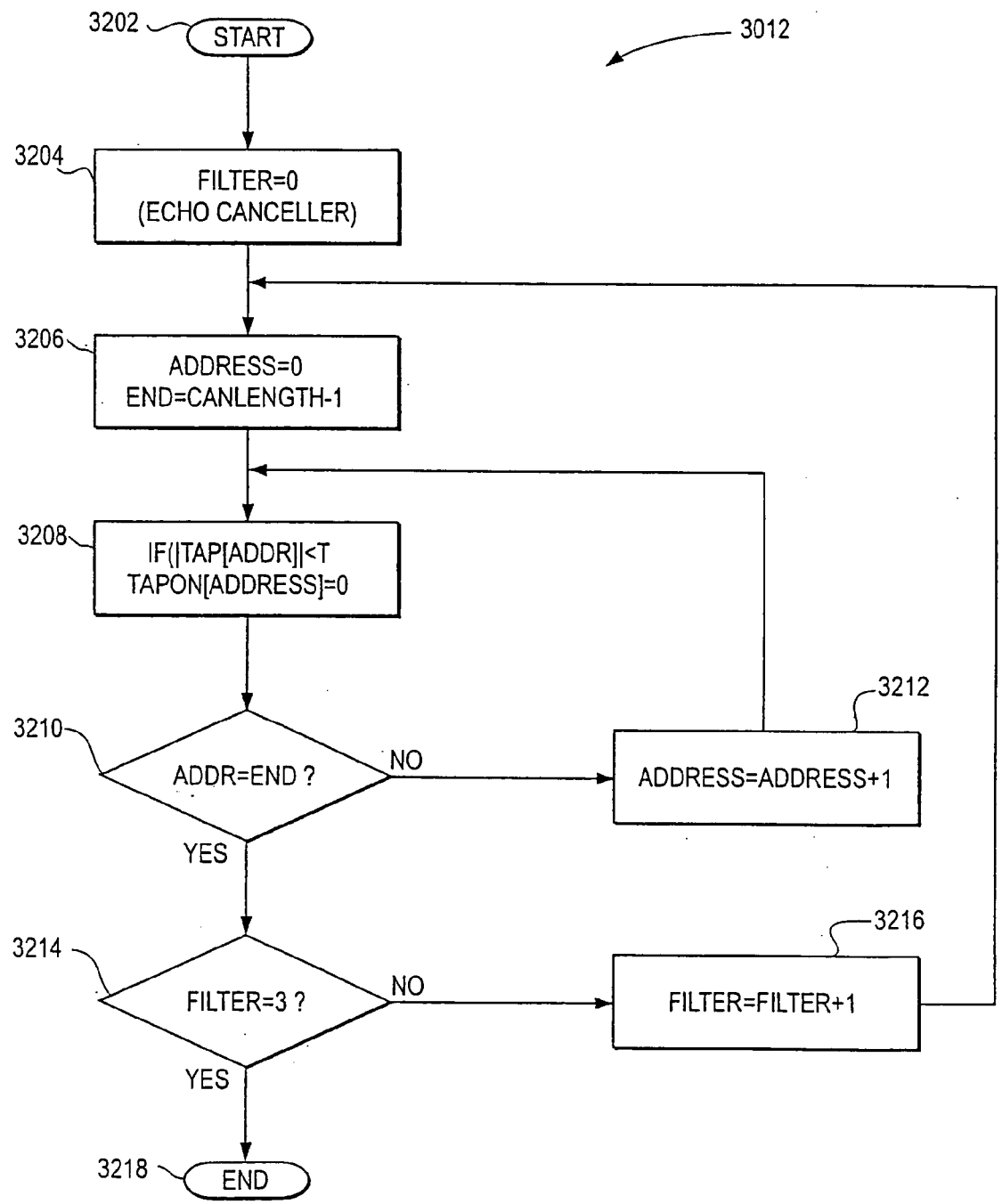
FIG. 32 is a flowchart depicting one exemplary embodiment of a deactivation block according to the method of FIG. 30.

Deactivation block 3012 of FIG. 30 is applied sequentially to the echo canceller 232 and the three NEXT cancellers 230 (of FIG. 2). FIG. 32 illustrates the flowchart of one embodiment of the deactivation block 3012.

Referring to FIG. 32, upon start (block 3202), the process 3012 sets the filter number to zero (block 3204) to operate on the echo canceller. The filter number zero represents the echo canceller, while filter numbers 1 through 3 represent the three NEXT cancellers, respectively. Process 3012 then sets the address equal to zero and the end equal to the length of the filter minus 1 (block 3206). If the absolute value of the tap coefficient at the specified address is less than T, the threshold, then the module TapOn is invoked to turn off the circuitry associated with the tap having the specified address (block 3208). When the tap is turned off, the tap is removed from the computation of the output y(n) of the filter (referring to Equation (1)), and from the adaptation process, i.e., the training and convergence of the filter coefficients. Process 3012 then determines whether the address is equal to the end. If it is not, then the tap address is increased by one (block 3212), to consider the next tap of the filter. If the address has reached the end of the filter taps, then process 3012 determines whether filter number is equal to 3, i.e., whether all the filters in the transceiver have been considered (block 3214). If not, then filter number is increased by one, so that the next filter is considered (block 3216). If process 3012 has operated on all the filters, then process 3012 terminates (block 3218).

Figure 33:
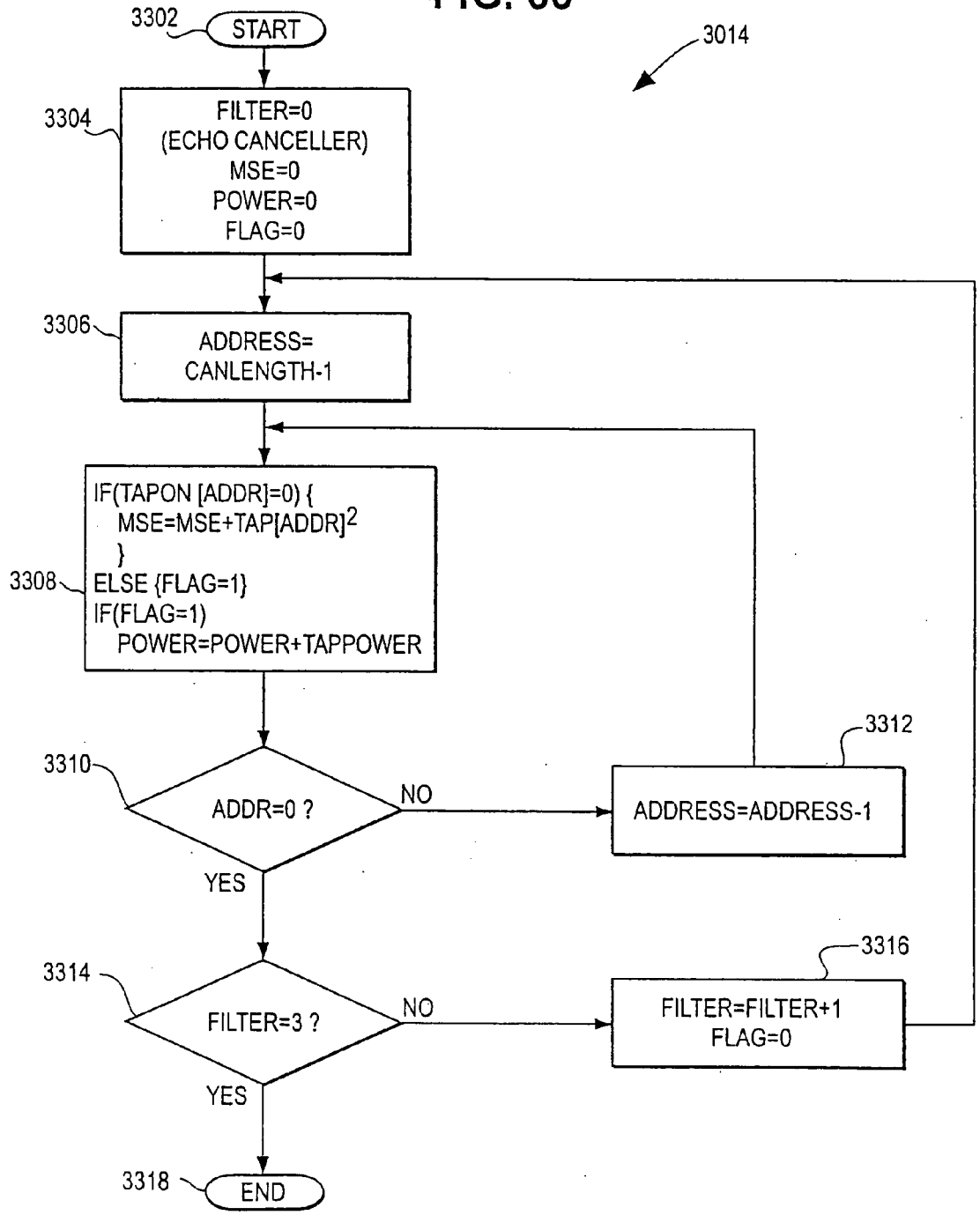
FIG. 33 is a flowchart of one embodiment of the computing block 514 of FIG. 30.

Error-computing block 3014 of FIG. 30 is applied sequentially to the echo canceller 232 and the three NEXT cancellers 230 (of FIG. 2). FIG. 33 illustrates the flowchart of one embodiment of the error-computing block 3014.

Referring to FIG. 33, upon start (block 3302), the process 3014 sets the filter number to zero (block 3304) to operate on the echo canceller, and initializes the error metric MSE, the power metric and the flag. The filter number zero represents the echo canceller, while filter numbers 1 through 3 represent the three NEXT cancellers, respectively. Process 3014 then sets the address equal to the length of the filter minus 1 (block 3306) to scan the filter taps from the highest ordered end. The reason for using this scanning order and the flag is to ensure that the taps that will be powered down in block 3028 of FIG. 30 will be excluded from the computation of the power metric. A deactivated tap still consumes a small amount of power if it is not actually powered down because of the associated delay line section. To compute the new power metric such that it can be used to accurately regulate the power consumption of the system, the process 3014 must exclude from the computation the power consumption of a deactivated tap that will be powered down.

If TapOn[addr] is zero, i.e., if the tap at the specified address is turned off, then process 3014 computes the new error metric MSE by adding to the previous value of MSE the squared value of the tap coefficient at the specified address. Otherwise, if the tap at the specified address is on, then the flag is set to 1. If the flag is 1, then process 3014 computes the new power metric by adding to the previous value of the power metric the estimated power consumption TapPower of the tap having the specified address (block 3308). TapPower is chosen from precomputed values stored in a look-up table. These precomputed values are functions of the size of the coefficients and of the active or inactive status of the coefficient.

Process 3014 determines whether the address is 0 (block 3310). If it is not, then the tap address is decreased by one (block 3312), to consider the next tap of the filter. If the address has reached 0, then process 3014 determines whether filter number is equal to 3, i.e., whether all the filters in the transceiver have been considered (block 3314). If not, then filter number is increased by one, so that the next filter is considered and the flag is reset to 0 (block 3316). If process 3014 has operated on all the filters, then process 3014 terminates (block 3318).

As shown in FIG. 33, the error metric MSE is computed by summing the squared values of the deactivated tap coefficients. It is noted that the error metric can be computed differently, such as deriving it from the error component 42A of the 4-D error signal 42 outputted from the trellis decoder 38 (FIG. 2).

The MSE as measured from the error output 42 of the trellis decoder 38 (FIG. 2) will be, hereinafter, referred to as the true MSE. The MSE as measured by summing the squared values of the coefficients of the deactivated taps will be, hereinafter, referred as the proxy MSE.

There is an advantage in using the proxy MSE, instead of the true MSE, as the error metric. Since the proxy MSE is based solely on the coefficient values of the deactivated taps, it represents only one component of the noise signal of the gigabit transceiver (other components may be due to quantization noise, external noise, etc.). Therefore, the proxy MSE is unaffected when large external noise, other than echo or NEXT noise, severely affects the noise signal, hence the noise to signal ratio, of the gigabit transceiver. For this reason, the proxy MSE is preferred as the error metric.

If the true MSE is used as the error metric, then the specified error is preferably set at a value corresponding to a noise to signal ratio of about B22 dB, because, although theoretically, a true MSE corresponding to a noise to signal ratio of B19 dB is acceptable for the gigabit transceiver, in practice, it is difficult to obtain adequate system performance at that level. If the proxy MSE is used as the error metric, then the specified error is preferably set at a value corresponding to a noise to signal ratio of about B24 dB.

Figure 34:
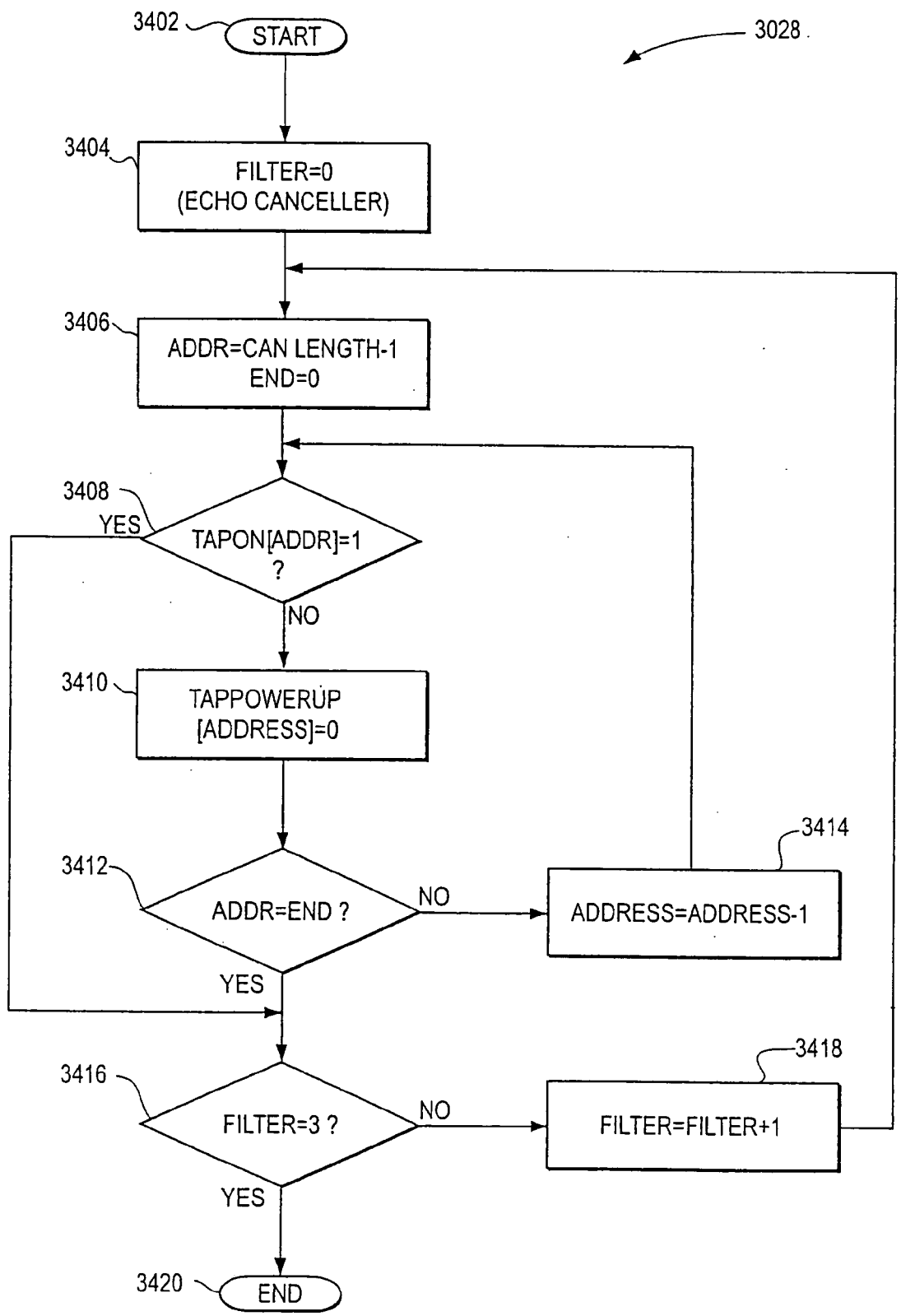
FIG. 34 is a flowchart depicting one exemplary embodiment of a power-down block according to the method of FIG. 30.

Power-down block 3028 of FIG. 30 is applied sequentially to the echo canceller 232 and the three NEXT cancellers 230 (of FIG. 2). FIG. 34 illustrates the flowchart of one embodiment of the power-down block 3028.

Referring to FIG. 34, upon start (block 3402), the process 3028 sets the filter number to zero (block 3404) to operate on the echo canceller first. The filter number zero represents the echo canceller, while filter numbers 1 through 3 represent the three NEXT cancellers, respectively. Process 3028 then sets the address equal to the length of the filter minus 1 and the end equal to zero (block 3406). This means that the process 3028 starts from the highest ordered end of the filter towards the lowest ordered end.

Process 3028 determines whether TapOn[addr] is 1, i.e., whether the tap at the specified address is active (block 3408). If the tap is not active, then process 3028 turns off the power to the tap (block 3410), then checks whether the address is equal to the end (block 3412). If the address is not equal to the end, the address is decreased by 1 to consider the next lower ordered tap (block 3414). If the address has reached the end, then process 3028 determines whether the filter number is 3, i.e., whether all the 4 filters have been considered (block 3416). If the filter is not the last one, then filter number is increased by 1 so that the next filter is considered (block 3418). Otherwise, process 3028 terminates (block 3420).

If TapOn[addr] is 1 (block 3408), i.e., if the tap at the specified address is active, then process 3028 stops scanning the taps in the filter being considered, and checks the next filter, if any (block 3416). Process 3028 then proceeds as described above.

The process 3000 of FIG. 30 is applied to the echo and NEXT cancellers of each of the 4 constituent transceivers of the gigabit transceiver 102 depicted in FIGS. 2 and 3. It is important to note that, if process 3000 is applied simultaneously to the 4 constituent transceivers, there will be a power demand surge in the gigabit transceiver 102. In order to avoid such a power demand surge, process 3000 is applied to the 4 transceivers in a time-staggered manner.

In a second embodiment of the present invention, two different specified errors are used in order to avoid possible limit cycle oscillations between activation and deactivation. The flowchart of the second embodiment is substantially similar to the one shown in FIG. 30. The second embodiment differs from the first embodiment by using a first specified error for the first test in block 3016 (FIG. 30) and a second specified error for the second test in block 3024. The first specified error is substantially larger than the second specified error. The use of the two different specified errors, sufficiently distant from each other, allow the process 3000 to terminate when the computed error metric has a value located between the two specified errors. When just one specified error is used, as in the first embodiment, the computed error metric may jump back and forth around the specified error, causing the process 3000 to oscillate between activation and deactivation.

In a third embodiment of the present invention, the first few taps of each filter, e.g., the first 10 taps, are exempt from deactivation in order to avoid possible degradations of the system performance in the presence of jitter. The effect of jitter on these few taps is as follows. There is usually a large slew rate in these first few taps. Due to this slew rate, their numerical values could change significantly if the sampling phase of the received signal changes. In the presence of jitter, the sampling phase of the received signal can change dynamically. Thus, if some of the first few taps were insignificant for the system performance, they could become significant as the sampling phase changes. For this third embodiment, the flowchart of the deactivation process of block 3012 is slightly different from the one shown in FIG. 30. The only modification to the flowchart of FIG. 30 is to equate, in block 3006, the address to K instead of 0, where K+1 is the number of the first few taps exempt from deactivation.

A fourth embodiment of the present invention uses, as the error metric, the change in the true MSE instead of the true MSE. In other words, the value of {new (true MSE) B old (true MSE)} is computed and used as the error metric. In the fourth embodiment, the first test in block 3016 is satisfied if the change in the true MSE is greater than a specified change value (e.g., a value that corresponds to a noise to signal ratio (NSR) change of 1 dB) and the power metric is smaller than the specified maximum power. The second test in block 3024 is satisfied if the change in the true MSE is smaller than the specified change value or the power metric is greater than the specified maximum power. For example, if the true MSE is at a value corresponding to a NSR of B25 dB before the tap power regulating process is applied, and if the specified change value corresponds to a NSR change of 1 dB, then the final true MSE will be at a value corresponding a NSR of about B24 dB. This fourth embodiment can be used when there is large external noise that is other than echo or NEXT noise. In such a case, the true MSE is large even before the tap power regulation process is applied. Thus, if the true MSE is used as the error metric, practically no taps will be deactivated, resulting in large power dissipation. In this situation, since the large noise is not caused by the uncancelled echo and NEXT impairments, a large number of taps could be deactivated without causing significant additional degradation to the system performance. The fourth embodiment allow these taps to be deactivated in this situation.

In a fifth embodiment, all of the taps in a filter are initially activated and converged, instead of being activated in blocks and converged in stages as in the first embodiment. The flowchart of the fifth embodiment is similar to the one of the first embodiment shown in FIG. 30, except for the following two differences. The first difference is that, in the activation block 3006, the block of taps is set to include all of the taps in the filter. The second difference is that the block 3020 is not needed.

In each of the embodiments, there are several ways of computing the error metric. The error metric can be computed as a measurement of system performance degradation caused by the filter being considered, or by the four filters in the constituent transceiver being considered, or by all the 16 filters in the four constituent transceivers of the gigabit transceiver.

When computed as a measurement of degradation caused by all 4 filters of the constituent transceiver being examined, the error metric provides a good indication of the bit error rate of that constituent transceiver.

In the case where the error metric is computed as a measurement of degradation caused by all the 16 filters in the 4 constituent transceivers of the gigabit transceiver, the power regulation process can allow the filters in one of the 4 transceivers to have larger error and compensate for this error in the filters of the other 3 transceivers. For example, if the echo/NEXT impairments in one particular transceiver are very severe and too many active taps would be needed to cancel them, then the power regulation process can allow the impairments to stay severe in this transceiver, and allocate the power resource to the other 3 transceivers instead. It is noted that, in this case, the trellis decoder 38 still decodes correctly since it uses signal samples from all the four transceivers in its decoding scheme.

When applied to the echo and NEXT cancellers of the gigabit transceiver, for typical channels, the power regulation process of the present invention results in a large number of taps being deactivated and the power consumption being reduced by a large factor. Simulation tests confirm this result.

Figure 35:
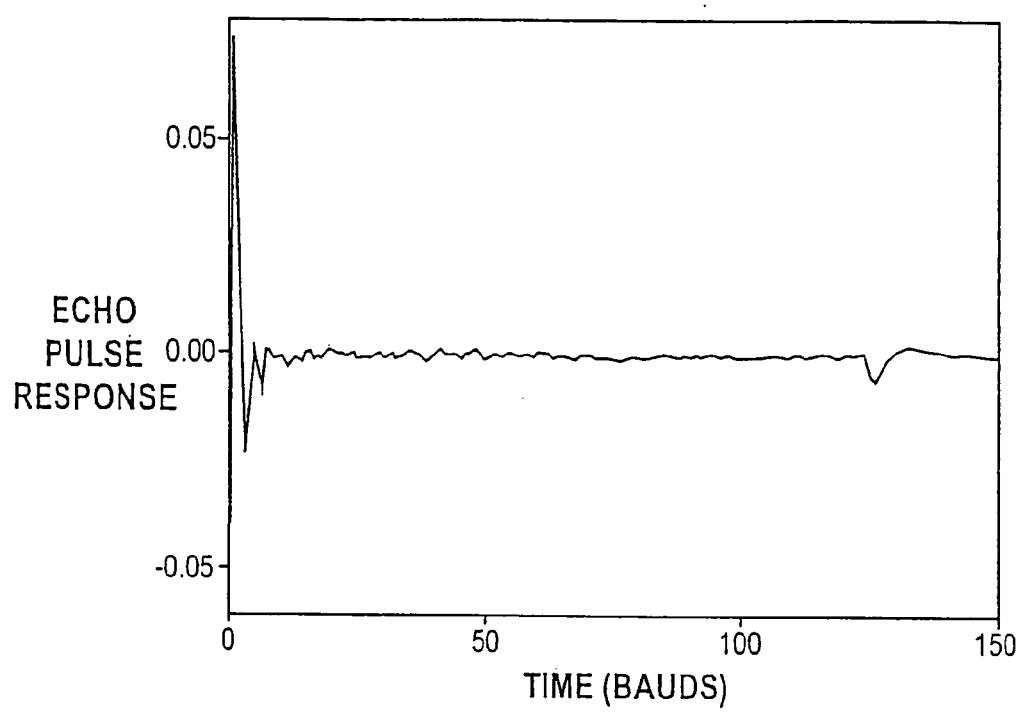
FIG. 35 is a graph of an exemplary impulse response of the echo characteristics of a typical channel.
Figure 36:
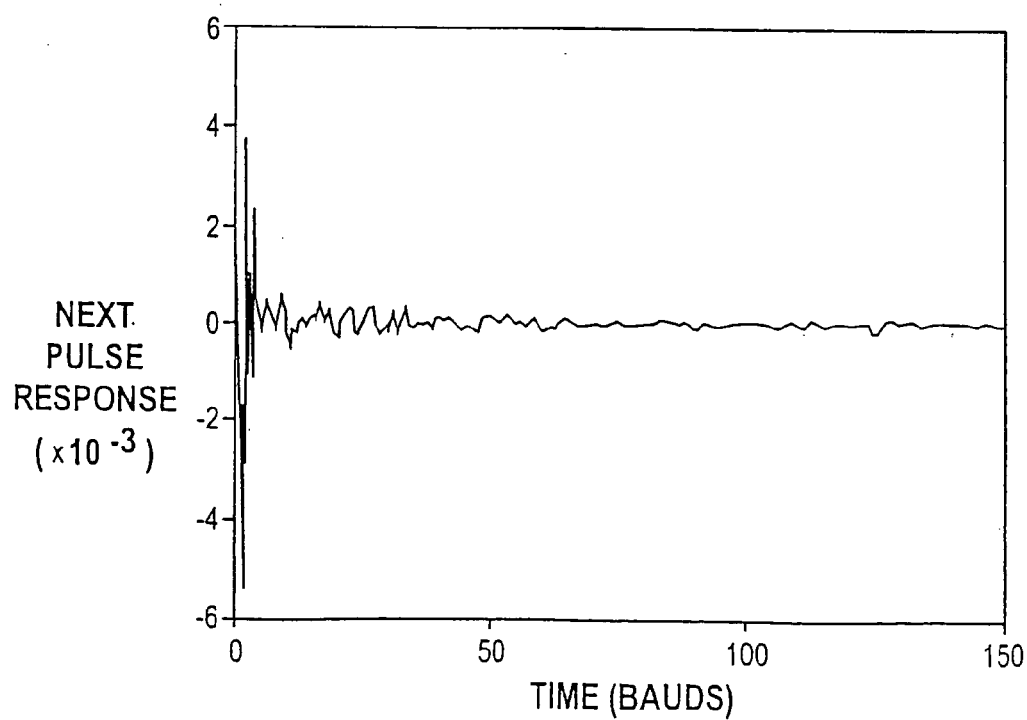
FIG. 36 is a graph of an exemplary impulse response of the near-end crosstalk (NEXT) characteristics of a typical channel.
Figure 37A:
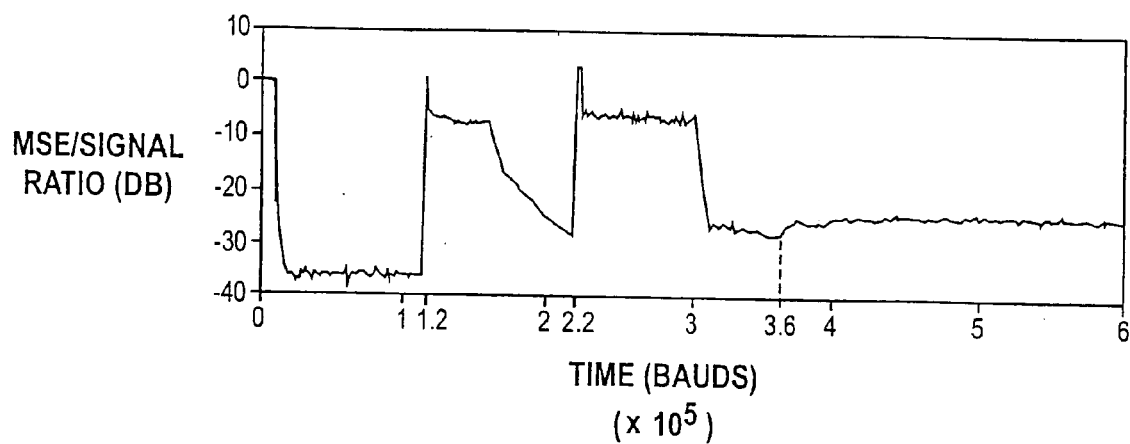
FIGS. 37A and 37B are graphs of the mean squared error to signal ratio (MSE/signal) expressed in dB as a function of time, with time expressed in bauds, of exemplary Master and Slave transceivers, respectively.
Figure 37B:
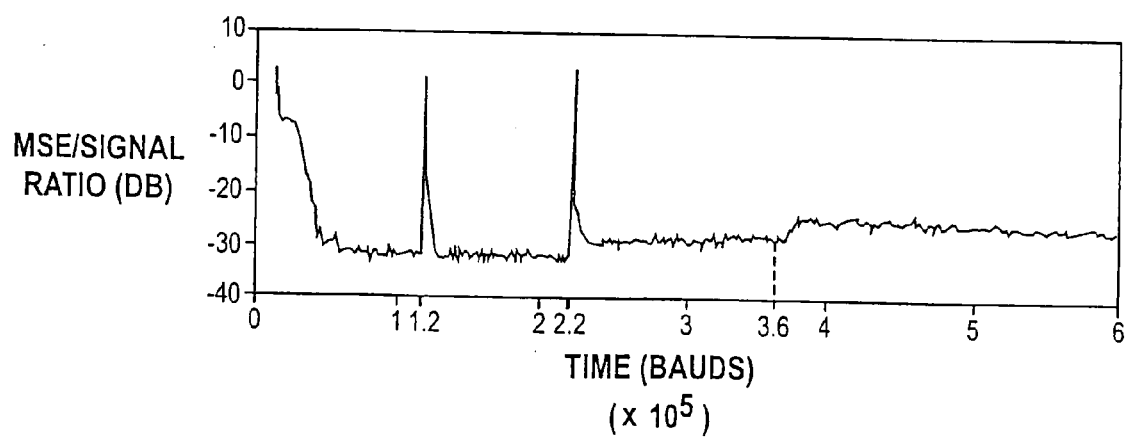

FIG. 35 illustrates an exemplary impulse response of the echo characteristic developed by a typical multi-pair transmission channel in response to a known impulse. FIG. 36 illustrates an exemplary impulse response of the near end crosstalk (NEXT) characteristics developed by a typical transmission channel in response to a similar known impulse. FIGS. 37A and 37B illustrate the results of simulation programming performed to evaluate the application of tap power regulation methodologies to a local constituent transceiver and a remote constituent transceiver connected together through a transmission channel having the echo impulse response of FIG. 35.

During the initial period of communication, through a process known as Auto-Negotiation, the two transceivers negotiate then agree on their respective status as Master and Slave. FIGS. 37A and 37B show the MSE to signal ratio expressed in dB as a function of time, with time expressed in bauds, for the Master and Slave transceivers, respectively. Each point on the graphs in FIGS. 37A and 37B is obtained by averaging the instantaneous measurements taken over 10,000 symbol periods. The error metric MSE is computed based on the error signal 42A (in FIG. 2), i.e., the error as seen by the trellis decoder 38 (FIG. 2).

Referring to FIGS. 37A and 37B, during the time interval from 0 baud to about $1.2 \times 10^5$ bauds, the Master trains its own echo canceller while transmitting with an independent, fixed clock. During this time interval, the Slave synchronizes to the signal transmitted by the Master, and trains its feed-forward equalizer and its timing recovery block. During the time interval from about $1.2 \times 10^5$ bauds to about $2.2 \times 10^5$ bauds, the Slave trains its echo canceller while transmitting. During this time interval, the Master is not transmitting, only receiving from the Slave, and trains its feed-forward equalizer and its timing recovery block to account for the delay in the channel. By the end of this time interval, the Master and Slave are synchronized with each other.

During the time interval from about $2.2 \times 10^5$ bauds to about $3.2 \times 10^5$ bauds, both the Master and Slave transmit and receive. During this time interval, the Master retrains its echo canceller and readjust timing. From about $3.2 \times 10^5$ bauds, there is convergence of both Master and Slave echo cancellers. At about $3.6 \times 10^5$ bauds, the tap power regulating process of the present invention is applied to both echo cancellers, with the specified error, i.e., the maximum acceptable system performance degradation, set at a value corresponding to a NSR of −24 dB. As shown in FIGS. 37A and 37B, for both local and remote transceivers, the MSE increases to and stays at this specified error corresponding to a NSR of B24 dB. In this example, in each constituent transceiver, the echo canceller has initially 140 taps, and each of the three NEXT cancellers has initially 100 taps. The total number of initial taps in each constituent transceiver is 440.

Figure 38A:
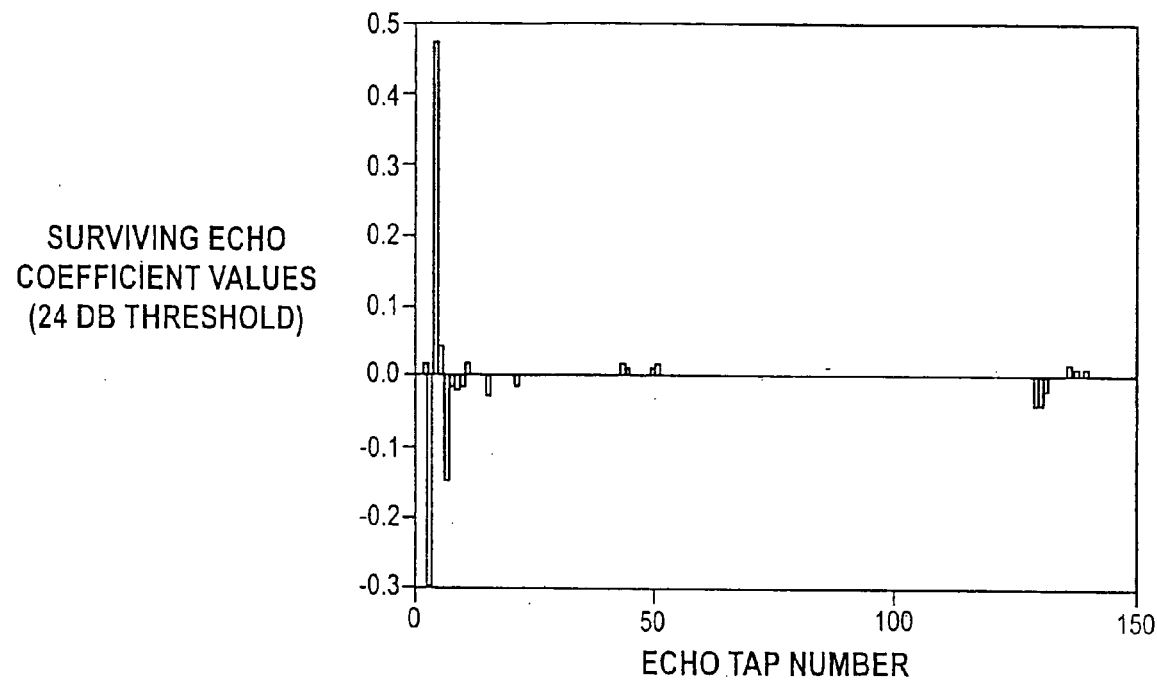
FIGS. 38A and 38B are graphs of the values of the tap coefficients of an exemplary echo canceller as a function of the tap number, after application of the tap power regulating process with the specified error set at −24 dB and −26 dB, respectively.
Figure 38B:
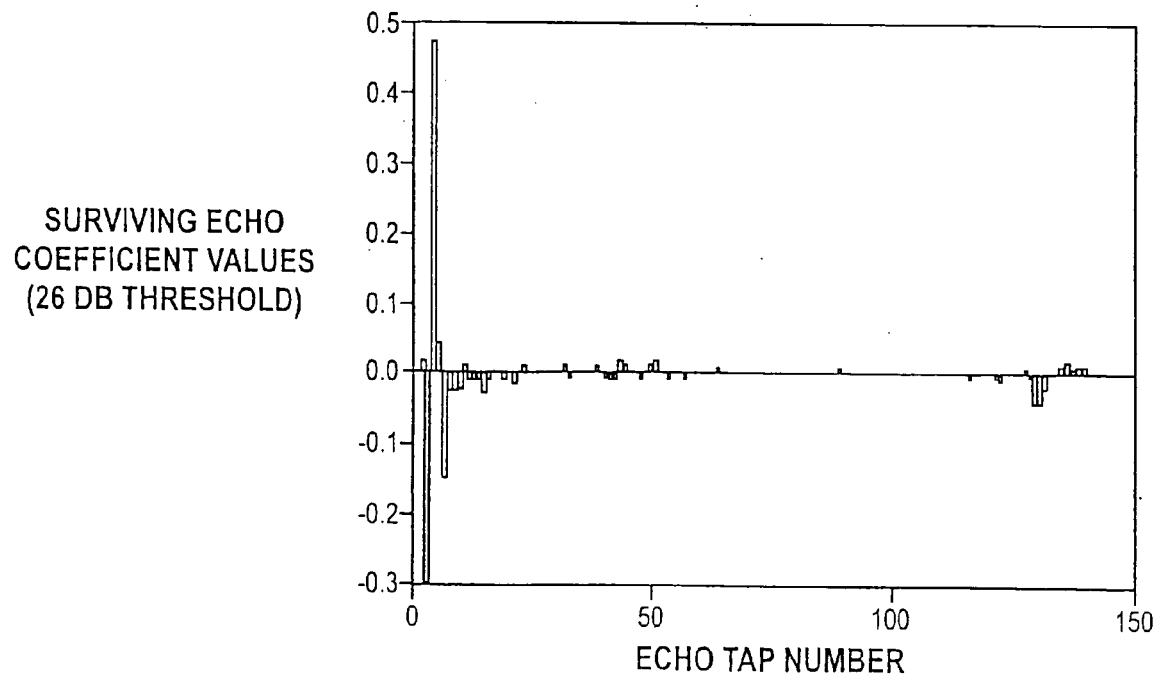

FIGS. 38A and 38B are graphs of the values of the tap coefficients of the echo canceller as a function of the tap number, after application of the tap power regulation process with the specified error set at values corresponding to noise to signal ratio of −24 dB and −26 dB, respectively. The deactivated coefficients are shown as having value zero.

Referring to FIG. 38A, the number of taps remaining active, after application of the tap power regulation process with the specified error corresponding to a NSR of B24 dB, is 22. For this specified error, the remaining active taps for the three NEXT cancellers is 6, 2, and 0, respectively (not illustrated). Thus, out of a total of 440 initially active taps in the constituent transceiver, only 30 remain active after application of the process of the present invention, while a 5 dB margin is maintained for the required bit error rate.

Referring to FIG. 38B, after application of the tap power regulation process with the specified error corresponding to a NSR of B26 dB, the number of taps remaining active is 47. For this specified error, the remaining active taps for the three NEXT cancellers (not illustrated) is 6, 2, and 0, respectively. Thus, out of a total of 440 initially active taps in the constituent transceiver, only 55 remain active after application of the process of the present invention, while a 7 dB margin is maintained for the required bit error rate.

FIGS. 38A and 38B show that the surviving taps occur at sparse locations. This is due to the strong dependence of the echo/NEXT cancellers on the specific cable response. Since the response characteristics of any given cable making up the transmission channel are not a priori determinable, it would be impossible, in practice, to predict and statically allocate the surviving taps during the design of the echo and NEXT cancellers. Therefore, some sort of dynamic active tap identification and allocation process according to the invention offers significant power reduction benefits over conventional methodologies.

While the systems and methods of the invention have been described mainly in terms of their applicability to adaptively configuring active tap sets for high order digital filters, the dynamic power regulation methodology of the present invention can also be applied to complete computation modules of a transceiver, in cases where the computational power of such modules is not needed for a particular application. In these cases, a similar methodology applies, i.e., evaluate a signal performance metric of a signal output from a computational module against a performance threshold and, where the performance metric is greater than the threshold, power down the computational module.

This additional embodiment of the invention is particularly advantageous in cases where the transmission channel might be implemented with short (<3 meters) cable lengths, resulting in the relative absence of transmission channel induced intersymbol interference (ISI). Returning momentarily to the description of the trellis decoder circuit accompanying FIG. 3, in the absence of intersymbol interference, symbols received from the deskew memory 37 need only be decoded by the Viterbi decoder 604, and its associated modules, i.e., the path metrics module 606, and the path memory module 608, without resorting to a decision-feedback sequence estimation approach, as discussed previously. In this case, the dynamic power regulation process reduces the power consumption of the gigabit transceiver by deactivating and bypassing the computational modules represented by the MDFE 602, the DFE 612 and the select logic 610. Since received symbols are relatively unaffected by channel induced ISI, there is no need to develop ISI compensation for incoming signal samples prior to symbol decode, and therefore no need for ISI compensation circuitry.

Figure 39:
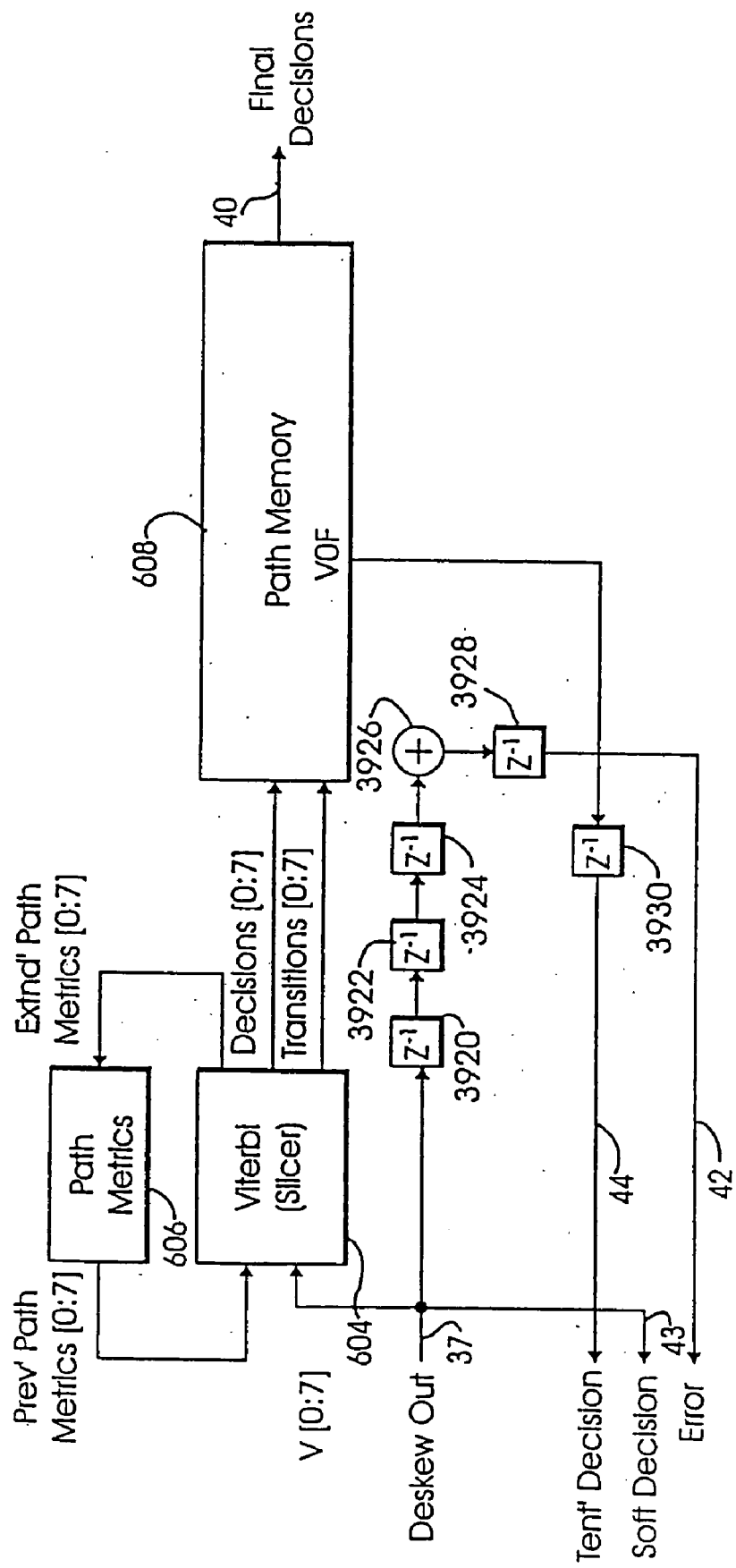
FIG. 39 is a block diagram of an exemplary trellis decoder as applied to a case in which there is substantially no intersymbol interference.

FIG. 39 is a simplified, semi-schematic block diagram of an exemplary trellis decoder 38 as it might be implemented in the case where it has been determined that there is substantially no channel induced intersymbol interference. Referring to FIG. 39, the 4-D output signal 37 from the deskew memory 36 is provided directly to the Viterbi decoder 604, as the Viterbi input. In accordance with the invention, it should be noted that, in the absence of intersymbol interference, only a single 4-D Viterbi input is needed in contrast to the eight state inputs required in the fall ISI compensation case.

As illustrated in FIG. 39, the DFE, MDFE and decoder circuitry has been replaced by a series of simple delay stages and an adder circuit, with the deskew output signal (a signal sample) directly input to the Viterbi decoder 604. The deskew output signal sample is also directed through a set of three series coupled sequential delay stages 3920, 3922 and 3924 and then to an adder circuit 3926. Signal samples are added to the negative of the first tentative decision $V_{OF}$ output by the path memory module 608 in the adder circuit 3926 in order to develop an error term. The error term is directed through an additional delay stage 3928 after which the error term 42 might be directed to an adaptive gain stage (34 of FIG. 2) and timing recovery circuit (222 of FIG. 2). In the exemplary embodiment shown in FIG. 39, the 4-D error 42 is computed as the delayed difference between the delayed 4-D input 37 and the 4-D output $V_{OF}$ of the path memory module 608. The corresponding 4-D tentative decision 44 may be represented as nothing more than a delayed version of the 4-D output $V_{OF}$ of the path memory module 608; the delay occurring in an additional delay stage 3930. In the embodiment shown in FIG. 39, the error and tentative decision delay elements 3928 and 3930, respectively, are used to ensure that the error 42 and the tentative decision 44 arrive at the timing recovery block (222 of FIG. 2) at the same time. Depending on the design and implementation of the timing recovery block, these delay elements may not necessarily be needed in alternative embodiments.

Figure 40:
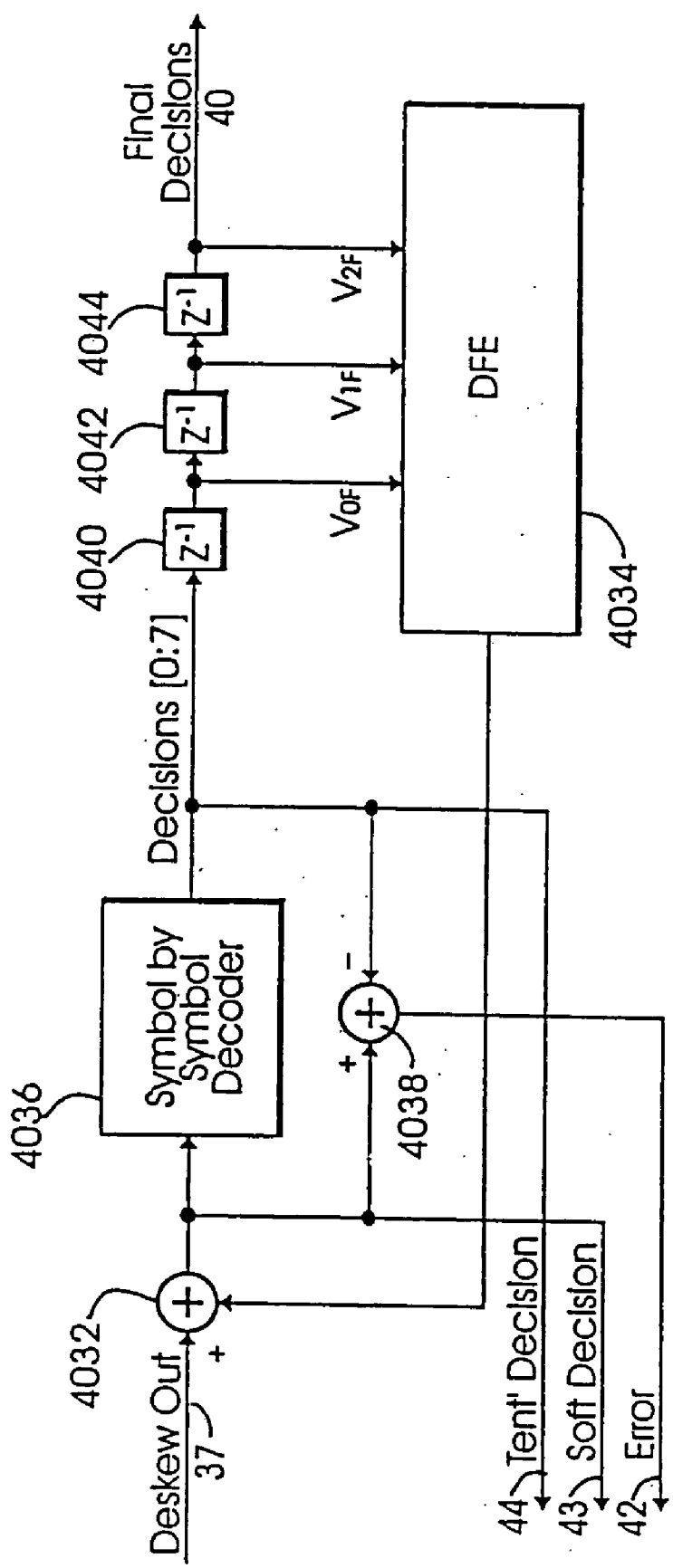
FIG. 40 is a simplified block diagram of an alternative embodiment of the invention in which power consumption is reduced by substitution of a symbol-by-symbol decoder in place of a Viterbi decoder.

FIG. 40 illustrates yet a further embodiment of the invention which is particularly advantageous in situations where the signal-to-noise ratio is very high (as may happen with a short cable, e.g., of less than 50 meters). In such situations, the coding gain provided by the trellis code may not be needed, and adequate system performance, as indicated by the bit error rate, may be achieved without making use of this coding gain. In these situations, substantial power dissipation reductions can be achieved by disabling the trellis decode enabling features of the complex Viterbi decoder, including the Viterbi decoder block 604, its associated path metric and path memory modules 606 and 608, and a large portion of the ISI compensation circuitry including the MDFE 302 and the select logic 610. These portions are replaced, or substituted, with a simple symbol-by-symbol decoder and a simple decision feedback equalizer to detect the received signal, instead of using the computationally complex Viterbi decoder.

Referring to FIG. 40, signal samples output by the deskew memory are directed through an adder circuit 4032, which determines the difference between the input signal samples and the 4-D output of a DFE 4034. A symbol-by-symbol decoder 4036 receives the difference between the 4-D signal samples and the 4-D output from the DFE 4034 and decodes it. A 4-D tentative decision 44 is taken directly from the output of the symbol-by-symbol decoder 4036, and an error term 42 is developed by an additional adder circuit 4038, coupled to define the difference between the input and the output of the symbol-by-symbol decoder 4036. A soft decision 43, which is used for display purposes only, is taken directly from the input of the symbol-by-symbol decoder 4036.

Final decisions are developed by delaying the output of the symbol-by-symbol decoder through three series coupled sequential delay stages 4040, 4042 and 4044. The output of each respective delay stage is directed to the DFE as a corresponding tentative decision $V_{0F}$, $V_{1F}$ and $V_{2F}$.

In each of the cases described in connection with FIGS. 39 and 40, it will be understood that the surviving elements of the decoder section are all present in a fully functional Viterbi decoder system with ISI compensation. Such a system is described in co-pending U.S. patent application entitled System and Method for High-Speed Decoding and ISI Compensation in a Multi-Pair Transceiver System, filed on instant date herewith and commonly owned by the assignee of the present invention, the entire contents of which are expressly incorporated by reference. As decisions are made with regard to the desirability of maintaining the circuitry in a fully operational condition or truncating certain computational sections in an effort to reduce power dissipation, the system need only remove power from certain identified portions of the circuitry, with other identified portions allowed to remain powered-up in the active signal path. No additional component circuit elements need be provided.

The dynamic power regulation methodology of the present invention can also be applied to any other component module of a communication system, so long as that module is able to provide a given minimal level of performance with a truncated functional representation or with truncated circuitry. Of course, such minimal performance levels will obtain in only certain situations and are dependent on external factors, particularly the transmission channel characteristics. However, these situations frequently appear in a substantial number of applications or installations. An integrated circuit transceiver capable of adaptively configuring itself to provide a "just sufficient" level of performance while operating at the lowest obtainable power dissipation levels would lend itself to almost universal application.

The present invention further provides a method and a timing recovery system for generating a set of clock signals in a processing system. The set of clock signals includes a set of sampling clock signals. The processing system includes a set of processing subsystems, each of which includes an analog section. Each of the analog sections operates in accordance with a corresponding sampling clock signals. An example of the processing system is a gigabit transceiver. In this case, the processing subsystems are the constituent transceivers. The present invention can be used to generate and distribute clock signals in a gigabit transceiver of a Gigabit Ethernet communication system such that effect of switching noise coupled from one clock domain to another clock domain is minimized. By "clock domain," it is meant the circuit blocks that are operating according to transitions of a particular clock signal. For ease of explanation, the present invention will be described in detail as applied to this exemplary application. However, this is not to be construed as a limitation of the present invention.

In order to appreciate the advantages of the present invention, it will be beneficial to describe the invention in the context of an exemplary bi-directional communication device, such as an Ethernet transceiver. The particular exemplary implementation chosen is depicted in FIG. 1, which is a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires.

In FIG. 1, the communication system is represented as a point-to-point system in order to simplify the explanation, and includes two main transceiver blocks 102 and 104, coupled together via four twisted-pair cables 112a, b, c and d. Each of the wire pairs 112a, b, c, d is coupled to each of the transceiver blocks 102, 104 through a respective one of four line interface circuits 106. Each of the wire pairs 112a, b, c, d facilitates communication of information between corresponding pairs of four pairs of transmitter/receiver circuits (constituent transceivers) 108. Each of the constituent transceivers 108 is coupled between a respective line interface circuit 106 and a Physical Coding Sublayer (PCS) block 110. At each of the transceiver blocks 102 and 104, the four constituent transceivers 108 are capable of operating simultaneously at 250 megabits of information data per second (Mb/s) each, and are coupled to the corresponding remote constituent transceivers through respective line interface circuits to facilitate full-duplex bi-directional operation. Thus, 1 Gb/s communication throughput of each of the transceiver blocks 102 and 104 is achieved by using four 250 Mb/s (125 Mbaud at 2 information data bits per symbol) constituent transceivers 108 for each of the transceiver blocks 102, 104 and four pairs of twisted copper cables to connect the two transceiver blocks 102, 104 together.

The exemplary communication system of FIG. 1 has a superficial resemblance to a 100BASE-T4 system, but is configured to operate at ten times the bit rate. As such, it should be understood that certain system performance characteristics, such as sampling rates and the like, will be consequently higher and cause a greater degree of power consumption. Also, at gigabit data rates over potentially noisy channels, a proportionately greater degree of signal processing is required in many instances to insure an adequate degree of signal fidelity and quality.

FIG. 2 is a simplified block diagram of the functional architecture and internal construction of an exemplary transceiver block, indicated generally at 200, such as transceiver 102 of FIG. 1. Since the illustrative transceiver application relates to gigabit Ethernet transmission, the transceiver will be referred to as the "gigabit transceiver." For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks and signal lines in the exemplary embodiment of FIG. 2 perform four-dimensional operations and carry four-dimensional (4-D) signals, respectively. By 4-D, it is meant that the data from the four constituent transceivers are used simultaneously. In order to clarify signal relationships in FIG. 2, thin lines correspond to 1-dimensional functions or signals (i.e., relating to only a single constituent transceiver), and thick lines correspond to 4-D functions or signals (relating to all four constituent transceivers).

Referring to FIG. 2, the gigabit transceiver 200 includes a Gigabit Medium Independent Interface (GMII) block 202 subdivided into a receive GMII circuit 202R and a transmit GMII circuit 202T. The transceiver also includes a Physical Coding Sublayer (PCS) block 204, subdivided into a receive PCS circuit 204R and a transmit PCS circuit 204T, a pulse shaping filter 206, a digital-to analog (D/A) converter block 208, and a line interface block 210, all generally encompassing the transmitter portion of the transceiver.

The receiver portion generally includes a highpass filter 212, a programmable gain amplifier (PGA) 214, an analog-to-digital (A/D) converter 216, an automatic gain control (AGC) block 220, a timing recovery block 222, a pair-swap multiplexer block 224, a demodulator 226, an offset canceller 228, a near-end crosstalk (NEXT) canceller block 230 having three constituent NEXT cancellers and an echo canceller 232.

The gigabit transceiver 200 also includes an A/D first-in-first-out buffer (FIFO) 218 to facilitate proper transfer of data from the analog clock region to the receive clock region, and a loopback FIFO block (LPBK) 234 to facilitate proper transfer of data from the transmit clock region to the receive clock region. The gigabit transceiver 200 can optionally include an additional adaptive filter to cancel far-end crosstalk noise (FEXT canceller).

In operational terms, on the transmit path, the transmit section 202T of the GMII block receives data from the Media Access Control (MAC) module in byte-wide format at the rate of 125 MHz and passes them to the transmit section 204T of the PCS block via the FIFO 201. The FIFO 201 ensures proper data transfer from the MAC layer to the Physical Coding (PHY) layer, since the transmit clock of the PHY layer is not necessarily synchronized with the clock of the MAC layer. In one embodiment, this small FIFO 201 has from about three to about five memory cells to accommodate the elasticity requirement which is a function of frame size and frequency offset.

The PCS transmit section 204T performs certain scrambling operations and, in particular, is responsible for encoding digital data into the requisite codeword representations appropriate for transmission. In the illustrated embodiment of FIG. 2, the transmit PCS section 204T incorporates a coding engine and signal mapper that implements a trellis coding architecture, such as required by the IEEE 802.3ab specification for gigabit transmission.

In accordance with this encoding architecture, the PCS transmit section 204T generates four 1-D symbols, one for each of the four constituent transceivers. The 1-D symbol generated for the constituent transceiver depicted in FIG. 2 is filtered by the pulse shaping filter 206. This filtering assists in reducing the radiated emission of the output of the transceiver such that it falls within the parameters required by the Federal Communications Commission. The pulse shaping filter 206 is implemented so as to define a transfer function of $0.75+0.25z^{-1}$. This particular implementation is chosen so that the power spectrum of the output of the transceiver falls below the power spectrum of a 100Base-Tx signal. The 100Base-Tx is a widely used and accepted Fast Ethernet standard for 100 Mb/s operation on two pairs of Category-5 twisted pair cables. The output of the pulse shaping filter 206 is converted to an analog signal by the D/A converter 208 operating at 125 MHz. The analog signal passes through the line interface block 210, and is placed on the corresponding twisted pair cable.

On the receive path, the line interface block 210 receives an analog signal from the twisted pair cable. The received analog signal is preconditioned by the highpass filter 212 and the PGA 214 before being converted to a digital signal by the A/D converter 216 operating at a sampling rate of 125 MHz. The timing of the A/D converter 216 is controlled by the output of the timing recovery block 222. The resulting digital signal is properly transferred from the analog clock region to the receive clock region by the A/D FIFO 218. The output of the A/D FIFO 218 is also used by the AGC 220 to control the operation of the PGA 214.

The output of the A/D FIFO 218, along with the outputs from the A/D FIFOs of the other three constituent transceivers are inputted to the pair-swap multiplexer block 224. The pair-swap multiplexer block 224 uses the 4-D pair-swap control signal from the receive section 204R of PCS block to sort out the four input signals and send the correct signals to the respective feedforward equalizers 26 of the demodulator 226. This pair-swapping control is needed for the following reason. The trellis coding methodology used for the gigabit transceivers (102 and 104 of FIG. 1) is based on the fact that a signal on each twisted pair of wire corresponds to a respective 1-D constellation, and that the signals transmitted over four twisted pairs collectively form a 4-D constellation. Thus, for the decoding to work, each of the four twisted pairs must be uniquely identified with one of the four dimensions. Any undetected swapping of the four pairs would result in erroneous decoding. In an alternate embodiment of the gigabit transceiver, the pair-swapping control is performed by the demodulator 226, instead of the combination of the PCS receive section 204R and the pair-swap multiplexer block 224.

The demodulator 226 includes a feed-forward equalizer (FFE) 26 for each constituent transceiver, coupled to a deskew memory circuit 36 and a decoder circuit 38, implemented in the illustrated embodiment as a trellis decoder. The deskew memory circuit 36 and the trellis decoder 38 are common to all four constituent transceivers. The FFE 26 receives the received signal intended for it from the pair-swap multiplexer block 224. The FFE 26 is suitably implemented to include a precursor filter 28, a programmable inverse partial response (IPR) filter 30, a summing device 32, and an adaptive gain stage 34. The FFE 26 is a least-mean-squares (LMS) type adaptive filter which is configured to perform channel equalization as will be described in greater detail below.

The precursor filter 28 generates a precursor to the input signal 2. This precursor is used for timing recovery. The transfer function of the precursor filter 28 might be represented as $-\gamma+z^{-1}$, with $\gamma$ equal to $\frac{1}{16}$ for short cables (less than 80 meters) and $\frac{1}{8}$ for long cables (more than 80 m). The determination of the length of a cable is based on the gain of the coarse PGA 14 of the programmable gain block 214.

The programmable IPR filter 30 compensates the ISI (intersymbol interference) introduced by the partial response pulse shaping in the transmitter section of a remote transceiver which transmitted the analog equivalent of the digital signal 2. The transfer function of the IPR filter 30 may be expressed as $1/(1+Kz^{-1})$. In the present example, K has an exemplary value of 0.484375 during startup, and is slowly ramped down to zero after convergence of the decision feedback equalizer included inside the trellis decoder 38. The value of K may also be any positive value strictly less than 1.

The summing device 32 receives the output of the IPR filter 30 and subtracts therefrom adaptively derived cancellation signals received from the adaptive filter block, namely signals developed by the offset canceller 228, the NEXT cancellers 230, and the echo canceller 232. The offset canceller 228 is an adaptive filter which generates an estimate of signal offset introduced by component circuitry of the transceivers analog front end, particularly offsets introduced by the PGA 214 and the A/D converter 216.

The three NEXT cancellers 230 may also be described as adaptive filters and are used, in the illustrated embodiment, for modeling the NEXT impairments in the received signal caused by interference generated by symbols sent by the three local transmitters of the other three constituent transceivers. These impairments are recognized as being caused by a crosstalk mechanism between neighboring pairs of cables, thus the term near-end crosstalk, or NEXT. Since each receiver has access to the data transmitted by the other three local transmitters, it is possible to approximately replicate the NEXT impairments through filtering. Referring to FIG. 2, the three NEXT cancellers 230 filter the signals sent by the PCS block to the other three local transmitters and produce three signals replicating the respective NEXT impairments. By subtracting these three signals from the output of the IPR filter 30, the NEXT impairments are approximately cancelled.

Due to the bi-directional nature of the channel, each local transmitter causes an echo impairment on the received signal of the local receiver with which it is paired to form a constituent transceiver. In order to remove this impairment, an echo canceller 232 is provided, which may also be characterized as an adaptive filter, and is used, in the illustrated embodiment, for modeling the signal impairment due to echo. The echo canceller 232 filters the signal sent by the PCS block to the local transmitter associated with the receiver, and produces an approximate replica of the echo impairment. By subtracting this replica signal from the output of the IPR filter 30, the echo impairment is approximately cancelled.

The adaptive gain stage 34 receives the processed signal from the summing circuit 32 and fine tunes the signal path gain using a zero-forcing LMS algorithm. Since this adaptive gain stage 34 trains on the basis of error signals generated by the adaptive filters 228, 230 and 232, it provides a more accurate signal gain than the one provided by the PGA 214 in the analog section.

The output of the adaptive gain stage 34, which is also the output of the FFE 26, is inputted to the deskew memory circuit 36. The deskew memory 36 is a four-dimensional function block, i.e., it also receives the outputs of the three FFEs of the other three constituent transceivers. There may be a relative skew in the outputs of the four FFEs, which are the four signal samples representing the four symbols to be decoded. This relative skew can be up to 50 nanoseconds, and is due to the variations in the way the copper wire pairs are twisted. In order to correctly decode the four symbols, the four signal samples must be properly aligned. The deskew memory aligns the four signal samples received from the four FFEs, then passes the deskewed four signal samples to a decoder circuit 38 for decoding.

In the context of the exemplary embodiment, the data received at the local transceiver was encoded before transmission, at the remote transceiver. In the present case, data might be encoded using an 8-state four-dimensional trellis code, and the decoder 38 might therefore be implemented as a trellis decoder. In the absence of intersymbol interference (ISI), a proper 8-state Viterbi decoder would provide optimal decoding of this code. However, in the case of Gigabit Ethernet, the Category-5 twisted pair cable introduces a significant amount of ISI. In addition, the partial response filter of the remote transmitter on the other end of the communication channel also contributes some ISI. Therefore, the trellis decoder 38 must decode both the trellis code and the ISI, at the high rate of 125 MHz. In the illustrated embodiment of the gigabit transceiver, the trellis decoder 38 includes an 8-state Viterbi decoder, and uses a decision-feedback sequence estimation approach to deal with the ISI components.

The 4-D output of the trellis decoder 38 is provided to the PCS receive section 204R. The receive section 204R of the PCS block de-scrambles and decodes the symbol stream, then passes the decoded packets and idle stream to the receive section 202T of the GMII block which passes them to the MAC module. The 4-D outputs, which are the error and tentative decision, respectively, are provided to the timing recovery block 222, whose output controls the sampling time of the A/D converter 216. One of the four components of the error and one of the four components of the tentative decision correspond to the receiver shown in FIG. 2, and are provided to the adaptive gain stage 34 of the FFE 26 to adjust the gain of the equalizer signal path. The error component portion of the decoder output signal is also provided, as a control signal, to adaptation circuitry incorporated in each of the adaptive filters 230 and 232. Adaptation circuitry is used for the updating and training process of filter coefficients.

For the exemplary gigabit transceiver system 200 described above and shown in FIG. 2, there is a PHY Control system (not shown) which provides control signals to the blocks shown in FIG. 2, including the timing recovery block 222, to control their functions.

For the exemplary gigabit transceiver system 200 described above and shown in FIG. 2, there are design considerations regarding the allocation of boundaries of the clock domains. These design considerations are dependent on the clocking relationship between transmitters and receivers in a gigabit transceiver. Therefore, this clocking relationship will be discussed first.

During a bidirectional communication between two gigabit transceivers 102, 104 (FIG. 1), through a process called "auto-negotiation," one of the gigabit transceivers assumes the role of the master while the other assumes the role of the slave. When a gigabit transceiver assumes one of the two roles with respect to the remote gigabit transceiver, each of its constituent transceivers assumes the same role with respect to the corresponding one of the remote constituent transceivers. Each constituent transceiver 108 is constructed such that it can be dynamically configured to act as either the master or the slave with respect to a remote constituent transceiver 108 during a bidirectional communication. The clocking relationship between the transmitter and receiver inside the constituent transceiver 108 depends on the role of the constituent transceiver (i.e., master or slave) and is different for each of the two cases.

Figure 19:
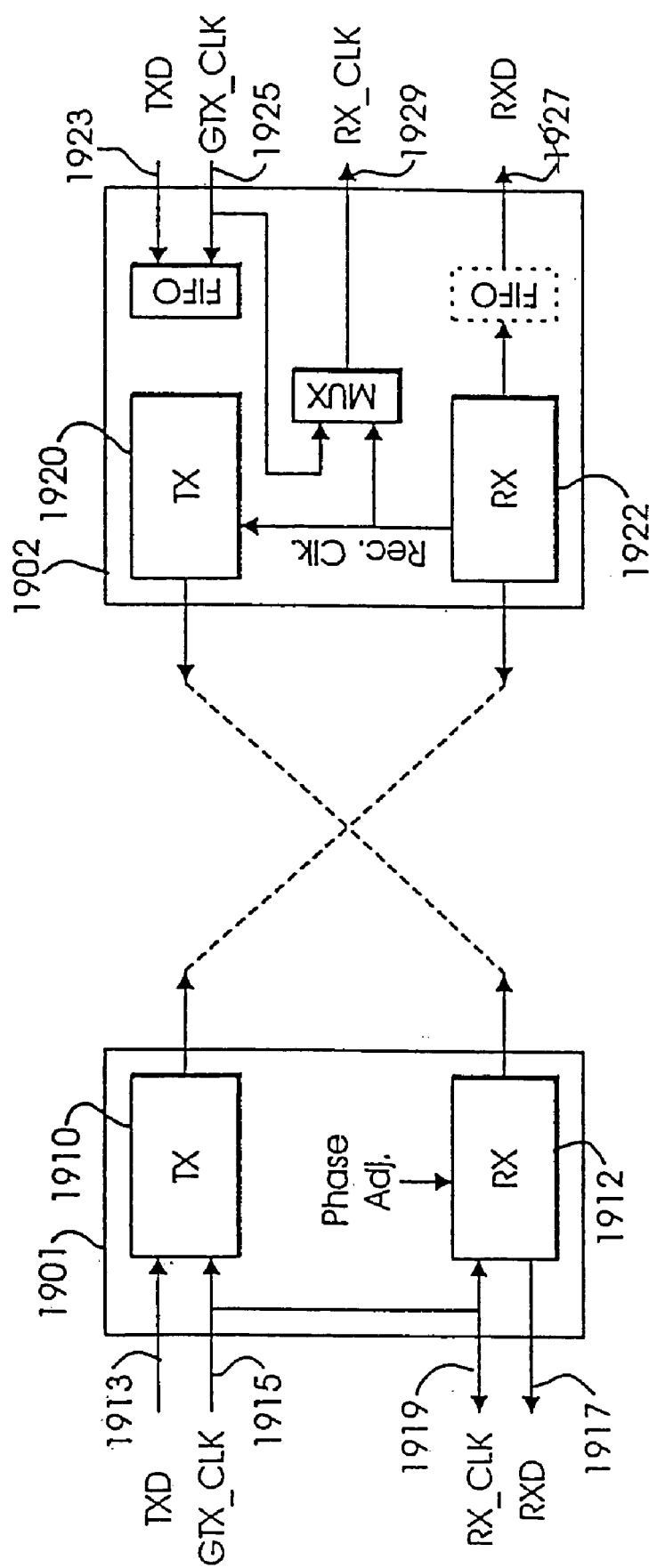
FIG. 19 illustrates the general clocking relationship between the transmitter and the receiver inside each of the four constituent transceivers 108 of the gigabit Ethernet transceiver (101 or 102) of FIG. 1.

FIG. 19 illustrates the general clocking relationship on the conceptual level between the transmitter and the receiver of the gigabit Ethernet transceiver (102 or 104) of FIG. 1. For this conceptual FIG. 19, the transmitter TX represents the four constituent transmitters and the receiver RX represents the four constituent receivers.

Referring to FIG. 19, the gigabit transceiver 1901 acts as the master while the gigabit transceiver 1902 acts as the slave. The master 1901 includes a transmitter 1910 and a receiver 1912. The slave 1902 includes a transmitter 1920 and a receiver 1922. The transceiver 1901 (respectively, 1902) receives from the GMII 202T (FIG. 2) the data to be transmitted TXD via its input 1913 (respectively, 1923), and the GMII transmit clock GTX_CLK (this clock is also called "gigabit transmit clock" in the IEEE 802.3ab standard) via its input 1915 (respectively, 1925). The transceiver 1901 (respectively, 1902) sends to the GMII 202R (FIG. 2) the received data RXD via its output 1917 (respectively, 1927), and the GMII receive clock RX_CLK (this clock is also called "gigabit receive clock" in the IEEE 802.3ab standard) via its output 1919 (respectively, 1929). It is noted that the clocks GTX_CLK and RX_CLK may be different from the transmit clock TCLK and receive clock RCLK, respectively, of a gigabit transceiver.

The receiver 1922 of the slave 1902 synchronizes its receive clock to the transmit clock of the transmitter 1910 of the master 1901 in order to properly receive the data transmitted by the transmitter 1910. The transmit clock of the transmitter 1920 of the slave 1902 is essentially the same as the receive clock of the receiver 1922, thus it is also synchronized to the transmit clock of the transmitter 1910 of the master 1901.

The receiver 1912 of the master 1901 is synchronized to the transmit clock of the transmitter 1920 of the slave 1902 in order to properly receive data sent by the transmitter 1920. Because of the synchronization of the receive and transmit clocks of the slave 1902 to the transmit clock of transmitter 1910 of the master 1901, the receive clock of the receiver 1912 is synchronized to the transmit clock of the transmitter 1910 with a phase delay (due to the twisted pairs of cables). Thus, in the absence of jitter, after synchronization, the receive clock of receiver 1912 tracks the transmit clock of transmitter 1910 with a phase delay. In other words, in principle, the receive clock of receiver 1912 has the same frequency as the transmit clock of transmitter 1910, but with a fixed phase delay.

However, in the presence of jitter or a change in the cable response, these two clocks may have different instantaneous frequencies (frequency is derivative of phase with respect to time). This is due to the fact that, at the master 1901, the receiver 1912 needs to dynamically change the relative phase of its receive clock with respect to the transmit clock of transmitter 1910 in order to track jitter in the incoming signal from the transmitter 1920 or to compensate for the change in cable response. Thus, in practice, the transmit and receive clocks of the master 1901 may be actually independent. At the master, this independence creates an asynchronous boundary between the transmit clock domain and the receive clock domain. By "transmit clock domain," it is meant the region where circuit blocks are operated in accordance with transitions in the transmit clock signal TCLK. By "receive clock domain," it is meant the region where circuit blocks are operated in accordance with transitions in the receive clock signal RCLK. In order to avoid any loss of data when data cross the asynchronous boundary between the transmit clock domain and the receive clock domain inside the master 1901, FIFOs are used at this asynchronous boundary. For the exemplary structure of the gigabit transceiver shown in FIG. 2, FIFOs 234 (FIG. 2) are placed at this asynchronous boundary. Since a constituent transceiver 108 (FIG. 1) is constructed such that it can be configured as a master or a slave, the FIFOs 234 (FIG. 2) are also included in the slave 1902 (FIG. 19).

At the slave 1902, the transmit clock TCLK of transmitter 1920 is phase locked to the receive clock RCLK of receiver 1922. Thus, TCLK may be different from GTX_CLK, a FIFO 1930 is needed for proper transfer of data TXD from the MAC (not shown) to the transmitter 1920. The depth of the FIFO 1930 must be sufficient to absorb any loss during the length of a data packet. The multiplexer 1932 allows to use either the GTX_CLK or the receive clock RCLK of receiver 1922 as the signal RX_CLK 1929. When the GTX_CLK is used as the RX_CLK 1929, the FIFO 1934 is needed to ensure proper transfer of data RXD 1927 from the receiver 1922 to the MAC.

For the conceptual block diagram of FIG. 19, there are one transmit clock TCLK and one receive clock RCLK for a gigabit transceiver. The transmit clock TCLK is common to all four constituent transceivers since data transmitted simultaneously on all four twisted pairs of cable correspond to 4D symbols. Since data received from the four twisted pairs of cable are to be decoded simultaneously into 4D symbols, it is an efficient design to have all the digital processing blocks clocked by one clock signal RCLK. However, due the different cable responses of the four twisted pairs of cable, the A/D converter 216 (FIG. 2) of each of the four constituent transceivers requires a distinct sampling clock signal. Thus, in addition to the signals TCLK and RCLK, the gigabit transceiver system 200 requires four sampling clock signals.

There is an alternative structure for the gigabit transceiver where the partition of clock domains is different than the one shown in FIG. 2. This alternative structure (not shown explicitly) is similar to the one shown in FIG. 2 and only differs in that its transmit clock domain includes both the transmit clock domain and the receive clock domain of FIG. 2, and that the FIFO block 234 is not needed. In other words, in this alternative structure, the receive clock RCLK is the same as the transmit clock TCLK, and the transmit clock TCLK is used to clock both the transmitter and most of the receiver. The advantage of this alternative structure is that there is no asynchronous boundary between the transmit region and most of the receive region, thus allowing the echo canceller 232 and NEXT cancellers 230 to work with only one clock signal. The disadvantage of this alternative structure is that there is a potential for a performance penalty at the master when the constituent transceivers are tracking jitter. As a result of tracking jitter, the relative phase of a sampling clock signal with respect to the transmit clock TCLK may vary dynamically. This could cause the A/D converter to sample at noisy instants where transistors in circuit blocks operating according to the clock signal TCLK are switching. Thus, the alternative structure is not as good as the structure shown in FIG. 2, with respect to the switching noise problem.

Figure 20:
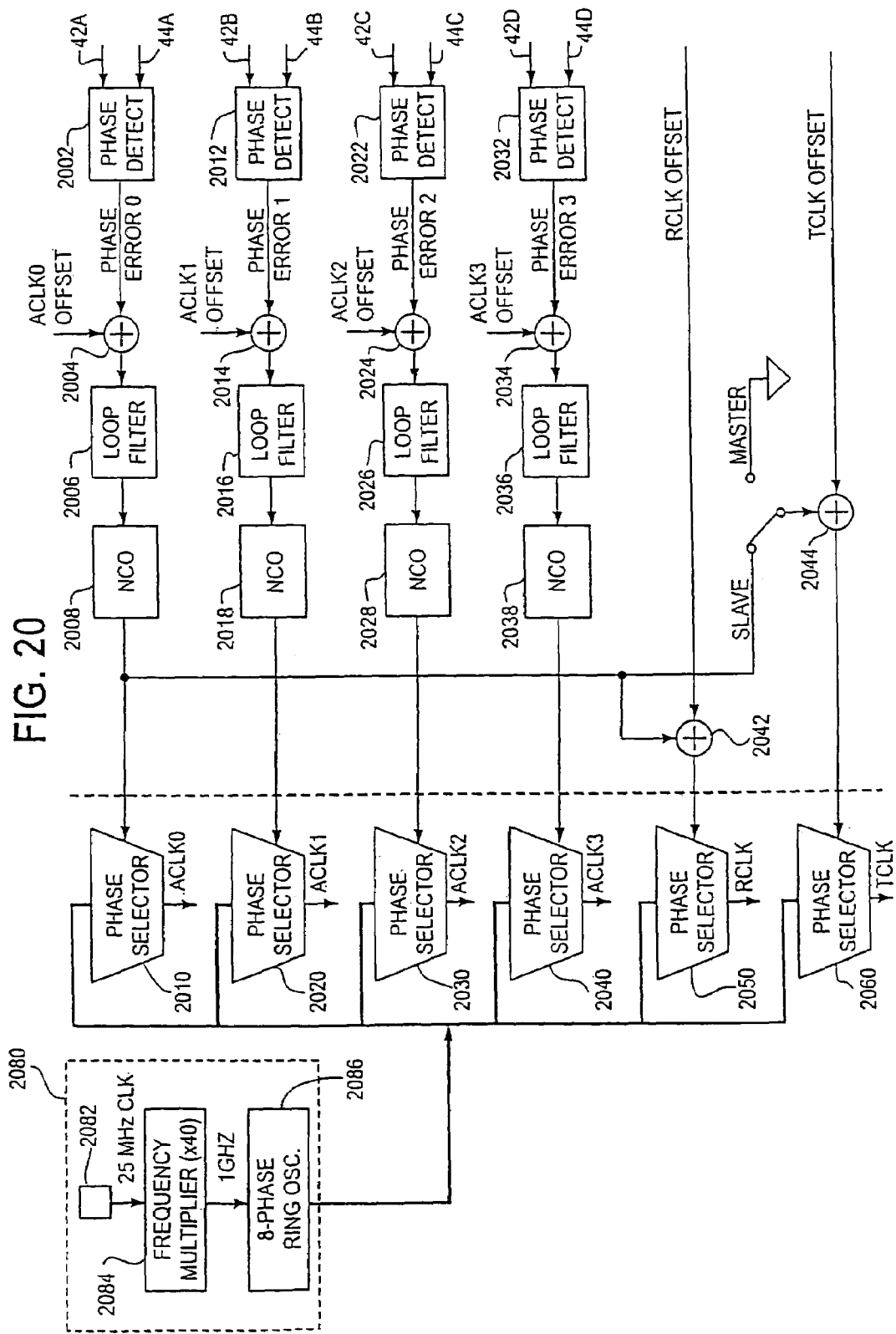
FIG. 20 is a simplified block diagram of an embodiment of the timing recovery system constructed according to the present invention.

FIG. 20 is a simplified block diagram of an embodiment of the timing recovery system constructed according to the present invention and applied to the gigabit transceiver architecture of FIG. 2. The timing recovery system 222 (FIGS. 2 and 3) generates the different clock signals for the exemplary gigabit transceiver shown in FIG. 2, namely, the sampling clock signals ACLK0, ACLK1, ACLK2, ACLK3, the receive clock signal RCLK, and the transmit clock signal TCLK.

The timing recovery system 222 includes a set of phase detectors 2002, 2012, 2022, 2032, a set of loop filters 2006, 2016, 2026, 2036, a set of numerically controlled oscillators (NCO) 2008, 2018, 2028, 2038 and a set of phase selectors 2010, 2020, 2030, 2040, 2050, 2060. The adders 2004, 2014, 2024, 2034 are shown for conceptual illustration purpose only. In practice, these adders are implemented within the respective phase detectors 2002, 2012, 2022, 2032. The RCLK Offset is used to adjust the phase of the receive clock signal RCLK in order to reduce the effects of switching noise on the sampling operations of the corresponding A/D converters 216 (FIG. 2). Three of the four signals ACLK0 Offset, ACLK1 Offset, ACLK2 Offset, ACLK3 Offset are used to slightly adjust the phases of the respective sampling clocks ACLK0 through ACLK4 in order to further reduce these effects of switching noise. The phase adjustments of the receive clock RCLK and the sampling clocks ACLK0 B 3 are not a necessary function of the timing recovery system 222. However, the method and system for generating these phase adjustment signals constitute another novel aspect of the present invention and will be described in detail later.

Each of the phase detectors 2002, 2012, 2022, 2032 receives the corresponding 1D component of the 4D slicer error 42 (FIGS. 2 and 3) and the corresponding 1D component of the 4D tentative decision 44 (FIGS. 2 and 3) from the decoder 38 (FIG. 2) to generate a corresponding phase error. The phase errors 0 through 3 are inputted to the loop filters 2006, 2016, 2026, 2036, respectively. The loop filters 2006, 2016, 2026, 2036 generate and output filtered phase errors to the NCOs 2008, 2018, 2028, 2038. The loop filters 2006, 2016, 2026, 2036 can be of any order. In one embodiment, the loop filters are of second order. The NCOs 2008, 2018, 2028, 2038 generate phase control signals from the filtered phase errors. The phase selectors 2010, 2020, 2030, 2040 receive corresponding phase control signals from the NCOs 2008, 2018, 2028, 2038, respectively. Each of the phase selectors 2010, 2020, 2030, 2040 selects one out of several phases of the multi-phase signal 2070 based on the value of the corresponding phase control signal, and outputs the corresponding sampling clock signal. In one embodiment of the invention, the multi-phase signal has 64 phases.

The multi-phase signal 2070 is generated by a clock generator 2080. In the exemplary embodiment illustrated in FIG. 20, the clock generator 2080 includes a crystal oscillator 2082, a frequency multiplier 2084 and an 8-phase ring oscillator 2086. The crystal oscillator 2082 produces a 25 MHz clock signal. The frequency multiplier 2084 multiplies the frequency of the 25 MHz clock signal by 40 and produces a 1 GHz clock signal. From the 1 GHz clock signal, the 8-phase ring oscillator 586 produces the 8 GHz 64-phase signal 2070.

The receive clock signal RCLK, which is used to clock all the circuit blocks in the receive clock domain (which include all the digital signal processing circuit blocks in FIG. 2), can be generated independently of the sampling clock signals ACLK0 through ACLK3. However, for design efficiency, RCLK is chosen to be related to one of the sampling clock signals ACLK0 through ACLK3. For the exemplary embodiment illustrated in FIG. 20, the receive clock signal RCLK is related to the sampling clock signal ACLK0. The receive clock signal RCLK is generated by inputting the sum of the phase control signal outputted from the NCO 2008 and the RCLK Offset via an adder 2042 to the phase selector 2050. Based on this sum, the phase selector 2050 selects one of the 64 phases of the multi-phase signal 2070 and outputs the receive clock signal RCLK. Thus, when the RCLK Offset is zero, the receive clock signal RCLK is the same as the sampling clock ACLK0.

As discussed previously in relation to FIG. 19, when the constituent transceiver is configured as the master, its transmit clock TCLK is practically independent of its receive clock RCLK. In FIG. 20, when the constituent transceiver is the master, the transmit clock signal TCLK is generated by inputting the signal TCLK Offset, generated by the PHY Control system of the gigabit transceiver, to the phase selector 2060. Based on the TCLK Offset, the phase selector 2060 selects one of the 64 phases of the multi-phase signal 2070 and produces the transmit clock signal TCLK. When the constituent transceiver is the slave, the transmit clock signal TCLK is generated by inputting the sum of the output of the NCO 2008 and the signal TCLK Offset, via the adder 2042, to the phase selector 2060. Based on this sum, the phase selector 2060 selects one of the 64 phases of the multi-phase signal 2070 and produces the transmit clock signal TCLK. Thus, at the slave, the transmit clock signal TCLK and the receive clock signal RCLK are phase-locked (as discussed previously in relation to FIG. 19).

It is important to note that, referring to FIG. 20, the function performed by the combination of an NCO (2008, 2018, 2028, 2038) followed by a phase selector (2110, 2120, 2130, 2140, 2150, 2160) can be implemented by analog circuitry. The analog circuitry can be described as follows. Each of the filtered phase errors outputted from the loop filters (2006, 2016, 2026, 2036) would be inputted to a D/A converter to be converted to analog form. Each of the analog filtered phase errors would then be inputted to a voltage-controlled oscillator (VCO). The VCOs would produce the clock signals. The VCOs can be implemented with well-known analog techniques such as those using varactor diodes.

Figure 21:
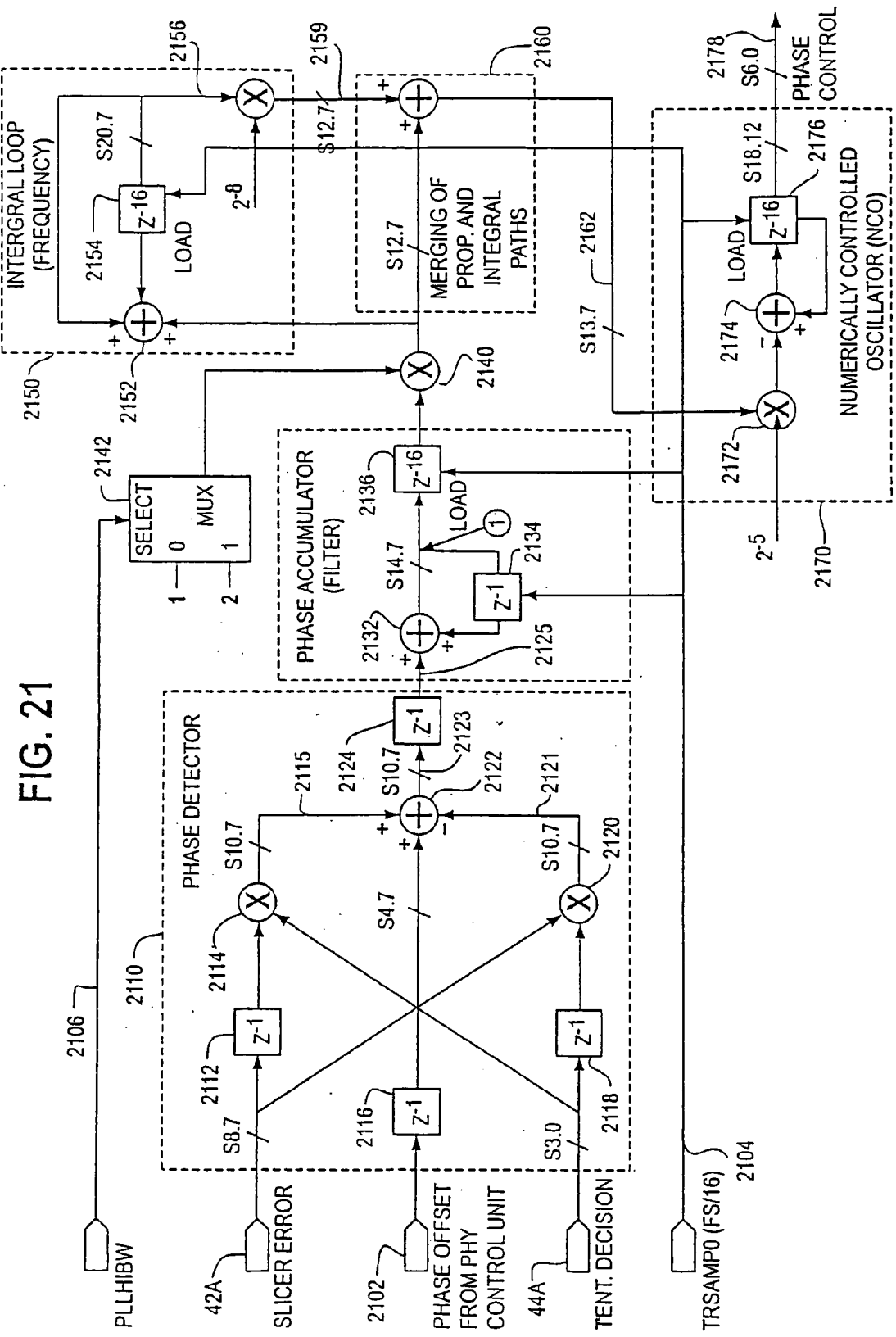
FIG. 21 is a block diagram of an exemplary implementation of the system of FIG. 20.

FIG. 21 is a block diagram illustrating a detailed implementation of the phase detectors 2002, 2012, 2022, 2032, the loop filters 2006, 2016, 2026, 2036, and the NCOs 2008, 2018, 2028, 2038 of FIG. 20.

It is important to note that the 4D path connecting the phase detectors 2002, 2012, 2022, 2032, the loop filters 2006, 2016, 2026, 2036, the NCOS 2008, 2018, 2028, 2038 and the phase selectors 2010, 2020, 2030, 2040 (FIG. 20) can be thought of as the 4D forward path of a phase locked loop whose 4D feedback path goes from, referring now to FIG. 2, the A/D converters 216 to the demodulator 226 then back to the timing recovery 222. The input to this phase locked loop is actually phase information embedded in the slicer error 42 and tentative decision 44, and the phase locked loop output is the phases of the sampling clock signals. This phase locked loop is digital but can be approximated by a continuous-time phase locked loop for practical design analysis purpose, as long as the sampling rate is much larger than the bandwidth of the loop. The theoretical transfer function of a continuous-time second-order phase locked loop is:

$$\frac{\theta(s)}{\Theta(s)} = \frac{K_L \cdot s \cdot K_L K_1}{s^2 + K_L \cdot s + K_L \cdot K_1}$$

where the transfer function of the loop filter is:

$$L(s) = K_L \cdot \left(1 + \frac{K_1}{s}\right) = K_v \cdot K_d \cdot \left(1 + \frac{K_1}{s}\right)$$

where $K_v$ is the gain of the voltage-controlled oscillator, $K_d$ is the gain of the phase detector, $K_L = K_v \cdot K_d$ and $K_I$ is the gain of the integrator inside the loop filter. For the digital phase locked loop of the present invention, the gain parameters $K_v$ and $K_I$ can be computed from the word lengths and scale factors used in implementing the NCO and the integrator of the loop filter. However, the gain of the phase detector $K_d$ is more conveniently computed by simulation. The gain parameters are used for the design and analysis of the digital phase locked loop.

FIG. 21 shows a phase detector 2110, a first filter 2130, a second filter 2150, an adder 2160 and an NCO 2170. The phase detector 2110 is an exemplary embodiment of the phase detectors 2002, 2012, 2022, 2032 of FIG. 20. The combination of the first filter 2130, the second filter 2150 and the adder 2160 is an exemplary embodiment of the loop filters 2006, 2016, 2026, 2036 of FIG. 20. The NCO 2170 is an exemplary embodiment of the NCOs 2008, 2018, 2028, 2038 of FIG. 20.

Figure 22:
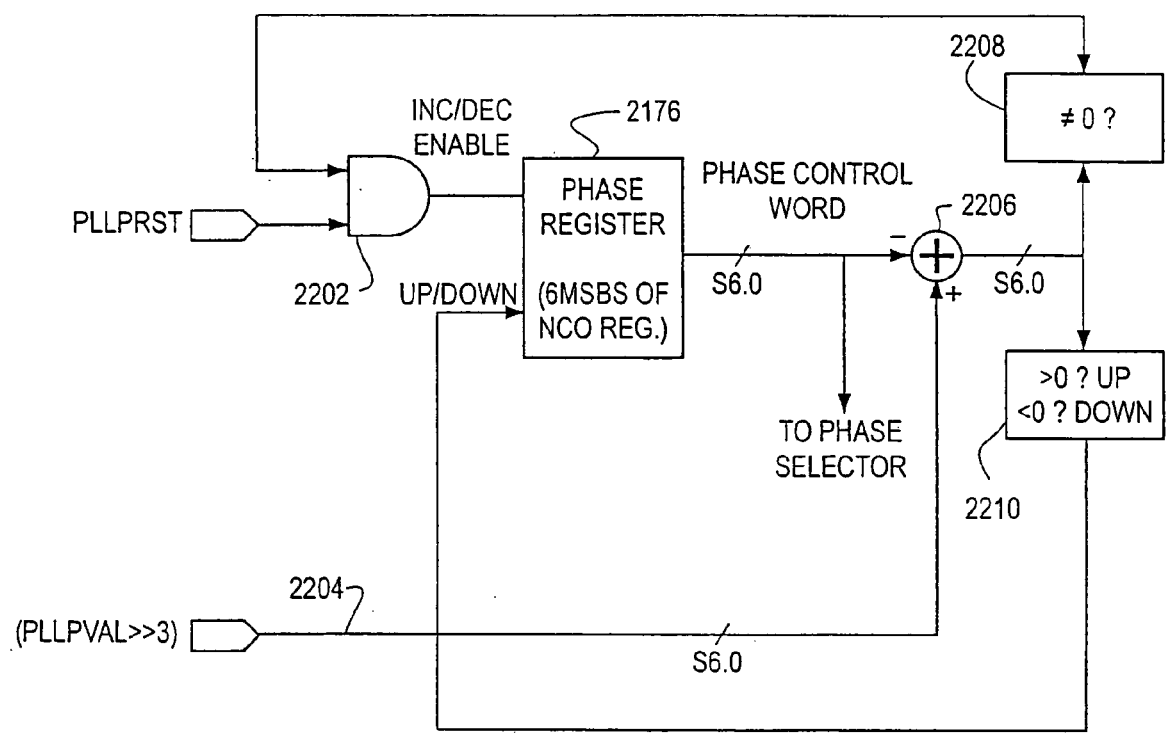
FIG. 22 is a block diagram of an exemplary embodiment of the phase reset logic block used for resetting the register of the NCO of FIG. 21 to a specified value.
Figure 23:
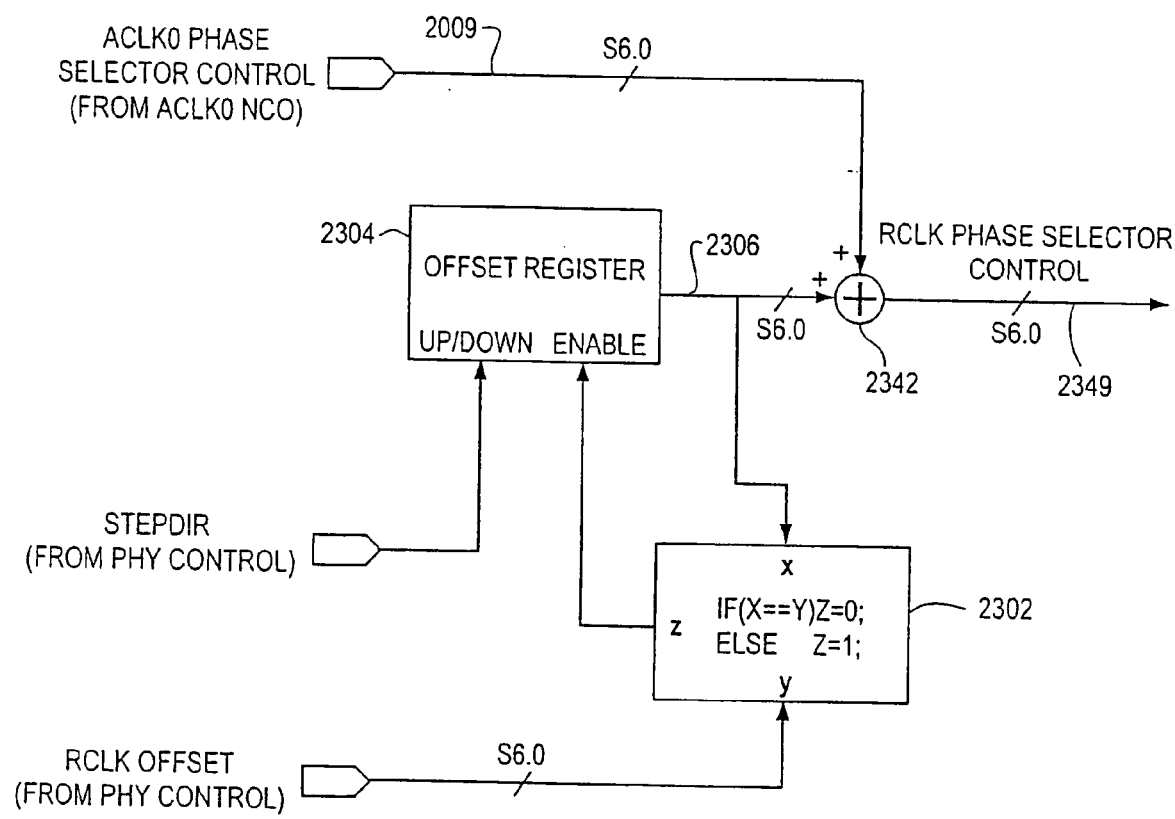
FIG. 23 is a block diagram of an exemplary phase shifter logic block used for the phase control of the receive clock signal RCLK.

In FIGS. 21 through 23, the numbers in the form "Sn.k" indicate the format of the data, where S denotes a signed number, "n" denotes the total number of bits and "k" denotes the number of bits after the decimal point.

The phase detector 2110 includes a lattice structure having two delay elements 2112, 2118, two multipliers 2114, 2120 and an adder 2122. The phase detector 2110 receives as inputs the corresponding 1D component of the 4D slicer error 42 (FIGS. 2 and 3) and the corresponding 1D component of the 4D tentative decision 44 (FIGS. 2 and 3) from the trellis decoder 38 (FIGS. 2 and 3). For simplicity, in FIG. 21, these two 1D components are labeled as 42A and 44A, respectively. It is understood that, for the phase detector of each of the four constituent transceivers of the gigabit transceiver, a distinct 1D component of the slicer error 42 and a distinct 1D component of the tentative decision 44 are used as inputs. On the upper branch of the lattice structure, the slicer error 42 is delayed by one unit of time (here, one symbol period) via the delay element 2112, then multiplied by the tentative decision 44A to produce a pre-cursor phase error 2115. The pre-cursor phase error 2115, when accumulated over time, represents the correlation between a past slicer error and a present tentative decision, thus indicates the sampling phase error with respect to the zero-crossing point at the start of the signal pulse (this zero-crossing point is part of the pre-cursor introduced by design to the signal pulse by the precursor filter 28 of the FFE 26 in FIG. 2). On the lower branch of the lattice structure, the tentative decision 44A is delayed by one unit of time via the delay element 2118, then multiplied by the slicer error 42A to produce a post-cursor phase error 2121.

The post-cursor phase error 2121, when accumulated over time, represents the correlation between a present slicer error and a past tentative decision, thus indicates the sampling phase error with respect to the level-crossing point in the tail end of the signal pulse. In one embodiment, this level-crossing point is determined by the first tap coefficient of the DFE 312 of FIG. 3. At the zero-crossing point at the start of the signal pulse, the slope of the signal pulse is positive, while at the level-crossing point at the tail end of the signal pulse, the slope of the signal pulse is negative. Thus, the pre-cursor phase error 2115 and the post-cursor phase error 2121 must be combined with opposite signs in the adder 2122. The combination of the pre-cursor 2115 and post-cursor phase errors 2121 produces the phase error associated with one of the sampling clock signals ACLK0 B ACLK3. This is the phase error indicated as one of the phase errors 0 through 3 in FIG. 20.

The phase offset 2102 is one of the sampling clock offset signals ACLK0 Offset through ACLK3 Offset in FIG. 20. The phase offset 2102, when needed, is generated by the PHY Control system of the gigabit transceiver. The phase offset 2102 is delayed by one unit of time then is added to the combination of the pre-cursor error 2115 and post-cursor 2121 via the adder 2122 to produce an adjusted phase error. The adjusted phase error 2123 is stored in the delay element 2124 and outputted to the first filter 2130 at the next clock transition. The delay element 2124 is used to prevent the propagation delay of the adder 2122 from concatenating with the propagation delay of the adder 2132 in the first filter 2130.

The first filter 2130, termed "phase accumulator," accumulates the phase error 2125 outputted by the phase detector 610 over a period of time then outputs the accumulated result at the end of the period of time. In the exemplary embodiment shown in FIG. 21, this period of time is 16 symbol periods. The first filter 2130 is an "accumulate-and-dump" filter which includes the adder 2132, a delay element (i.e., register) 2134, and a 16-units-of-time register. 2136. The register 2126 outputs a lowpass filtered phase error 2127 at the rate of one per period of the TRSAMP0 2104 clock, that is, one every 16 symbol periods. When the register 2126 outputs the lowpass filtered phase error 2127, the register 2134 is cleared and the accumulation of phase error 2125 restarts. It is noted that, downstream from the register 2126, circuits are clocked at one sixteenth of the symbol rate.

The filtered phase error 2137 is inputted to a multiplier 2140 where it is multiplied by a factor different than 1 when it is desired that the bandwidth of the phase locked loop be different than its normal value (which is determined by the design of the filter). In the exemplary embodiment depicted in FIG. 21, filtered phase error 2137 is multiplied by the value 2 outputted from a multiplexer 2142 when the select signal 2106 indicates that the loop filter bandwidth must be larger than normal value. This occurs, for example, during startup of the gigabit transceiver. Similarly, although not shown in FIG. 21, when it is desired that the loop filter bandwidth be narrower than normal value, the filtered phase error 2137 can be multiplied by a value less than 1.

The output 2144 of the multiplier 2140 is inputted to the second filter 2150 which is an integrator and to the adder 2160. The integrator 2150 is an IIR filter having an adder 2152 and a register 2154, operating at one sixteenth of the symbol rate. The integrator 2150 integrates the signal 2144 (which is essentially the filtered phase error 2137) to produce an integrated phase error 2156. The purpose of the phase locked loop is to generate a resulting phase for a sampling clock signal such that the phase error is equal to zero. The purpose of the integrator 2150 in the phase locked loop is to keep the phase error of the resulting phase equal to zero even when there is static frequency error. Without the integrator 2150, the static frequency error would result in a static phase error which would be attenuated but not made exactly zero by the phase locked loop. With the integrator 2150 in the phase locked loop, any static phase error would be integrated to produce a large growing input signal to the NCO 670, which would cause the phase locked loop to correct the static phase error. The integrated phase error 2156 is scaled by a scale factor via a multiplier 2158. This scale factor contributes to the determination of the gain of the integrator 2150. The scaled result 2159 is added to the signal 2144 via an adder 2160.

The output 2162 of the adder 2160 is inputted to the NCO 2170. The output 2162 is scaled by a scale factor, e.g., via a multiplier 2172. The resulting scaled signal is recursively filtered by an IIR filter formed by an adder 2174 and a register 2176. The IIR filter operates at one sixteenth of the symbol rate. The signal 2178, outputted every 16 symbol periods, is used as the phase control signal to one of the phase selectors 2010, 2020, 2030, 2040, 2050, 2060 (FIG. 20).

For the embodiment shown in FIG. 21, the gain parameters discussed above are as follows: $K_v$, the gain of the NCO, is $2^{-11}$ for normal bandwidth mode, $2^{-10}$ for high bandwidth mode: $K_I$, the gain of the integrator 2150, is equal to the product of the scaling of the integrator register 2154 ($2^{-8}$ in FIG. 21) and the ratio of the phase locked loop sampling rate to the symbol rate ($2^{-4}$ in FIG. 21). For the word lengths and scaling indicated in FIG. 21, $K_I$, is equal to $2^{-12}$. The gain $K_d$ of the phase detector 2110 is computed by simulations and is equal to 2.2. These parameters are used to compute the theoretical transfer function of the phase locked loop (PLL) which is then compared with the PLL transfer function obtained by simulation. The match is near perfect, confirming the validity of the design parameters.

One embodiment of the system 2100 of FIG. 21 further includes the external control signals PLLFRZ, PLLPVAL, PLLPRST, PLLFVAL, PLLFRST, PLLPRAMP, which are not shown explicitly in FIG. 21.

The control signal PLLFRZ, when applied, forces the phase error to zero to point 1 of the first filter 2130, therefore causes freezing of updates of the frequency change and/or phase change, except for any phase change caused by a non-zero value in the frequency register 2154 of the integrator 2150.

The control signal PLLPVAL is a 3-bit signal provided by the PHY Control system. It is used to specify the reset value of the NCO register 2176 of the NCO 2170, and is used in conjunction with the control signal PLLPRST.

The control signal PLLPRST, when applied to the NCO register 2176 in conjunction with the signal PLLPVAL, resets the 6 most significant bits of the NCO register 2176 to a value specified by 8 times PLLPVAL. The reset is performed by stepping up or down the 6 MSB field of the NCO register 2176 such that the specified value is reached after a minimum number of steps. Details of the phase reset logic block used to reset the value of the register 2176 of the NCO 2170 are shown in FIG. 22 and will be discussed later.

PLLFVAL is a 3-bit signal provided by the PHY Control system. It is to be interpreted as a 3-bit twos complement signed integer in the range [−4,3]. It is used to specify the reset value of the frequency register 2154 of the integrator 2150 and is used in conjunction with the control signal PLLFRST.

The control signal PLLFRST, when applied to the frequency register 2154 of the integrator 2150 in conjunction with the signal PLLFVAL, resets the frequency register 2154 to the value 65536 times PLLFVAL.

The control signal PLLPRAMP loads the fixed number B2048 into the frequency register 2154 of the integrator 2150. This causes the phase of a sampling clock signal (and receive clock RCLK) to ramp at the fixed rate of B2 ppm. This is used during startup at the master constituent transceiver. PLLPRAMP overrides PLLFRST. In other words, if both PLLPRAMP and PLLFRST are both applied, the value loaded into the frequency register 2154 is B2048, regardless of the value that PLLFRST tries to load.

FIG. 22 is a block diagram illustrating the phase reset logic block 2200 to the NCO 2170. The control signal PLLPRST is applied to the AND gate 2202. The output of the AND gate 2202 is applied to the increment/decrement enable input of the register 2176. The 3-bit value PLLPVAL from the PHY Control System of the gigabit transceiver is shifted left by 3 bits to form a 6-bit value 2204.

The current output of the register 2176 of the NCO 2170 (FIG. 21), which is the phase control signal inputted to the corresponding phase selector (FIG. 20), is subtracted from this shifted value of PLLPVAL via an adder 2206. Module 2208 determines whether the output of adder 2206 is non-zero. If it is non-zero, then module 2208 outputs a "1" to the AND gate 2202 to enable the enable input of register 2176. If it is zero, module 2206 outputs a zero to the AND gate 2208 to disable the enable input of the register 2176. Module 2210 determines whether the output of adder 2206 is positive or negative. If it is positive, module 2210 outputs a count up indicator to the register 2176. If it is negative, module 2210 outputs a count down indicator to register 2176.

The subtraction at adder 2206 finds the shortest path from the current value of the NCO register 2176 to the shifted PPLVAL 2204. For example, suppose the current phase value of register 2176 is 20. If the shifted PPLVAL 2204 (which is the desired value) is 32, the difference is 12, which is positive, therefore, the register 676 is incremented. If the desired phase value is 56, the difference is 36 or "100100" which is interpreted as B28, so the register 2176 will be decremented 28 consecutive times. The phase steps occur at the rate of one every 16 symbol periods. This single stepping is needed because of the way the phase selector operates. The phase selector can only increment or decrement from its current setting.

FIG. 23 is a block diagram of an exemplary phase shifter logic block used for the phase control of the receive clock signal RCLK. The phase shifter logic block 2300 is needed when the signal RCLK Offset (FIG. 20) is used to adjust the phase of the receive clock signal RCLK. The signal RCLK Offset is a 6-bit signal provided by the PHY Control system, and specifies the amount by which the phase of RCLK must shifted. Even if the signal RCLK Offset indicates a large amount of phase shift, this phase shift must be transferred to the input of the phase selector 2050 (FIG. 20) one step at a time due to the way the phase selector operates. The change of phase of RCLK must occur in the direction indicated by a control signal STEPDIR generated by the PHY Control system.

The phase shifter logic block 2300 includes a comparator 2302, an offset register 2304 and the adder 2042 (the same adder indicated in FIG. 20). The comparator 2302 compares the output 2306 of the offset register 804 with the signal RCLK Offset. If the two signals are equal, then the comparator 2302 outputs a "0" to the enable input of the offset register 2304 to disable the up/down counting of the offset register 2304, thus keeping the output 2306 the same for the next time period. If the two signals are not equal, the comparator 2302 outputs a "1" to the enable input of the offset register 2304 to enable the up/down counting, causing the output 2306 to be incremented or decremented at the next time period. The signal STEPDIR from the PHY Control system is inputted to the up/down input of the offset register 2304 to control the counting direction. The output 2306 from the offset register 2304 is added to the phase control signal 2009 produced by the NCO 2008 (FIG. 20) via the adder 2042 to generate the phase control signal 2049 (FIGS. 23 and 20) for the RCLK phase selector 2050 (FIG. 20).

The coupling of switching noise from the digital signal processor that implements the transceiver functions to each of the A/D converters is an important problem that needs to be addressed. Switching noise occurs when transistors switch states in accordance with transitions in the clock signal (or signals) that controls their operation. Switching noise in the digital section of the transceiver can be coupled to the analog section of the transceiver. Switching noise can cause severe degradation to the performance of an A/D converter if it occurs right at or near the instant the A/D converter is sampling the received signal. The present invention, in addition to providing a timing recovery method and system, also provides a method and system for minimizing the degradation of the performance of the A/D converters caused by switching noise.

The effect of switching noise on an A/D converter can be reduced if the switching noise is synchronous (with a phase delay) with the sampling clock of the A/D converter. If, in addition, it is possible to adjust the phase of the sampling clock of the A/D converter with respect to the phase of the switching noise, then the phase of the sampling clock of the A/D converter can be optimized for minimum noise. It is noted that, for a local gigabit transceiver, the sampling clock signals ACLK0, ACLK1, ACLK2, ACLK3 are synchronous to each other (i.e., having the same frequency) because they are synchronous to the 4 transmitters of the remote transceiver and these 4 remote transmitters are clocked by a same transmit clock signal TCLK. It is also important to note that the local receive clock signal RCLK is synchronous to the local sampling clock signals ACLK0, ACLK1, ACLK2, ACLK3.

Referring to FIGS. 2 and 5, the four A/D converters 216 of the four constituent transceivers are sampled with the sampling clock signals ACLK0, ACLK1, ACLK2, ACLK3. Each of the phases of these sampling clock signals is determined by the subsystem 600 (FIG. 21) of the timing recovery system 222 in response to the phase of the corresponding received signal, which depends on the remote transmitter and the line characteristics. Thus, the phases of the sampling clock signals change from line to line, and are not under the control of the system designer.

However, the relative phase of the receive clock signal RCLK with respect to the sampling clock signals ACLK0, ACLK1, ACLK2, ACLK3 can be controlled by adjusting the signal RCLK Offset (FIG. 20). The signal RCLK Offset can be used to select the RCLK phase that would cause the least noise coupling to the A/D converters 216 of FIG. 2. The underlying principle is the following. Referring to FIG. 2 and the boundaries of the clock domain, the entire digital signal processing, control and interface functions of the receiver operate in accordance with transitions in the receive clock signal RCLK. In other words, most of the digital logic circuits switch states on a transition of RCLK (more specifically, on a rising edge of RCLK). Only a small portion of the transceiver operates in accordance with transitions in the transmit clock signal TCLK. Therefore, most of the switching noise is synchronous with the receive clock signal RCLK. Since the receive clock signal RCLK is synchronous with the sampling clock signals ACLK0, ACLK1, ACLK2, ACLK3, it follows that most of the switching noise is synchronous with the sampling clock signals ACLK0, ACLK1, ACLK2, ACLK3. Therefore, if the phase of the receive clock signal RCLK is adjusted such that a transition in the signal RCLK occurs as far as possible in time from each of the sampling clock signals ACLK0, ACLK1, ACLK2, ACLK3, then the switching noise coupling to the A/D converters will be minimized.

The process for adjusting the phase of the receive clock signal RCLK can be summarized as follows. The process performs an exhaustive search over all the RCLK phases that, by design, can possibly exist in one symbol period. For each phase, the process computes the sum of the mean squared errors (MSEs) of the 4 pairs (i.e., the 4 constituent transceivers). At the end of the search, the process selects the RCLK phase that minimizes the sum of the MSEs of the four pairs. The following is a description of one embodiment of the RCLK phase adjustment process, where there are 64 possible RCLK phases.

Figure 24A:
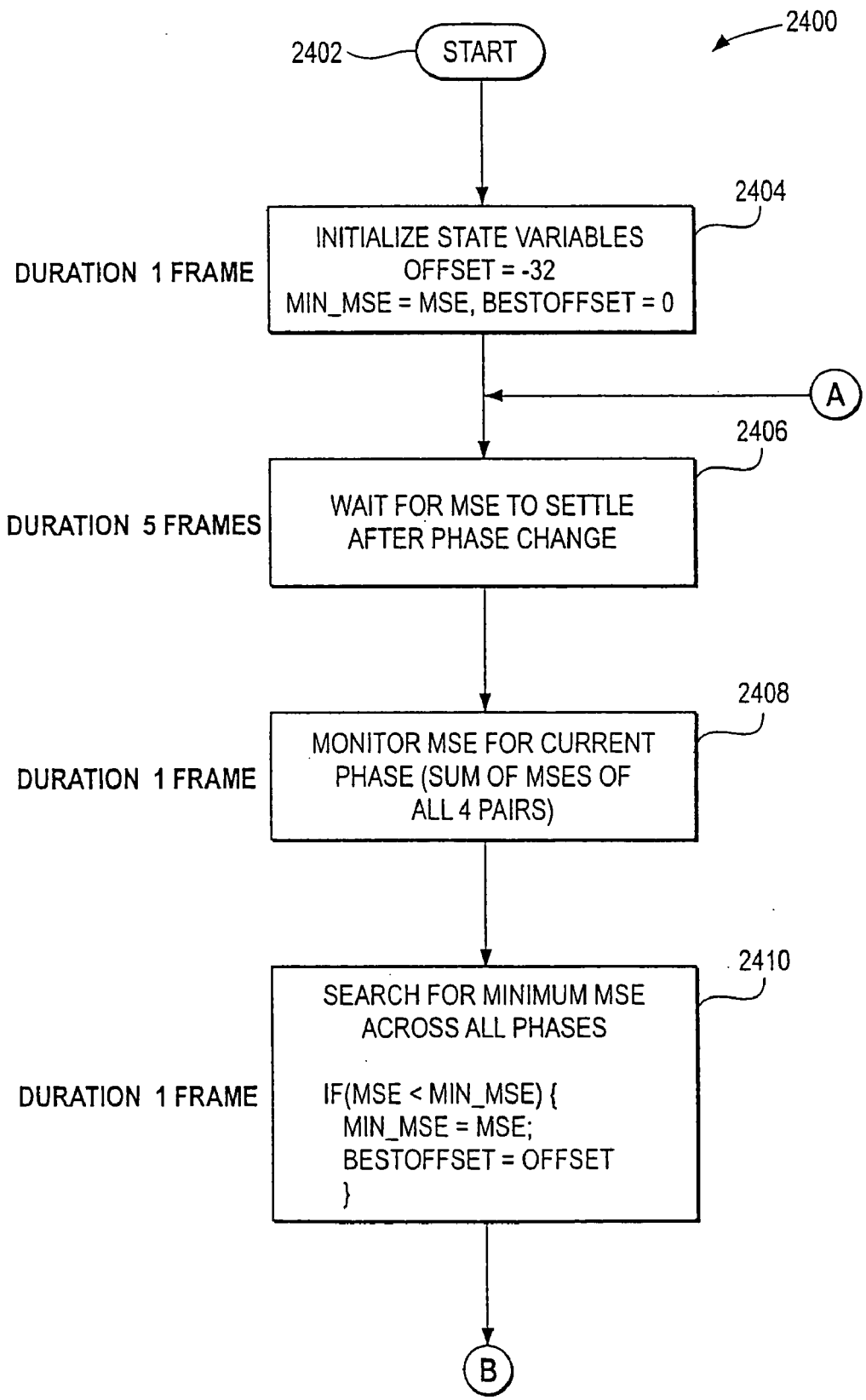
FIG. 24 is a flowchart of an embodiment of the process for adjusting the phase of the receive clock signal RCLK.
Figure 24B:
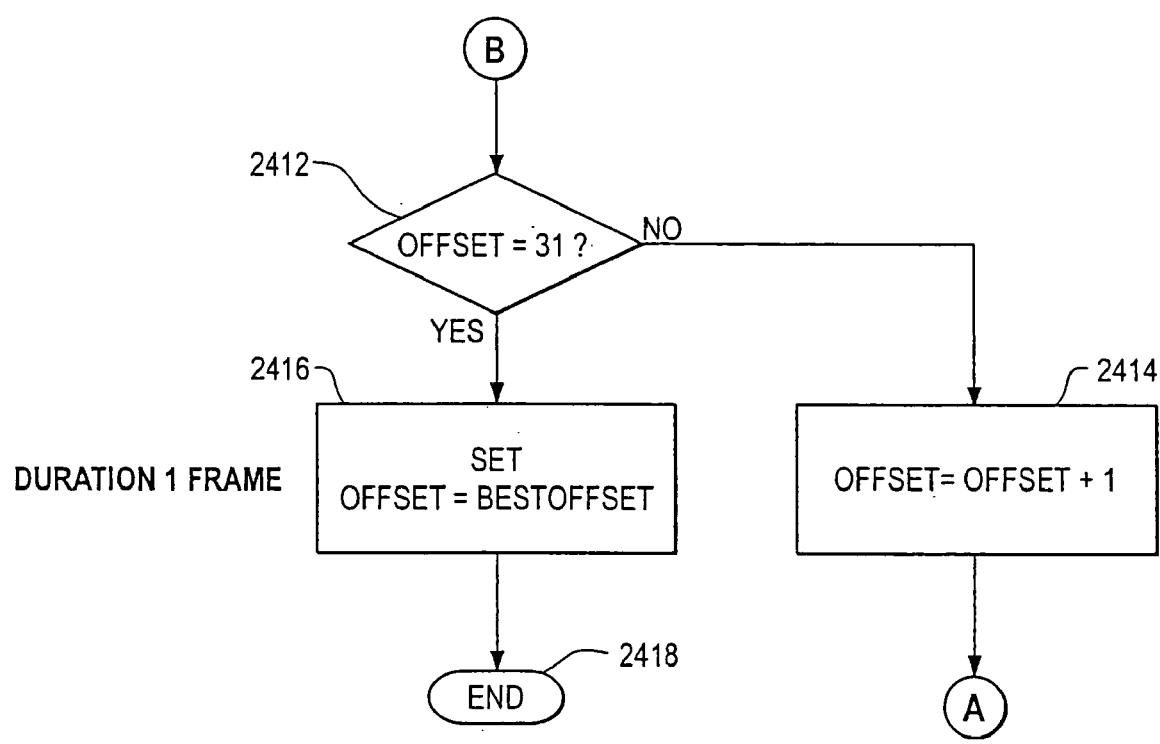

FIG. 24 is a flowchart illustrating the process 2400 for adjusting the phase of the receive clock signal RCLK. Upon Start (block 2402), process 2400 initializes all the state variables (which include counters, registers), sets Offset to B32 (block 2404), sets Min_MSE equal to the MSE of the gigabit transceiver before any RCLK phase change, and sets BestOffset equal to zero. The MSE of the gigabit transceiver is the sum of the mean squared errors (MSEs) of the 4 constituent transceivers. The MSE of a constituent transceiver is the mean squared error of the corresponding 1D component of the 4D slicer error 42 (FIG. 2), and is outputted by a MSE computation block 2700 (FIG. 27) for every frame. Each frame is equal to 1024 symbol periods. This initialization is done within a duration of 1 frame. Process 2400 then waits for the effect of the RCLK phase change on the system to settle (block 2406). The duration of this waiting is 5 frames. Process 2400 then computes MSE (by summing the MSEs of all four constituent transceivers outputted by the corresponding MSE computation block 2700 of FIG. 27) which corresponds to the current setting of RCLK Offset (block 908). The duration of block 2408 is one frame. In block 2410, process 2400 compares the new MSE with Min_MSE. If the new MSE is strictly less than Min_MSE, then Min-MSE is set to the value of the new MSE and BestOffset is set to the value of Offset. In block 2412, process checks whether Offset is equal to 31, i.e., whether all possible 64 phase offsets have been searched. If Offset is not equal to 31, then process 2400 increments Offset by 1 (block 2414) then continues the search for the best RCLK Offset by going back to block 2406. If Offset is equal to 31, that is, if process 2400 has searched all possible 64 phase offsets, then process 2400 sets Offset equal to the value of BestOffset (block 2416) then terminates (block 2418). The duration of each of blocks 2414 and 2416 is 1 frame.

After adjustment of the receive clock RCLK phase, small adjustments can be made to the phases of the sampling clocks ACLK1, ACLK2, ACLK3 to further reduce the coupling of switching noise to the A/D converters. Since the timing recovery system 222 of FIG. 20 without the ACLK0 B 3 Offsets, through the phase locked loop principle, already sets the sampling clocks at the optimal sampling positions with respect to the pulse shape of incoming signals from the remote transceivers, the small phase adjustments made to the sampling clocks could cause some loss of performance of the A/D converters. However, the net result is still better than performing no phase adjustment of the sampling clocks and allowing the A/D converters to sample the incoming signals at a noisy instant where the transistors in the digital section are switching states. In the embodiment depicted in FIG. 20, phase adjustment is not made to the sampling clock ACLK0 because, by design of the structure of the embodiment, the phase difference between ACLK0 and RCLK is equal to RCLK Offset. Thus, in this embodiment, any adjustment to the phase of ACLK0 will also move RCLK away from the optimal position determined by process 2400 above by the same amount of phase adjustment.

Figure 25A:
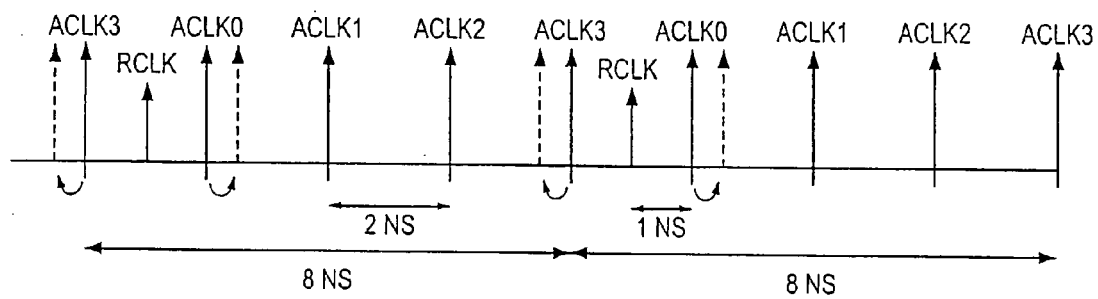
FIG. 25A is a first example of clock distribution where the transitions of the four sampling clock signals ACLK0 B 3 are evenly distributed within the symbol period.
Figure 25B:
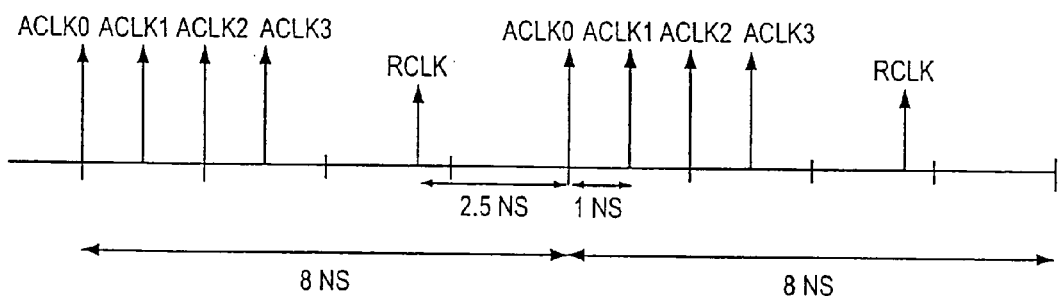
FIG. 25B is a second example of clock distribution where the transitions of the four sampling clock signals ACLK0 B 3 are distributed within the symbol period of 8 nanoseconds (ns) such that each ACLK clock transition is 1 ns apart from an adjacent ACLK clock transition.
Figure 25C:
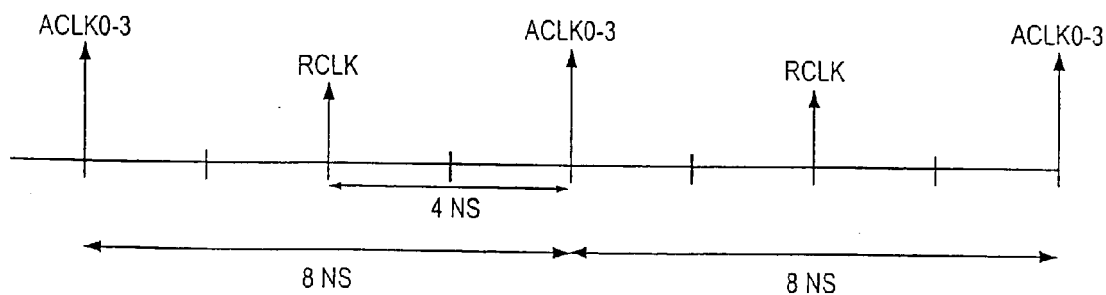
FIG. 25C is a third example of clock distribution where the transitions of the four sampling clock signals ACLK0 B 3 occur at the same instant within the symbol period.

FIGS. 25A, 25B, 25C illustrate three examples of distribution of the transitions of clock signals within a symbol period to further clarify the concept of phase adjustment of the clock signals. It is noted that, in these examples, the four sampling clock signals ACLK0 B 3 are shown as occurring in their consecutive order within a symbol period for illustrative purpose only. It is understood that the sampling clock signals ACLK0 B 3 can occur in any order.

FIG. 25A is a first example of clock distribution where the transitions of the four sampling clock signals ACLK0 B 3 are evenly distributed within the symbol period of 8 nanoseconds (ns). Thus, each ACLK clock transition is 2 ns apart from an adjacent transition of another ACLK clock. Therefore, for this clock distribution example, a transition of the receive clock RCLK can only be placed at most 1 ns away from an adjacent ACLK transition. This "distance" (phase delay) may not be enough to reduce the coupling of switching noise to the two A/D converters associated with the two adjacent sampling clock signals (ACLK3 and ACLK0, in the example). In this case, it may be desirable to slightly adjust the phase of the two adjacent sampling clock signals to move their respective transitions further away from a RCLK transition, as illustrated by their new transition occurrences within a symbol period in FIG. 25A.

FIG. 25B is a second example of clock distribution where the transitions of the four sampling clock signals ACLK0 B 3 are distributed within the symbol period of 8 nanoseconds (ns) such that each ACLK clock transition is 1 ns apart from an adjacent transition of another ACLK clock. For this clock distribution example, a transition of the receive clock RCLK can be positioned midway between the last ACLK transition of one symbol period (ACLK3 in FIG. 25B) and the first ACLK transition of the next symbol period (ACLK0 in FIG. 25B) so that the RCLK transition is 2.5 ns from an adjacent ACLK transition. This "distance" (phase delay) may be enough to reduce the coupling of switching noise to the two A/D converters associated with the two adjacent sampling clock signals (ACLK3 and ACLK0, in the example). In this case, phase adjustment of the two adjacent sampling clock signals to move their respective transitions further away from a RCLK transition may not be needed.

FIG. 25C is a third example of clock distribution where the transitions of the four sampling clock signals ACLK0 B 3 occur at the same instant within the symbol period of 8 nanoseconds (ns). In this clock distribution example, a transition of the receive clock RCLK can be positioned at the maximum possible distance of 4 ns from an adjacent ACLK transition. This is the best clock distribution that allows maximum reduction of coupling of switching noise to the four A/D converters associated with the sampling clock signals. In this case, there is no need for phase adjustment of the sampling clock signals.

For the embodiment shown in FIG. 20 of the timing recovery system 222 (FIG. 2), the following phase adjustment process is applied to the three sampling clock signals ACLK1, ACLK2, ACLK3. It is understood that, in a different embodiment of the timing recovery system 222 (FIG. 2) where the receive clock signal RCLK is not tied to one of the sampling clock signals ACLK0 B 3, the following phase adjustment process can be applied to all of the sampling clock signals.

The process for adjusting the phase of a sampling clock signal ACLKx ("x" in ACLKx denotes one of 0,1,2,3) can be summarized as follows. The process performs a search over a small range of phases around the initial ACLKx phase. For each phase, the process logs the mean squared error MSE of the associated constituent transceivers. At the end of the search, the process selects the ACLKx phase that minimizes the MSE of the associated constituent transceiver.

Whenever the phase of a sampling clock signal ACLKx changes, the coefficients of the echo canceller 232 and of the NEXT cancellers 230 change. Thus, to avoid degradation of performance, the phase steps of the sampling clocks should be small so that the change they induce on the coefficients is also small. When the phase adjustment requires multiple consecutive phase steps, the convergence of the coefficients of the echo canceller 232 and of the NEXT cancellers 230 should be fast in order to avoid a buildup of coefficient mismatch.

Figure 26B:
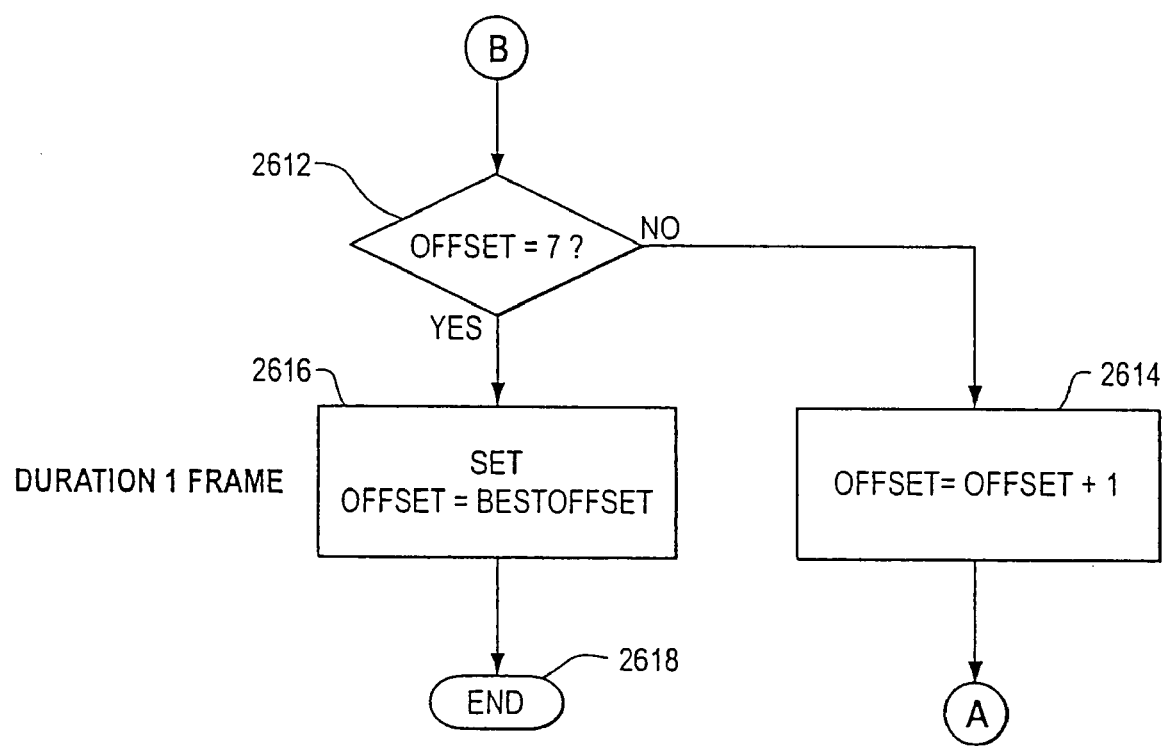
FIG. 26 is a flowchart of an embodiment of the process for adjusting the phase of a sampling clock signal ACLKx associated with one of the constituent transceivers.

FIG. 26 is a flowchart illustrating an embodiment of the process for adjusting the phase of a sampling clock signal ACLKx associated with one of the constituent transceivers, where the search is over a range of 16 phases around the initial ACLKx phase. For each of the constituent transceivers, process 2600 of FIG. 26 is run independently of and concurrently with the other constituent transceivers. Upon Start (block 2602), process 2600 initializes all the state variables (which include counters, registers), sets Offset to B8 (block 2604), sets Min _MSE equal to the MSE of the associated constituent transceiver before any RCLK phase change, and sets BestOffset equal to zero. The MSE of the associated constituent transceiver is the mean squared error of the corresponding 1D component of the 4D slicer error 42 (FIG. 2). This initialization is done within a duration of 1 frame. Process 2600 then waits for the effect of the ACLK phase change on the system to settle (block 2606). The duration of this waiting is 32 frames. (block 2608). The duration of block 2608 is one frame. In block 2610, process 2600 compares the new MSE (outputted by the corresponding MSE computation block 2700 of FIG. 27) which corresponds to the current setting of ACLKx Offset with Min_MSE. If the new MSE is strictly less than Min_MSE, then Min-MSE is set to the value of the new MSE and BestOffset is set to the value of Offset. In block 2612, process 2600 checks whether Offset is equal to 7, i.e., whether all 16 phase offsets in the range have been searched. If Offset is not equal to 7, then process 2700 increments Offset by 1 (block 2614) then continues the search for the best ACLKx Offset by looping back to block 2606. If Offset is equal to 7, that is, if process 2600 has searched all the 16 phase offsets in the range, then process 2600 sets Offset equal to the value of BestOffset (block 2616) then terminates (block 2618). The duration of each of blocks 2614 and 2616 is 1 frame.

Figure 27:
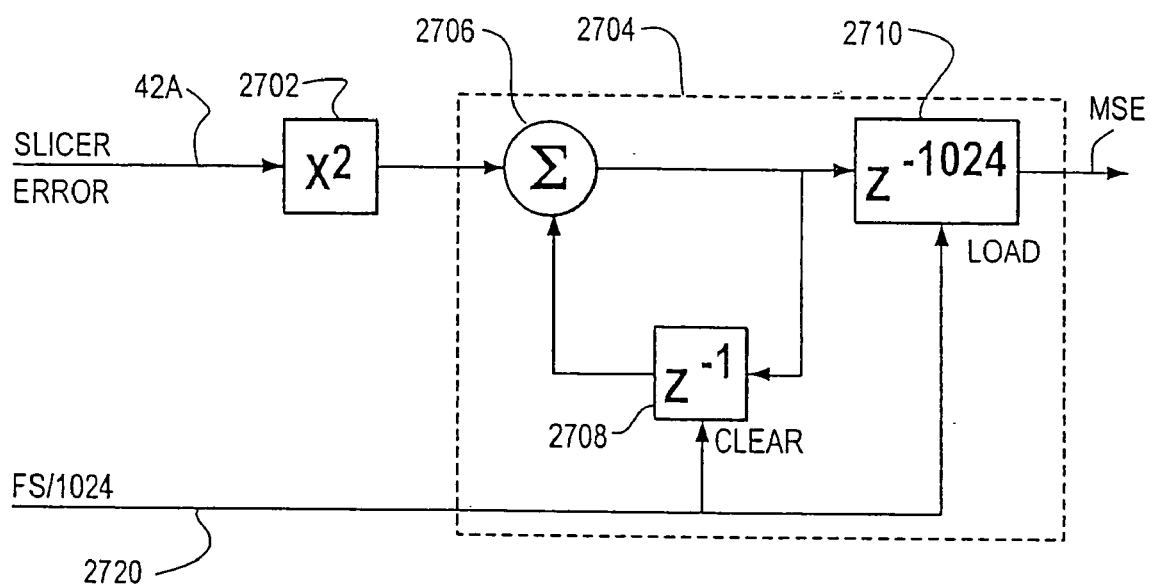
FIG. 27 is a block diagram of an embodiment of the MSE computation block used for computing the mean squared error of a constituent transceiver.

FIG. 27 is a block diagram of an exemplary implementation of the MSE computation block used for computing the mean squared error of a constituent transceiver. In one embodiment of the gigabit transceiver, there are four MSE computation blocks, one for each of the four constituent transceivers. The four MSE computation blocks are run independently and concurrently for the four constituent transceivers. The MSE computation block 2700 includes a squaring module 2702 and an infinite impulse response (IIR) filter 2704. The IIR filter 2704 includes an adder 2706, a feedback delay element 2708 and a forward delay element 2710. The squaring module 2702 receives the corresponding 1D component of the 4D slicer error 42 (FIG. 2), which is denoted as 42A for simplicity, and out puts the squared error value to the filter 2704. The filter 2704 accumulates the squared error values by adding via the adder 2706 the current squared error value to the previous squared error value stored in the feedback delay element 2708. The accumulated value is stored in the forward register 2710. In the exemplary embodiment shown in FIG. 27, the squared error values are accumulated for 1024 symbol periods (which is one frame of the PHY Control system). Since the accumulation period is sufficiently long, the accumulated value practically corresponds to the mean squared error. At the end of the accumulation period, the clock signal 2720 from the PHY Control system clears the contents of the feedback delay element, and clocks the forward delay element 2710 so that the forward delay element 2710 outputs the accumulated value MSE and resets to zero.

While certain exemplary embodiments have been described in detail and shown in the accompanying drawings, it is to be understood that such embodiments are merely illustrative of and not restrictive on the broad invention. It will thus be recognized that various modifications may be made to the illustrated and other embodiments of the invention described above, without departing from the broad inventive scope thereof. It will be understood, therefore, that the invention is not limited to the particular embodiments or arrangements disclosed, but is rather intended to cover any changes, adaptations or modifications which are within the scope and spirit of the invention as defined by the appended claims.

What is claimed is:

1. An integrated circuit communication device configured for operation over a multi-pair transmission channel, the communication device comprising:
    a decoder adapted to decode a signal having a plurality of states, and generating tentative decisions regarding a path and a final decision;
    a single-state decision feedback equalizer adapted to receive the tentative decisions and to produce a single-state intersymbol interference (ISI) compensation signal corresponding to a first ISI component based on the tentative decisions; and
    a state multiplication circuit adapted to receive a tail component generated by subtracting the single-state ISI compensation signal from a signal sample and to produce a signal having a plurality states, suitable for decoding by the decoder, based on the tail component.

2. The integrated circuit communication device of claim 1 wherein the single-state decision feedback equalizer is adapted to produce the single-state ISI compensation signal based on a subset of high-order coefficients.

3. The integrated circuit communication device of claim 2 wherein the state multiplication circuit is adapted to produce the signal having a plurality of states, suitable for decoding by the decoder, based on the tail component and a subset of low-order coefficient values from the single-state decision feedback equalizer.

4. The integrated circuit communication device according to claim 3, further comprising a convolution engine coupled to the single-state decision feedback equalizer and adapted to receive values of the low-order coefficients and to compute a set of pre-computed values representing a set of potential single-state ISI compensation signals corresponding to a second ISI component, wherein the state multiplication circuit is adapted to produce the signal having a plurality of states based on the tail component and the set of pre-computed values.

5. The integrated circuit communication device of claim 4 wherein the multiplication circuit comprises a multiple-decision feedback equalizer coupled to the single-state decision feedback equalizer and the convolution engine, the multiple-decision feedback equalizer adapted to combine the set of pre-computed values with the tail component to produce a set of potential digital signals, one of the potential digital signals being substantially compensated for the second ISI component.

6. The integrated circuit communication device of claim 5 wherein the first ISI component represents ISI introduced by a remote transmission device, and wherein the second ISI component represents ISI introduced by transmission channel characteristics.

7. A method of processing a communication signal having a plurality of states and transmitted over a multi-pair transmission channel, the method comprising steps of:
   (a) generating tentative decisions regarding a path and a final decision;
   (b) producing a single-state intersymbol interference (ISI) compensation signal corresponding to a first ISI component based on the tentative decisions;
   (c) subtracting the single-state ISI compensation signal from a signal sample to produce a tail component;
   (d) producing a representation signal having a plurality of states based on the tail component; and
   (e) decoding the representation signal.

8. The method of claim 7 wherein producing step (b) comprises producing the single-state ISI compensation signal based on a subset of high-order coefficients.

9. The method of claim 8 wherein producing step (d) comprises producing the representation signal based on the tail component and a subset of low-order coefficient values.

10. The method of claim 8 further comprising a step (f), performed prior to producing step (d), of computing a set of pre-computed values representing a set of potential single-state ISI compensation signals corresponding to a second ISI component, wherein producing step (d) comprises producing the representation signal based on the tail component and the set of pre-computed values.

11. The method of claim 10 wherein producing step (d) comprises combining the set of pre-computed values with the tail component to produce a set of potential digital signals, one of the potential digital signals being substantially compensated for the second ISI component.

12. The method of claim 11 wherein the first ISI component represents ISI introduced by a remote transmission device, and wherein the second ISI component represents ISI introduced by transmission channel characteristics.

* * * * *